(12) United States Patent
Yamazaki et al.

(10) Patent No.: US 12,034,064 B2
(45) Date of Patent: Jul. 9, 2024

(54) SEMICONDUCTOR DEVICE AND METHOD FOR MANUFACTURING THE SAME

(71) Applicant: Semiconductor Energy Laboratory Co., Ltd., Atsugi (JP)

(72) Inventors: Shunpei Yamazaki, Setagaya (JP); Hidekazu Miyairi, Isehara (JP); Kengo Akimoto, Atsugi (JP); Kojiro Shiraishi, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 201 days.

(21) Appl. No.: 17/111,838

(22) Filed: Dec. 4, 2020

(65) Prior Publication Data

US 2021/0091210 A1    Mar. 25, 2021

Related U.S. Application Data

(60) Continuation of application No. 15/656,173, filed on Jul. 21, 2017, now Pat. No. 10,937,897, which is a
(Continued)

(30) Foreign Application Priority Data

Jul. 31, 2008    (JP) ................. 2008-197145

(51) Int. Cl.
*H01L 29/66*    (2006.01)
*H01L 21/46*    (2006.01)
(Continued)

(52) U.S. Cl.
CPC ........ *H01L 29/66969* (2013.01); *H01L 21/46* (2013.01); *H01L 27/1225* (2013.01); *H01L 29/7869* (2013.01)

(58) Field of Classification Search
CPC ............ H01L 29/7869; H01L 27/1225; H01L 29/66742; H01L 29/78606;
(Continued)

(56) References Cited

U.S. PATENT DOCUMENTS 5,270,567 A    12/1993    Mori et al.
5,313,075 A    5/1994    Zhang et al.
(Continued)

FOREIGN PATENT DOCUMENTS

CN    001201252 A    12/1998
CN    001276622 A    12/2000
(Continued)

OTHER PUBLICATIONS

Dembo.H et al., "RFCPUS on Glass and Plastic Substrates Fabricated by TFT Transfer Technology", Iedm 05: Technical Digest of International Electron Devices Meeting, Dec. 5, 2005, pp. 1067-1069.
(Continued)

*Primary Examiner* — Tony Tran
(74) *Attorney, Agent, or Firm* — Eric J. Robinson; Robinson Intellectual Property Law Office, P.C.

(57) ABSTRACT

It is an object to provide a semiconductor device including a thin film transistor with favorable electric properties and high reliability, and a method for manufacturing the semiconductor device with high productivity. In an inverted staggered (bottom gate) thin film transistor, an oxide semiconductor film containing In, Ga, and Zn is used as a semiconductor layer, and a buffer layer formed using a metal oxide layer is provided between the semiconductor layer and a source and drain electrode layers. The metal oxide layer is intentionally provided as the buffer layer between the semiconductor layer and the source and drain electrode layers, whereby ohmic contact is obtained.

6 Claims, 32 Drawing Sheets

Related U.S. Application Data continuation of application No. 14/820,008, filed on Aug. 6, 2015, now abandoned, which is a division of application No. 13/346,963, filed on Jan. 10, 2012, now Pat. No. 9,111,804, which is a division of application No. 13/013,054, filed on Jan. 25, 2011, now Pat. No. 8,729,544, which is a continuation of application No. 12/511,285, filed on Jul. 29, 2009, now Pat. No. 8,129,717.

(51) Int. Cl.
*H01L 27/12* (2006.01)
*H01L 29/786* (2006.01)

(58) Field of Classification Search
CPC .......... H01L 29/66969; H01L 27/1214; H01L 27/115; H01L 27/11521; H01L 29/66757; H01L 27/11502
See application file for complete search history.

(56) References Cited

U.S. PATENT DOCUMENTS

| | | | |
|---|---|---|---|
| 5,468,521 A | 11/1995 | Kanai et al. |
| 5,523,240 A | 6/1996 | Zhang et al. |
| 5,576,556 A | 11/1996 | Takemura et al. |
| 5,585,949 A | 12/1996 | Yamazaki et al. |
| 5,731,856 A | 3/1998 | Kim et al. |
| 5,744,864 A | 4/1998 | Cillessen et al. |
| 5,837,614 A | 11/1998 | Yamazaki et al. |
| 5,847,410 A | 12/1998 | Nakajima |
| 5,866,932 A | 2/1999 | Yamazaki et al. |
| 5,911,857 A | 6/1999 | Kim |
| 5,962,897 A | 10/1999 | Takemura et al. |
| 6,025,630 A | 2/2000 | Yamazaki et al. |
| 6,081,417 A | 6/2000 | Matsuki |
| 6,255,668 B1 | 7/2001 | Kang et al. |
| 6,255,706 B1 | 7/2001 | Watanabe et al. |
| 6,294,274 B1 | 9/2001 | Kawazoe et al. |
| 6,407,435 B1 | 6/2002 | Ma et al. |
| 6,455,357 B2 | 9/2002 | Kang et al. |
| 6,455,875 B2 | 9/2002 | Takemura et al. |
| 6,529,397 B2 | 3/2003 | Takeda et al. |
| 6,563,174 B2 | 5/2003 | Kawasaki et al. |
| 6,566,154 B2 | 5/2003 | Yamamoto |
| 6,576,061 B1 | 6/2003 | Moriyama et al. |
| 6,586,346 B1 | 7/2003 | Yamazaki et al. |
| 6,607,947 B1 | 8/2003 | Zhang et al. |
| 6,620,719 B1 | 9/2003 | Andry et al. |
| 6,624,477 B1 | 9/2003 | Takemura et al. |
| 6,627,503 B2 | 9/2003 | Ma et al. |
| 6,657,260 B2 | 12/2003 | Yamazaki et al. |
| 6,680,242 B2 | 1/2004 | Ohtsu et al. |
| 6,727,522 B1 | 4/2004 | Kawasaki et al. |
| 6,744,479 B2 | 6/2004 | Hasegawa |
| 6,759,283 B2 | 7/2004 | Yasuda et al. |
| 6,762,802 B2 | 7/2004 | Ono et al. |
| 6,790,749 B2 | 9/2004 | Takemura et al. |
| 6,794,682 B2 | 9/2004 | Watanabe et al. |
| 6,849,872 B1 | 2/2005 | Yamazaki et al. |
| 6,858,308 B2 | 2/2005 | Kondo et al. |
| 6,936,844 B1 | 8/2005 | Yamazaki et al. |
| 6,960,812 B2 | 11/2005 | Yamazaki et al. |
| 6,984,550 B2 | 1/2006 | Yamazaki et al. |
| 7,026,713 B2 | 4/2006 | Hoffman et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,067,843 B2 | 6/2006 | Carcia et al. |
| 7,105,365 B2 | 9/2006 | Hiroki et al. |
| 7,105,868 B2 | 9/2006 | Nause et al. |
| 7,109,108 B2 | 9/2006 | Takemura et al. |
| 7,145,174 B2 | 12/2006 | Chiang et al. |
| 7,151,520 B2 | 12/2006 | Maki |
| 7,211,825 B2 | 5/2007 | Shih et al. |
| 7,262,463 B2 | 8/2007 | Hoffman |
| 7,282,782 B2 | 10/2007 | Hoffman et al. |
| 7,294,855 B2 | 11/2007 | Baek et al. |
| 7,297,977 B2 | 11/2007 | Hoffman et al. |
| 7,298,084 B2 | 11/2007 | Baude et al. |
| 7,301,211 B2 | 11/2007 | Yamazaki et al. |
| 7,316,944 B2 | 1/2008 | Ahn |
| 7,323,356 B2 | 1/2008 | Hosono et al. |
| 7,339,187 B2 | 3/2008 | Wager, III et al. |
| 7,355,202 B2 | 4/2008 | Zhang et al. |
| 7,365,810 B2 | 4/2008 | Gotoh et al. |
| 7,385,224 B2 | 6/2008 | Ishii et al. |
| 7,402,506 B2 | 7/2008 | Levy et al. |
| 7,405,115 B2 | 7/2008 | Yamazaki et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,465,679 B1 | 12/2008 | Yamazaki et al. |
| 7,468,304 B2 | 12/2008 | Kaji et al. |
| 7,470,607 B2 | 12/2008 | Carcia et al. |
| 7,477,336 B2 | 1/2009 | Noda et al. |
| 7,501,293 B2 | 3/2009 | Ito et al. |
| 7,501,305 B2 | 3/2009 | Takai et al. |
| 7,507,616 B2 * | 3/2009 | Seo ............... H01L 27/1288 438/734 |
| 7,507,618 B2 | 3/2009 | Dunbar |
| 7,521,712 B2 | 4/2009 | Machida et al. |
| 7,544,967 B2 | 6/2009 | Kim et al. |
| 7,566,904 B2 | 7/2009 | Ishii |
| 7,575,966 B2 | 8/2009 | Lai et al. |
| 7,576,394 B2 | 8/2009 | Furuta et al. |
| 7,595,143 B2 | 9/2009 | Park et al. |
| 7,598,160 B2 | 10/2009 | Machida et al. |
| 7,601,984 B2 | 10/2009 | Sano et al. |
| 7,602,020 B2 | 10/2009 | Takemura et al. |
| 7,608,531 B2 | 10/2009 | Isa et al. |
| 7,622,371 B2 | 11/2009 | Pan et al. |
| 7,635,889 B2 | 12/2009 | Isa et al. |
| 7,645,478 B2 | 1/2010 | Thelss et al. |
| 7,663,302 B2 | 2/2010 | Shin et al. |
| 7,674,635 B2 | 3/2010 | Hiroki et al. |
| 7,674,650 B2 | 3/2010 | Akimoto et al. |
| 7,691,666 B2 | 4/2010 | Levy et al. |
| 7,723,788 B2 | 5/2010 | Takemura et al. |
| 7,732,251 B2 | 6/2010 | Hoffman et al. |
| 7,732,819 B2 | 6/2010 | Akimoto et al. |
| 7,733,015 B2 | 6/2010 | Saito |
| 7,767,106 B2 | 8/2010 | Chang |
| 7,767,505 B2 | 8/2010 | Son et al. |
| 7,772,021 B2 | 8/2010 | Lee et al. |
| 7,791,072 B2 | 9/2010 | Kumomi et al. |
| 7,791,082 B2 | 9/2010 | Iwasaki |
| 7,795,613 B2 | 9/2010 | Ito et al. |
| 7,807,515 B2 | 10/2010 | Kato et al. |
| 7,816,680 B2 | 10/2010 | Kim et al. |
| 7,816,682 B2 | 10/2010 | Kimura |
| 7,829,444 B2 | 11/2010 | Yabuta et al. |
| 7,847,287 B2 | 12/2010 | Kim et al. |
| 7,855,106 B2 | 12/2010 | Yamazaki et al. |
| 7,858,451 B2 | 12/2010 | Maekawa et al. |
| 7,858,984 B2 | 12/2010 | Ahn |
| 7,859,510 B2 | 12/2010 | Umezaki |
| 7,859,606 B2 | 12/2010 | Higaki et al. |
| 7,863,611 B2 | 1/2011 | Abe et al. |
| 7,867,636 B2 | 1/2011 | Nakagawara et al. |
| 7,868,326 B2 | 1/2011 | Sano et al. |
| 7,872,259 B2 | 1/2011 | Den et al. |
| 7,883,942 B2 | 2/2011 | Baek et al. |
| 7,884,360 B2 | 2/2011 | Takechi et al. |
| 7,893,431 B2 | 2/2011 | Kim et al. |
| 7,910,490 B2 | 3/2011 | Akimoto et al. |
| 7,910,920 B2 | 3/2011 | Park et al. |
| 7,919,365 B2 | 4/2011 | Kim et al. |
| 7,923,287 B2 | 4/2011 | Lee et al. |
| 7,923,723 B2 | 4/2011 | Hayashi et al. |
| 7,932,521 B2 | 4/2011 | Akimoto et al. |
| 7,939,822 B2 | 5/2011 | Maekawa et al. |

(56) References Cited

U.S. PATENT DOCUMENTS

| | | | |
|---|---|---|---|
| 7,978,274 B2 | 7/2011 | Umezaki et al. | |
| 7,982,215 B2 | 7/2011 | Inoue et al. | |
| 8,003,449 B2 | 8/2011 | Akimoto et al. | |
| 8,017,506 B2 | 9/2011 | Takemura et al. | |
| 8,030,195 B2 | 10/2011 | Inoue et al. | |
| 8,030,663 B2 | 10/2011 | Yamazaki et al. | |
| 8,053,339 B2 | 11/2011 | Yamazaki et al. | |
| 8,063,421 B2 | 11/2011 | Kang et al. | |
| 8,084,307 B2 | 12/2011 | Itagaki et al. | |
| 8,143,115 B2 | 3/2012 | Omura et al. | |
| 8,148,721 B2 | 4/2012 | Hayashi et al. | |
| 8,168,974 B2 | 5/2012 | Sano et al. | |
| 8,207,533 B2 | 6/2012 | Maekawa et al. | |
| 8,237,166 B2 | 8/2012 | Kumomi et al. | |
| 8,247,814 B2 | 8/2012 | Maekawa et al. | |
| 8,274,077 B2 | 9/2012 | Akimoto et al. | |
| 8,283,666 B2 | 10/2012 | Kim et al. | |
| 8,293,595 B2 | 10/2012 | Yamazaki et al. | |
| 8,324,018 B2 | 12/2012 | Isa et al. | |
| 8,330,492 B2 | 12/2012 | Umezaki | |
| 8,338,865 B2 | 12/2012 | Kimura | |
| 8,343,817 B2 | 1/2013 | Miyairi et al. | |
| 8,399,313 B2 | 3/2013 | Akimoto et al. | |
| 8,415,198 B2 | 4/2013 | Itagaki et al. | |
| 8,487,436 B2 | 7/2013 | Isa et al. | |
| 8,497,507 B2 | 7/2013 | Yang | |
| 8,514,341 B2 | 8/2013 | Higaki et al. | |
| 8,575,618 B2 | 11/2013 | Maekawa et al. | |
| 8,629,069 B2 | 1/2014 | Akimoto et al. | |
| 8,648,346 B2 | 2/2014 | Isa et al. | |
| 8,698,215 B2 * | 4/2014 | Jeong | H01L 27/1225 257/E29.13 |
| 8,786,794 B2 | 7/2014 | Higaki et al. | |
| 8,841,671 B2 | 9/2014 | Kimura | |
| 8,872,182 B2 | 10/2014 | Kimura | |
| 9,252,227 B2 | 2/2016 | Higaki et al. | |
| 9,268,188 B2 | 2/2016 | Kimura | |
| 9,269,826 B2 | 2/2016 | Hosono et al. | |
| 9,356,152 B2 | 5/2016 | Isa et al. | |
| 9,709,861 B2 | 7/2017 | Kimura | |
| 9,716,180 B2 | 7/2017 | Higaki et al. | |
| 9,947,803 B2 | 4/2018 | Hosono et al. | |
| 10,001,678 B2 | 6/2018 | Kimura | |
| 10,032,930 B2 | 7/2018 | Hosono et al. | |
| 10,032,931 B2 | 7/2018 | Hosono et al. | |
| 10,109,744 B2 | 10/2018 | Higaki et al. | |
| 10,509,271 B2 | 12/2019 | Kimura | |
| 2001/0046027 A1 | 11/2001 | Tai et al. | |
| 2002/0056838 A1 | 5/2002 | Ogawa | |
| 2002/0153565 A1 | 10/2002 | Yamazaki et al. | |
| 2002/0177293 A1 | 11/2002 | Wilk et al. | |
| 2003/0047785 A1 | 3/2003 | Kawasaki et al. | |
| 2003/0049943 A1 | 3/2003 | Choi et al. | |
| 2003/0189401 A1 | 10/2003 | Kido et al. | |
| 2003/0203627 A1 | 10/2003 | Pang | |
| 2004/0174355 A1 | 9/2004 | Taguchi et al. | |
| 2004/0232421 A1 | 11/2004 | Ono et al. | |
| 2005/0007507 A1 | 1/2005 | Ono et al. | |
| 2005/0269639 A1 | 12/2005 | Yamazaki et al. | |
| 2005/0275038 A1 | 12/2005 | Shih et al. | |
| 2006/0079037 A1 | 4/2006 | Hoffman et al. | |
| 2006/0086978 A1 | 4/2006 | Kobayashi | |
| 2006/0118793 A1 | 6/2006 | Yang et al. | |
| 2006/0125098 A1 | 6/2006 | Hoffman et al. | |
| 2006/0146256 A1 | 7/2006 | Ahn | |
| 2006/0148141 A1 | 7/2006 | Seo et al. | |
| 2006/0175610 A1 | 8/2006 | Heo et al. | |
| 2006/0183274 A1 | 8/2006 | Carcia et al. | |
| 2006/0187384 A1 | 8/2006 | Hisatake | |
| 2006/0197092 A1 | 9/2006 | Hoffman et al. | |
| 2006/0208977 A1 | 9/2006 | Kimura | |
| 2006/0238135 A1 | 10/2006 | Kimura | |
| 2006/0244107 A1 | 11/2006 | Sugihara et al. | |
| 2007/0051952 A1 | 3/2007 | Yamazaki et al. | |
| 2007/0052025 A1 | 3/2007 | Yabuta | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0139571 A1 | 6/2007 | Kimura | |
| 2007/0152217 A1 | 7/2007 | Lai et al. | |
| 2007/0159568 A1 | 7/2007 | Ono et al. | |
| 2007/0172591 A1 | 7/2007 | Seo et al. | |
| 2007/0187678 A1 | 8/2007 | Hirao et al. | |
| 2007/0194379 A1 | 8/2007 | Hosono et al. | |
| 2007/0241327 A1 | 10/2007 | Kim et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0062112 A1 | 3/2008 | Umezaki | |
| 2008/0099759 A1 | 5/2008 | Fujii et al. | |
| 2008/0106191 A1 | 5/2008 | Kawase | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0203387 A1 | 8/2008 | Kang et al. | |
| 2008/0224133 A1 | 9/2008 | Park et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0001374 A1 | 1/2009 | Inoue et al. | |
| 2009/0008639 A1 | 1/2009 | Akimoto et al. | |
| 2009/0065771 A1 | 3/2009 | Iwasaki et al. | |
| 2009/0073325 A1 | 3/2009 | Kuwabara et al. | |
| 2009/0098673 A1 | 4/2009 | Yang et al. | |
| 2009/0101910 A1 | 4/2009 | Zhang et al. | |
| 2009/0114910 A1 | 5/2009 | Chang | |
| 2009/0134399 A1 | 5/2009 | Sakakura et al. | |
| 2009/0142887 A1 | 6/2009 | Son et al. | |
| 2009/0152506 A1 | 6/2009 | Umeda et al. | |
| 2009/0152541 A1 | 6/2009 | Maekawa et al. | |
| 2009/0179199 A1 | 7/2009 | Sano et al. | |
| 2009/0189153 A1 | 7/2009 | Iwasaki et al. | |
| 2009/0269880 A1 | 10/2009 | Itagaki et al. | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0025675 A1 | 2/2010 | Yamazaki et al. | |
| 2010/0025676 A1 | 2/2010 | Yamazaki et al. | |
| 2010/0025677 A1 | 2/2010 | Yamazaki et al. | |
| 2010/0025679 A1 | 2/2010 | Yamazaki et al. | |
| 2010/0051936 A1 | 3/2010 | Hayashi et al. | |
| 2010/0051938 A1 | 3/2010 | Hayashi et al. | |
| 2010/0056751 A1 | 3/2010 | Toyohara et al. | |
| 2010/0065837 A1 | 3/2010 | Omura et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2010/0157165 A1 | 6/2010 | Hiroki et al. | |
| 2010/0163876 A1 | 7/2010 | Inoue et al. | |
| 2011/0065216 A1 | 3/2011 | Kaji et al. | |
| 2011/0086472 A1 | 4/2011 | Yamazaki et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0163311 A1 | 7/2011 | Akimoto et al. | |
| 2011/0187694 A1 | 8/2011 | Umezaki | |
| 2011/0201162 A1 | 8/2011 | Hosono et al. | |
| 2011/0260169 A1 | 10/2011 | Umezaki et al. | |
| 2012/0012838 A1 | 1/2012 | Hosono et al. | |
| 2012/0043580 A1 | 2/2012 | Yamazaki et al. | |
| 2012/0068173 A1 | 3/2012 | Umezaki | |
| 2012/0108006 A1 | 5/2012 | Yamazaki et al. | |
| 2012/0168750 A1 | 7/2012 | Hayashi et al. | |
| 2012/0187837 A1 | 7/2012 | Yamazaki et al. | |
| 2012/0273779 A1 | 11/2012 | Yamazaki et al. | |
| 2013/0277672 A1 | 10/2013 | Sano et al. | |

(56) References Cited

U.S. PATENT DOCUMENTS

| | | | |
|---|---|---|---|
| 2014/0070211 | A1 | 3/2014 | Iwasaki et al. |
| 2014/0145188 | A1 | 5/2014 | Jeong et al. |
| 2018/0323313 | A1 | 11/2018 | Hosono et al. |
| 2019/0033668 | A1 | 1/2019 | Kimura |
| 2019/0235323 | A1 | 8/2019 | Kimura |

FOREIGN PATENT DOCUMENTS

| | | | |
|---|---|---|---|
| CN | 001373384 | A | 10/2002 |
| CN | 001375859 | A | 10/2002 |
| CN | 001527263 | A | 9/2004 |
| CN | 001703772 | A | 11/2005 |
| CN | 001741272 | A | 3/2006 |
| CN | 001828886 | A | 9/2006 |
| CN | 001871627 | A | 11/2006 |
| CN | 001941299 | A | 4/2007 |
| CN | 101032027 | A | 9/2007 |
| CN | 101226901 | A | 7/2008 |
| CN | 101477990 | A | 7/2009 |
| EP | 0459763 | A | 12/1991 |
| EP | 1041641 | A | 10/2000 |
| EP | 1124262 | A | 8/2001 |
| EP | 1158529 | A | 11/2001 |
| EP | 1237195 | A | 9/2002 |
| EP | 1394597 | A | 3/2004 |
| EP | 1544907 | A | 6/2005 |
| EP | 1630869 | A | 3/2006 |
| EP | 1650807 | A | 4/2006 |
| EP | 1677274 | A | 7/2006 |
| EP | 1737044 | A | 12/2006 |
| EP | 1770788 | A | 4/2007 |
| EP | 1933293 | A | 6/2008 |
| EP | 1933385 | A | 6/2008 |
| EP | 1981085 | A | 10/2008 |
| EP | 1983499 | A | 10/2008 |
| EP | 1995787 | A | 11/2008 |
| EP | 1998373 | A | 12/2008 |
| EP | 1998374 | A | 12/2008 |
| EP | 1998375 | A | 12/2008 |
| EP | 2020686 | A | 2/2009 |
| EP | 2149910 | A | 2/2010 |
| EP | 2149911 | A | 2/2010 |
| EP | 2226847 | A | 9/2010 |
| EP | 2246894 | A | 11/2010 |
| EP | 2264770 | A | 12/2010 |
| EP | 2413366 | A | 2/2012 |
| EP | 2453480 | A | 5/2012 |
| EP | 2453481 | A | 5/2012 |
| EP | 2455975 | A | 5/2012 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 03-231472 | A | 10/1991 |
| JP | 04-165679 | A | 6/1992 |
| JP | 04-295826 | A | 10/1992 |
| JP | 04-299519 | A | 10/1992 |
| JP | 05-055581 | A | 3/1993 |
| JP | 05-251705 | A | 9/1993 |
| JP | 06-302591 | A | 10/1994 |
| JP | 08-234212 | A | 9/1996 |
| JP | 08-264794 | A | 10/1996 |
| JP | 09-198712 | A | 7/1997 |
| JP | 11-121448 | A | 4/1999 |
| JP | 11-505377 | | 5/1999 |
| JP | 11-354812 | A | 12/1999 |
| JP | 2000-044236 | A | 2/2000 |
| JP | 2000-101091 | A | 4/2000 |
| JP | 2000-150900 | A | 5/2000 |
| JP | 2002-076356 | A | 3/2002 |
| JP | 2002-083773 | A | 3/2002 |
| JP | 2002-289859 | A | 10/2002 |
| JP | 2002-341373 | A | 11/2002 |
| JP | 2002-365614 | A | 12/2002 |
| JP | 2002-372722 | A | 12/2002 |
| JP | 2003-037268 | A | 2/2003 |
| JP | 2003-037270 | A | 2/2003 |
| JP | 2003-086000 | A | 3/2003 |
| JP | 2003-086808 | A | 3/2003 |
| JP | 2003-122313 | A | 4/2003 |
| JP | 2003-188181 | A | 7/2003 |
| JP | 2003-208132 | A | 7/2003 |
| JP | 2003-234344 | A | 8/2003 |
| JP | 2004-096115 | A | 3/2004 |
| JP | 2004-103957 | A | 4/2004 |
| JP | 2004-235180 | A | 8/2004 |
| JP | 2004-273614 | A | 9/2004 |
| JP | 2004-273732 | A | 9/2004 |
| JP | 2005-227618 | A | 8/2005 |
| JP | 2005-257997 | A | 9/2005 |
| JP | 2005-285890 | A | 10/2005 |
| JP | 2006-108169 | A | 4/2006 |
| JP | 2006-128665 | A | 5/2006 |
| JP | 2006-148050 | A | 6/2006 |
| JP | 2006-165520 | A | 6/2006 |
| JP | 2006-165528 | A | 6/2006 |
| JP | 2006-179878 | A | 7/2006 |
| JP | 2006-221162 | A | 8/2006 |
| JP | 2006-245557 | A | 9/2006 |
| JP | 2007-058216 | A | 3/2007 |
| JP | 2007-073559 | A | 3/2007 |
| JP | 2007-073560 | A | 3/2007 |
| JP | 2007-073976 | A | 3/2007 |
| JP | 2007-096055 | A | 4/2007 |
| JP | 2007-123861 | A | 5/2007 |
| JP | 2007-150158 | A | 6/2007 |
| JP | 2007-157916 | A | 6/2007 |
| JP | 2007-250982 | A | 9/2007 |
| JP | 2007-250983 | A | 9/2007 |
| JP | 2007-258223 | A | 10/2007 |
| JP | 2007-281409 | A | 10/2007 |
| JP | 2007-281423 | A | 10/2007 |
| JP | 2007-284342 | A | 11/2007 |
| JP | 2007-298627 | A | 11/2007 |
| JP | 2007-305658 | A | 11/2007 |
| JP | 2008-009393 | A | 1/2008 |
| JP | 2008-060419 | A | 3/2008 |
| JP | 2008-098447 | A | 4/2008 |
| JP | 2008-107807 | A | 5/2008 |
| JP | 2008-135520 | A | 6/2008 |
| JP | 2008-166716 | A | 7/2008 |
| JP | 2008-166789 | A | 7/2008 |
| JP | 2008-219008 | A | 9/2008 |
| JP | 2010-080936 | A | 4/2010 |
| KR | 93-005546 | | 6/1993 |
| KR | 0131061 | | 11/1997 |
| KR | 2000-0000907 | A | 1/2000 |
| KR | 2001-0066350 | A | 7/2001 |
| KR | 2001-0104667 | A | 11/2001 |
| KR | 10-0449849 | | 9/2004 |
| KR | 2005-0122465 | A | 12/2005 |
| KR | 10-0646975 | | 11/2006 |
| KR | 2007-0023103 | A | 2/2007 |
| KR | 10-0704252 | | 4/2007 |
| KR | 2007-0057505 | A | 6/2007 |
| KR | 2007-0072874 | A | 7/2007 |
| KR | 2007-0076149 | A | 7/2007 |
| KR | 2007-0090182 | A | 9/2007 |
| KR | 2007-0103231 | A | 10/2007 |
| KR | 10-0787464 | | 12/2007 |
| KR | 2007-0116888 | A | 12/2007 |
| KR | 2008-0052107 | A | 6/2008 |
| KR | 2008-0053489 | A | 6/2008 |
| KR | 2008-0054941 | A | 6/2008 |
| KR | 2009-0089444 | A | 8/2009 |
| KR | 10-1120151 | | 3/2012 |
| TW | 485540 | | 5/2002 |
| TW | 591807 | | 6/2004 |
| TW | 200525466 | | 8/2005 |
| TW | 200609634 | | 3/2006 |
| TW | 200613868 | | 5/2006 |

(56) References Cited

FOREIGN PATENT DOCUMENTS

| TW | 200625650 | 7/2006 |
|---|---|---|
| TW | 200629571 | 8/2006 |
| TW | 200705666 | 2/2007 |
| TW | 200739919 | 10/2007 |
| TW | 200809357 | 2/2008 |
| TW | 200822372 | 5/2008 |
| WO | WO-2004/034449 | 4/2004 |
| WO | WO-2004/114391 | 12/2004 |
| WO | WO-2005/088726 | 9/2005 |
| WO | WO-2006/025609 | 3/2006 |
| WO | WO-2006/030937 | 3/2006 |
| WO | WO-2006/051993 | 5/2006 |
| WO | WO-2006/051995 | 5/2006 |
| WO | WO-2007/032294 | 3/2007 |
| WO | WO-2007/088722 | 8/2007 |
| WO | WO-2007/091405 | 8/2007 |
| WO | WO-2007/108293 | 9/2007 |
| WO | WO-2007/119386 | 10/2007 |
| WO | WO-2007/139009 | 12/2007 |
| WO | WO-2008/023553 | 2/2008 |
| WO | WO-2008/069056 | 6/2008 |
| WO | WO-2008/069255 | 6/2008 |
| WO | WO-2008/126884 | 10/2008 |

OTHER PUBLICATIONS

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—$ZnO$ System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper: World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZNO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

(56) References Cited

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kimizuka.N et al., "SPINEL, YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Hayashi.R et al., "42.1: Invited Paper: Improved Amorphous In—Ga—Zn—O Tfts", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Nakamura.M, "Synthesis of Homologous Compound with New Long-Period Structure", Nirim Newsletter, Mar. 1, 1995, vol. 150, pp. 1-4.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Korean Office Action (Application No. 2011-0012691) dated Sep. 26, 2011.

Park.J et al., "High-performance amorphous gallium indium zinc oxide thin-film transistors through N2O plasma passivation", Appl. Phys. Lett. (Applied Physics Letters) , Aug. 7, 2008, vol. 93, pp. 053505-1-053505-3.

Chinese Office Action (Application No. 200910160554.7) dated Sep. 13, 2012.

Ide.K et al., "Effects of Excess Oxygen on Operation Characteristics of Amorphous In—Ga—Zn—O Thin-Film Transistors", Appl. Phys. Lett. (Applied Physics Letters) , 2011, vol. 99, No. 9, pp. 093507-1-093507-3.

Japanese Office Action (Application No. 2012-003959) dated Mar. 5, 2013.

Japanese Office Action (Application No. 2012-003824) dated Mar. 5, 2013.

Korean Office Action (Application No. 2012-0007200) dated Aug. 27, 2013.

Korean Office Action (Application No. 2012-0007200) dated Nov. 21, 2013.

Korean Office Action (Application No. 2013-0127653) dated Nov. 21, 2013.

(56) References Cited

OTHER PUBLICATIONS

Chinese Office Action (Application No. 201210027007.3) dated Nov. 25, 2013.
Chinese Office Action (Application No. 201210024529.8) dated Nov. 28, 2013.
Office Action (U.S. Appl. No. 13/346,118) dated Jan. 21, 2014.
Notice of Allowance (U.S. Appl. No. 13/013,054) dated Jan. 9, 2014.
Office Action (U.S. Appl. No. 13/346,118) dated May 6, 2014.
Korean Office Action (Application No. 2013-0127653) dated May 16, 2014.
Taiwanese Office Action (Application No. 101102025) dated Jun. 4, 2014.
Taiwanese Office Action (Application No. 101102028) dated Aug. 19, 2014.
Office Action (U.S. Appl. No. 13/346,118) dated Oct. 14, 2014.
Chinese Office Action (Application No. 201210024529.8) dated Mar. 9, 2015.
Notice of Allowance (U.S. Appl. No. 13/346,118) dated Mar. 12, 2015.
Chinese Office Action (Application No. 201210024542.3) dated Mar. 12, 2015.
Taiwanese Office Action (Application No. 103123137) dated Sep. 18, 2015.
Taiwanese Office Action (Application No. 105106145) dated Nov. 16, 2016.
Korean Office Action (Application No. 2017-0071723) dated Jun. 20, 2017.
Chinese Office Action (Application No. 201610070960.4) dated Dec. 25, 2017.
Korean Office Action (Application No. 2017-0071723) dated Dec. 26, 2017.
Taiwanese Office Action (Application No. 107109679) dated Jan. 21, 2020.
Taiwanese Office Action (Application No. 109138202) dated Sep. 1, 2021.

* cited by examiner

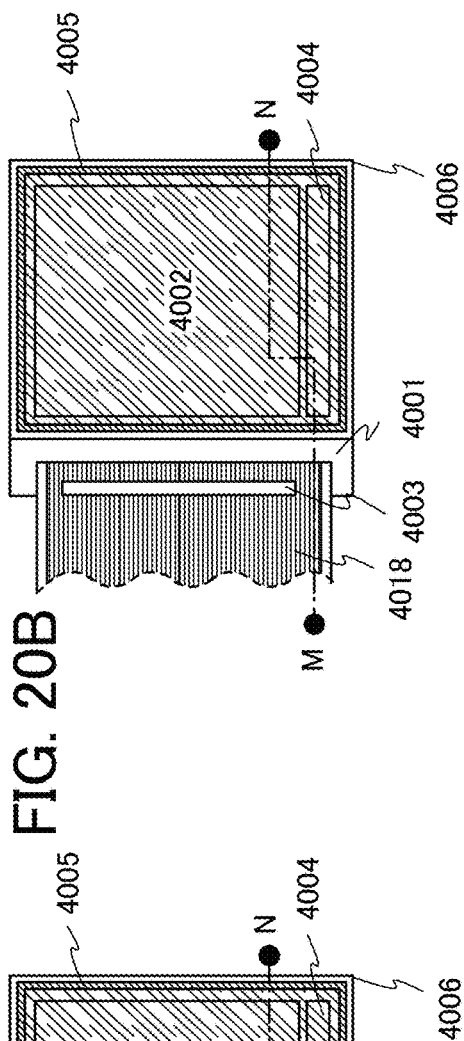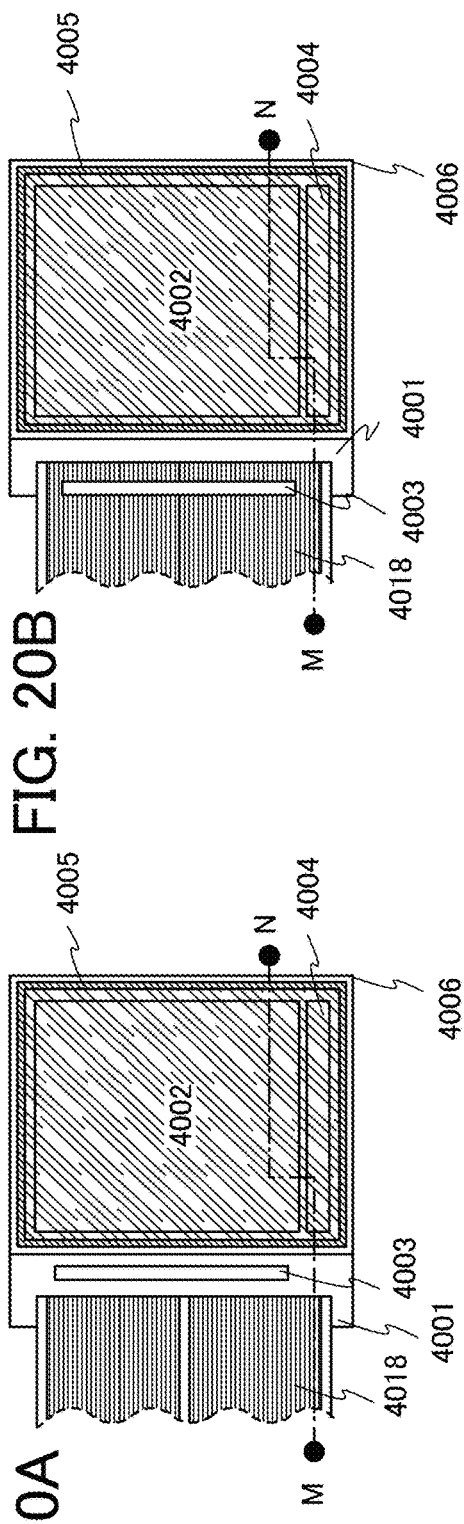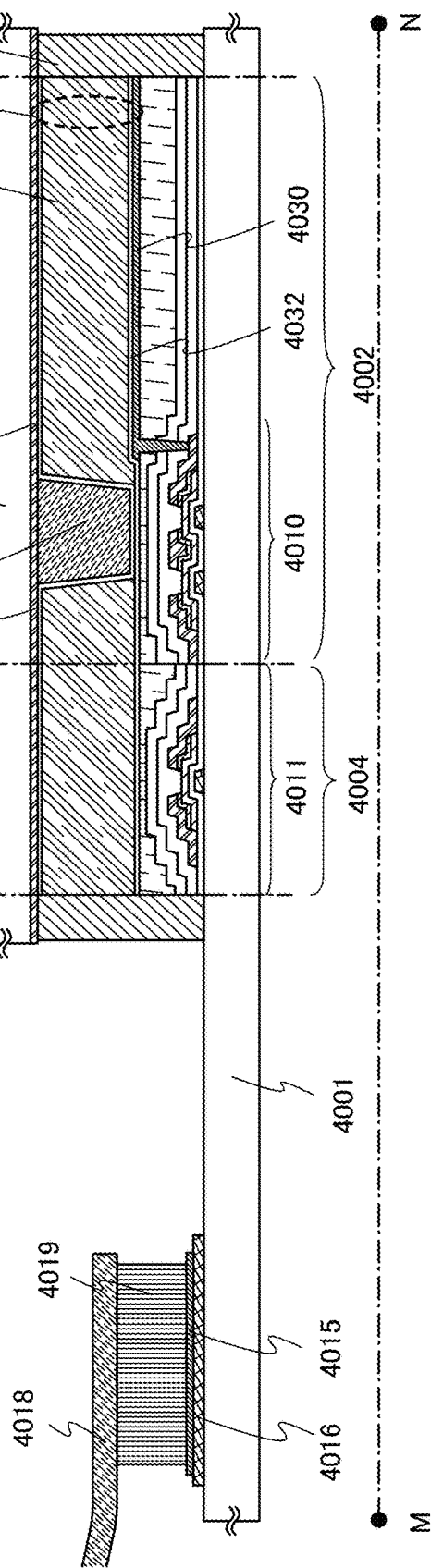

SEMICONDUCTOR DEVICE AND METHOD FOR MANUFACTURING THE SAME

BACKGROUND OF THE INVENTION

1. Field of the Invention

The present invention relates to a semiconductor device which has a circuit including a thin film transistor (hereinafter also referred to as a TFT) in which a channel formation region is formed using an oxide semiconductor film, and a manufacturing method thereof. For example, the present invention relates to an electronic appliance in which an electro-optical device typified by a liquid crystal display panel or a light-emitting display device including an organic light-emitting element is mounted as its component.

Note that the semiconductor device in this specification indicates all the devices which can operate by using semiconductor characteristics, and an electro-optical device, a semiconductor circuit, and an electronic appliance are all included in the semiconductor devices.

2. Description of the Related Art

In recent years, active matrix display devices (such as liquid crystal display devices, light-emitting display devices, or electrophoretic display devices) in which a switching element formed using a TFT is provided for each of display pixels arranged in matrix have been actively developed. In the active matrix display devices, a switching element is provided for each of pixels (or each of dots), and thus, there is such an advantage that the active matrix display devices can be driven at lower voltage than that of passive matrix display devices in the case where the pixel density is increased.

In addition, a technique has attracted attention, where a thin film transistor (TFT) in which a channel formation region is formed using an oxide semiconductor film, or the like is manufactured and such a TFT or the like is applied to electronic devices or optical devices. For example, a TFT in which zinc oxide (ZnO) is used as an oxide semiconductor film or a TFT in which $InGaO_3(ZnO)_m$ is used as an oxide semiconductor film can be given. A technique in which a TFT including such an oxide semiconductor film is formed over a light-transmitting substrate and used as a switching element or the like of an image display device, is disclosed in Reference 1 and Reference 2.

REFERENCE

Patent Document

Reference 1: Japanese Published Patent Application No. 2007-123861
Reference 2: Japanese Published Patent Application No. 2007-096055

SUMMARY OF THE INVENTION

For a thin film transistor in which a channel formation region is formed using an oxide semiconductor film, high-speed operation, a comparatively-easy manufacturing process, and sufficient reliability are required.

In formation of a thin film transistor, a low-resistance metal material is used for a source and drain electrodes. In particular, when a display device with a large-area display is manufactured, a problem of signal delay due to resistance of a wiring becomes prominent. Accordingly, it is preferable that a metal material with a low electric resistance value be used for a material of a wiring and an electrode. In a thin film transistor having a structure in which an oxide semiconductor film and a source and drain electrodes formed using a metal material with a low electric resistance value are in direct contact with each other, there is a risk that contact resistance increases. One of conceivable reasons for increase in contact resistance is formation of Schottky junction in a contact surface between the source and drain electrodes and the oxide semiconductor film.

In addition, capacitance is formed in a portion where the source and drain electrodes and the oxide semiconductor film have a direct contact with each other, and there are risks that frequency characteristics (called "f characteristics") decrease and high-speed operation of the thin film transistor is hindered.

It is an object of an embodiment of the present invention to provide a thin film transistor in which an oxide semiconductor film containing indium (In), gallium (Ga), and zinc (Zn) is used and contact resistance of a source or drain electrode is reduced, and a manufacturing method thereof.

Another object is to improve operation characteristics and reliability of the thin film transistor in which an oxide semiconductor film containing In, Ga, and Zn is used.

Further, another object is to reduce variation in electric properties of thin film transistors in each of which an oxide semiconductor film containing In, Ga, and Zn is used. In particular, in a liquid crystal display device where variation between elements is large, there is a risk that display unevenness due to variation in TFT characteristics is caused.

Further, also in a display device including a light-emitting element, in the case where there is large variation in ON current ($I_{on}$) of TFTs (TFTs in a driver circuit or TFTs supplying current to light-emitting elements arranged in pixels) which are arranged so as to make constant current flow to a pixel electrode, there is a risk that variation in luminance is generated in a display screen.

An embodiment of the present invention aims to achieve at least one of the above-described objects.

An embodiment of the present invention is an inverted staggered (bottom gate) thin film transistor in which an oxide semiconductor film containing In, Ga, and Zn is used as a semiconductor layer and a buffer layer is provided between the semiconductor layer and a source and drain electrode layers.

In this specification, a semiconductor layer formed using an oxide semiconductor film containing In, Ga, and Zn is also referred to as an "IGZO semiconductor layer".

Ohmic contact is needed between the source electrode layer and the IGZO semiconductor layer, and moreover, the contact resistance is preferably reduced as much as possible. Similarly, ohmic contact is needed between the drain electrode layer and the IGZO semiconductor layer, and the contact resistance is preferably reduced as much as possible.

Thus, a buffer layer with higher carrier concentration than the IGZO semiconductor layer is intentionally provided between the source and drain electrode layers and the IGZO semiconductor layer, so that ohmic contact is formed.

As the buffer layer, a metal oxide layer which has n-type conductivity (hereinafter referred to as an n-type metal oxide layer) is used. As the metal oxide layer, titanium oxide, molybdenum oxide, zinc oxide, indium oxide, tungsten oxide, magnesium oxide, calcium oxide, tin oxide, gallium oxide, or the like can be used. In addition, instead of the metal oxide layer, an oxide semiconductor layer containing indium, gallium, and zinc whose carrier concentration is higher than that of the oxide semiconductor layer containing indium, gallium, and zinc used for an active layer can also be used. Further, the buffer layer may contain an impurity element imparting n-type conductivity or p-type conductivity. As the impurity element, for example, indium, gallium, zinc, magnesium, aluminum, titanium, iron, tin, calcium, scandium, yttrium, zirconium, hafnium, boron, thallium, germanium, lead, or the like can be used. The buffer layer containing such an impurity element or the like has an effect that oxygen can be prevented from being extracted from the semiconductor layer due to heat treatment after film formation. Further, by addition of the impurity element, the carrier concentration in the metal oxide can be increased.

The buffer layer functions as an $n^+$ layer and can also be referred to as a source or drain region.

A semiconductor device according to an embodiment of the present invention includes a thin film transistor which includes a gate electrode layer, a gate insulating layer over the gate electrode layer, a semiconductor layer over the gate insulating layer, an n-type buffer layer over the semiconductor layer, and a source and drain electrode layers over the buffer layer. The semiconductor layer is an oxide semiconductor layer containing indium, gallium, and zinc, and the buffer layer is a metal oxide layer. The semiconductor layer and the source and drain electrode layers are electrically connected to each other with the buffer layer interposed therebetween.

A semiconductor device according to another embodiment of the present invention includes a thin film transistor which includes a gate electrode layer, a gate insulating layer over the gate electrode layer, a semiconductor layer over the gate insulating layer, an n-type buffer layer over the semiconductor layer, and a source and drain electrode layers over the buffer layer. The semiconductor layer is an oxide semiconductor layer containing indium, gallium, and zinc, and has a thin region between the source electrode layer and drain electrode layer. The buffer layer is a metal oxide layer. The semiconductor layer and the source and drain electrode layers are electrically connected to each other with the buffer layer interposed therebetween.

According to another embodiment of the present invention, as the metal oxide layer, titanium oxide, molybdenum oxide, zinc oxide, indium oxide, tungsten oxide, magnesium oxide, calcium oxide, tin oxide, or gallium oxide is preferably used. In particular, titanium oxide is preferable.

In the above structure, a second buffer layer may be provided between the semiconductor layer and the buffer layer. The carrier concentration of the second buffer layer is higher than that of the semiconductor layer and lower than that of the buffer layer. The second buffer layer functions as an $n^-$ layer. As the second buffer layer, a mixed layer of an oxide semiconductor layer containing In, Ga, and Zn and a metal oxide layer can be used. The metal oxide layer included in the second buffer layer can be formed of the same material as that for the metal oxide layer that can be used for the buffer layer.

The oxide semiconductor film (IGZO film) containing In, Ga, and Zn has such a characteristic that the hole mobility becomes higher as the carrier concentration becomes higher. Thus, the carrier concentration and the hole mobility in the oxide semiconductor film containing In, Ga, and Zn have a relation shown in FIG. 27. It is preferable that, in an embodiment of the present invention, an IGZO film appropriate for a channel of a semiconductor layer have a carrier concentration range (a concentration range 1 of a channel) less than $1\times10^{17}$ atoms/cm$^3$ (more preferably, greater than or equal to $1\times10^{11}$ atoms/cm$^3$). On the other hand, when the IGZO film is used as a buffer layer, it is preferable that the IGZO film have a carrier concentration range (a concentration range 2 of a buffer layer) greater than or equal to $1\times10^{18}$ atoms/cm$^3$ (less than or equal to $1\times10^{22}$ atoms/cm$^3$). In the case of using the IGZO film as a semiconductor layer, the carrier concentration thereof has a value obtained in a condition at room temperature where source, drain, and gate voltages are not applied.

If the carrier concentration range of the IGZO film for a channel exceeds the above range, a thin film transistor has a risk of being normally-on. Thus, with use of an IGZO film having a carrier concentration range according to an embodiment of the present invention as a channel of a semiconductor layer, a more highly reliable thin film transistor can be provided.

In addition, a titanium film is preferably used as a source and drain electrode layers. For example, a stacked layer of a titanium film, an aluminum film, and a titanium film has low resistance, and a hillock is hardly generated in the aluminum film.

According to another embodiment of the present invention, in a method for manufacturing a semiconductor device, a gate electrode layer is formed over a substrate, a gate insulating layer is formed over the gate electrode layer, a semiconductor layer is formed over the gate insulating layer, an n-type buffer layer is formed over the semiconductor layer, and a source and drain electrode layers are formed over the buffer layer. The semiconductor layer is formed using an oxide semiconductor layer containing indium, gallium, and zinc. The buffer layer is formed using a metal oxide layer. The semiconductor layer and the source and drain electrode layers are electrically connected to each other with the buffer layer interposed therebetween.

The gate insulating layer, the semiconductor layer, the n-type buffer layer, and the source and drain electrode layers can be successively formed without being exposed to air. Successive formation contributes to reduction of defects which are caused by impurities to be dusts entering an interface from air.

The gate insulating layer, the semiconductor layer, the n-type buffer layer, and the source and drain electrode layers may be formed by a sputtering method. It is preferable that the gate insulating layer and the semiconductor layer be formed in an oxygen atmosphere (or an atmosphere which contains oxygen at greater than or equal to 90% and a rare gas (argon or helium) at less than or equal to 10%) and that the n-type buffer layer be formed in a rare gas (argon or helium) atmosphere.

By successive deposition by a sputtering method as described above, productivity can be improved and reliability of an interface between thin films can be stable. Further, by forming the gate insulating layer and the semiconductor layer in an oxygen atmosphere so that a large amount of oxygen is contained therein, it is possible to suppress reduction in reliability due to deterioration, shift of the thin film transistor characteristics toward the normally-on side, and the like.

According to another embodiment of the present invention, in a method for manufacturing a semiconductor device, a gate electrode layer is formed over a substrate, a gate insulating layer is formed over the gate electrode layer, a semiconductor layer is formed over the gate insulating layer, an n-type buffer layer is formed over the semiconductor layer, and a source and drain electrode layers are formed over the buffer layer. The semiconductor layer is formed using an oxide semiconductor layer containing indium, gallium, and zinc. The buffer layer is formed using a metal oxide layer. The semiconductor layer and the source and drain electrode layers are electrically connected to each other with the buffer layer interposed therebetween. The gate insulating layer, the semiconductor layer, the buffer layer, and the source and drain electrode layers are successively formed without being exposed to air.

According to an embodiment of the present invention, a thin film transistor with small photoelectric current, small parasitic capacitance, and a high on-off ratio can be obtained, and a thin film transistor having excellent dynamic characteristics can be manufactured. Therefore, a semiconductor device which includes thin film transistors having favorable electric properties and high reliability can be provided.

BRIEF DESCRIPTION OF THE DRAWINGS

FIGS. 20A to 20C illustrate a liquid crystal display panel according to an embodiment of the present invention.

DETAILED DESCRIPTION OF THE INVENTION

Figure 1A:
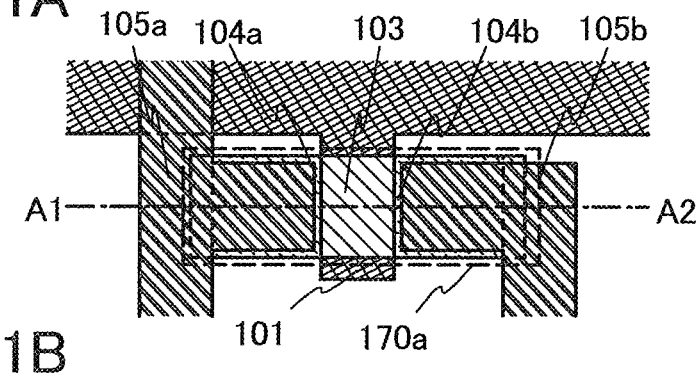
FIGS. 1A to 1D each illustrate a semiconductor device according to an embodiment of the present invention.

Embodiments of the present invention will be described in detail with reference to the accompanying drawings. However, the present invention is not limited to the following description, and various changes and modifications for the modes and details thereof will be apparent to those skilled in the art unless such changes and modifications depart from the spirit and the scope of the invention. Therefore, the present invention should not be interpreted as being limited to what is described in the embodiments. In the structures of the present invention to be described below, identical portions or portions having similar functions may be marked by the same reference numerals throughout the drawings so as to omit repeated explanation.

Embodiment 1

In this embodiment, a thin film transistor and a manufacturing process thereof will be described with reference to FIGS. 1A to 1D, FIGS. 2A and 2B, FIGS. 3A to 3Q and FIGS. 4A to 4D.

Figure 1B:
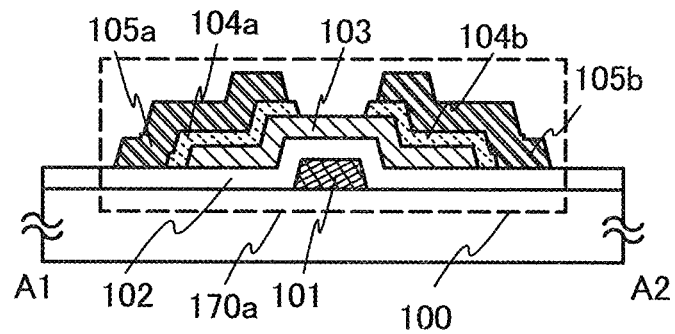
Figure 1C:
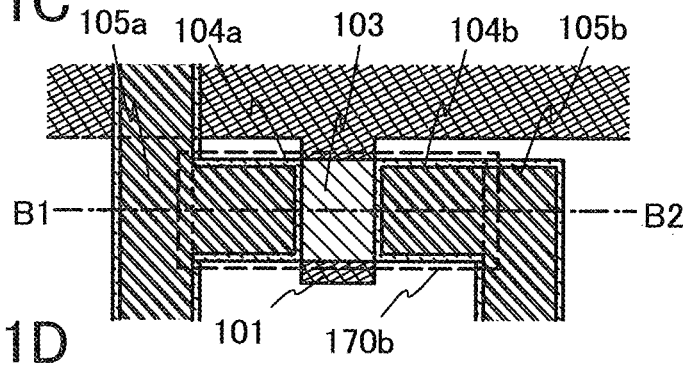
Figure 1D:
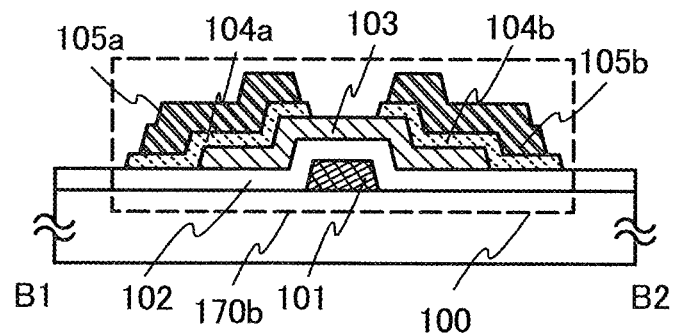
Figure 2A:
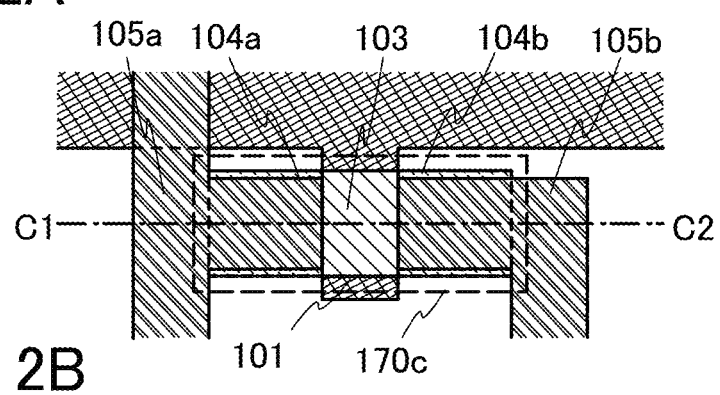
FIGS. 2A and 2B illustrate a semiconductor device according to an embodiment of the present invention.
Figure 2B:
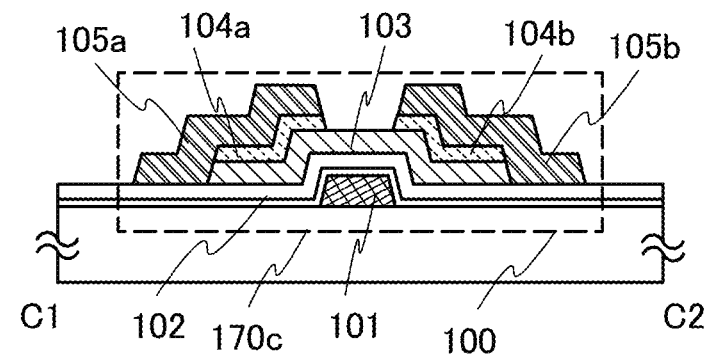

Thin film transistors 170a, 170b, and 170c each having a bottom gate structure of this embodiment are illustrated in FIGS. 1A to 1D and FIGS. 2A and 2B. FIG. 1A is a plan view and FIG. 1B is a cross-sectional view along line A1-A2 of FIG. 1A. FIG. 1C is a plan view and FIG. 1D is a cross-sectional view along line B1-B2 of FIG. 1C. FIG. 2A is a plan view and FIG. 2B is a cross-sectional view along line C1-C2 of FIG. 2A.

In FIGS. 1A to 1D, over a substrate 100, the thin film transistors 170a or 170b which includes a gate electrode layer 101, a gate insulating layer 102, a semiconductor layer 103, n-type buffer layers 104a and 104b, and a source and drain electrode layers 105a and 105b are provided.

As the semiconductor layer 103, an oxide semiconductor film containing In, Ga, and Zn is used. The buffer layers 104a and 104b having higher carrier concentration than the semiconductor layer 103 are intentionally provided between the source and drain electrode layers 105a and 105b and the semiconductor layer 103 which is an IGZO semiconductor layer, whereby ohmic contact is formed. In order to reduce variation in electric properties of a thin film transistor, the oxide semiconductor layer containing In, Ga, and Zn is preferably amorphous.

As the buffer layers 104a and 104b, an n-type metal oxide layer is used. As the metal oxide layer, titanium oxide, molybdenum oxide, zinc oxide, indium oxide, tungsten oxide, magnesium oxide, calcium oxide, tin oxide, gallium oxide, or the like can be used. In addition, instead of the metal oxide layer, an oxide semiconductor layer containing indium, gallium, and zinc whose carrier concentration is higher than that of the oxide semiconductor layer 103 can also be used. Further, the buffer layer may contain an impurity element imparting n-type conductivity or p-type conductivity. As the impurity element, for example, indium, gallium, zinc, magnesium, aluminum, titanium, iron, tin, calcium, or the like can be used. The buffer layer containing such an impurity element or the like has an effect that oxygen can be prevented from being extracted from the semiconductor layer due to heat treatment after film formation. Further, by addition of the impurity element, the carrier concentration in the metal oxide can be increased.

The buffer layers 104a and 104b each function as an n$^+$ layer and can also be referred to as a source or drain region.

In the case of the thin film transistor 170a of FIGS. 1A and 1B, the buffer layers 104a and 104b and the source and drain electrode layers 105a and 105b are processed by etching with use of different masks, so that the buffer layers 104a and 104b and the source and drain electrode layers 105a and 105b have different shapes from each other.

In the case of the thin film transistor 170b of FIGS. 1C and 1D, the buffer layers 104a and 104b and the source and drain electrode layers 105a and 105b are processed by etching with use of the same mask, so that the buffer layers 104a and 104b and the source and drain electrode layers 105a and 105b have the same or substantially the same shape.

In the case of the thin film transistor 170a of FIGS. 1A and 1B and the thin film transistor 170b of FIGS. 1C and 1D, end portions of the source and drain electrode layers 105a and 105b are not aligned with the end portions of the buffer layers 104a and 104b over the semiconductor layer 103, and the buffer layers 104a and 104b are partly exposed.

On the other hand, in the case of the thin film transistor 170c of FIGS. 2A and 2B, the semiconductor layer 103 and the buffer layers 104a and 104b are processed by etching with use of the same mask, so that end portions of the semiconductor layer 103 and end portions of the buffer layers 104a and 104b are aligned. Note that in the thin film transistor 170c of FIGS. 2A and 2B, end portions of the source and drain electrode layers 105a and 105b are also aligned with the end portions of the buffer layers 104a and 104b over the semiconductor layer 103.

Figure 11:
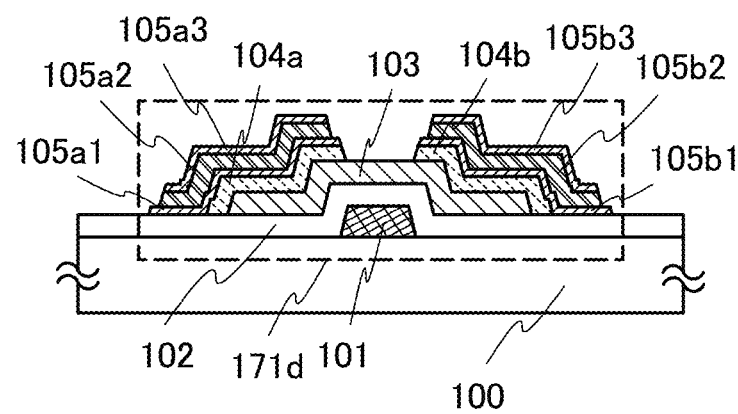
FIG. 11 illustrates a semiconductor device according to an embodiment of the present invention.

Furthermore, a thin film transistor 170d in which a source and drain electrode layers have a layered structure is illustrated in FIG. 11. The thin film transistor 170d has a structure in which a source and drain electrode layers 105a1, 105a2, and 105a3 are stacked, and a source and drain electrode layers 105b1, 105b2, and 105b3 are stacked. For example, a titanium film can be used as the source and drain electrode layers 105a1 and 105b1, an aluminum film can be used as the source and drain electrode layers 105a2 and 105b2, and a titanium film can be used as the source and drain electrode layers 105a3 and 105b3.

In the case of the thin film transistor 170d, the source and drain electrode layers 105a3 and 105b3 are formed by wet etching, and the source and drain electrode layers 105a2 and 105b2 are also formed by wet etching while using the source and drain electrode layers 105a1 and 105b1 as an etching stopper. With use of the same mask as that in the above wet etching, the source and drain electrode layers 105a1 and 105b1 and the buffer layers 104a and 104b are formed by dry etching.

Accordingly, end portions of the source and drain electrode layers 105a1 and 105b1 are aligned with end portions of the buffer layers 104a and 104b, respectively. End portions of the source and drain electrode layers 105a2 and 105b2 and end portions of the source and drain electrode layers 105a3 and 105b3 are positioned more inwardly than the end portions of the source and drain electrode layers 105a1 and 105b1.

As described above, in the case where etching selectively of the conductive film used for the source and drain electrode layers with respect to the buffer layer and the semiconductor layer is low in an etching process, a conductive film functioning as an etching stopper may be stacked, and etching may be performed plural times with use of different etching conditions.

A method for manufacturing the thin film transistor 170a of FIGS. 1A and 1B is described with reference to FIGS. 3A to 3G.

Figure 3A:
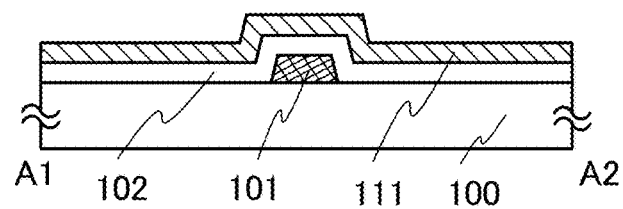
FIGS. 3A to 3G illustrate a method for manufacturing a semiconductor device according to an embodiment of the present invention.

Over the substrate 100, the gate electrode layer 101, the gate insulating layer 102, and a semiconductor film 111 are formed (FIG. 3A). As the substrate 100, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. Alternatively, a metal substrate such as a stainless steel alloy substrate, provided with an insulating film over its surface, may also be used. The substrate 100 may have a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like.

In addition, an insulating film as a base film may be formed over the substrate 100. The base film may be formed with a single layer or stacked layers of any of a silicon oxide film, a silicon nitride film, a silicon oxynitride film, and a silicon nitride oxide film by a CVD method, a sputtering method, or the like.

The gate electrode layer 101 is formed using a metal material such as titanium, molybdenum, chromium, tantalum, tungsten, or aluminum, or an alloy material thereof. The gate electrode layer 101 can be formed in such a manner that a conductive film is formed over the substrate 100 by a sputtering method or a vacuum evaporation method; a mask is formed over the conductive film by a photolithography technique or an ink-jet method; and the conductive film is etched using the mask. Alternatively, the gate electrode layer 101 can be formed by discharging a conductive nanopaste of silver, gold, copper, or the like by an ink-jet method and baking it. Note that, as barrier metal which increases adhesion of the gate electrode layer 101 and prevents diffusion thereof to the substrate or the base film, a nitride film of the above-mentioned metal material may be provided between the substrate 100 and the gate electrode layer 101. The gate electrode layer 101 may have a single-layer structure or a layered structure. For example, a structure in which a molybdenum film and an aluminum film are stacked in this order, a structure in which a molybdenum film and an alloy film of aluminum and neodymium are stacked in this order, a structure in which a titanium film and an aluminum film are stacked in this order, a structure in which a titanium film, an aluminum film, and a titanium film are stacked in this order, or the like can be formed over the substrate 100.

Note that, because a semiconductor film and a wiring are to be formed over the gate electrode layer 101, it is preferable that the gate electrode layer 101 be processed to have tapered end portions in order to prevent disconnection.

The gate insulating layer 102 and the semiconductor film 111 can be formed successively without being exposed to air. By successive formation, each interface between the stacked layers can be formed without being contaminated by atmospheric components or contaminating impurities contained in air.

In an active matrix display device, electric properties of thin film transistors included in a circuit are important, and performance of the display device depends on the electric properties. In particular, the threshold voltage (Vth) is important in the electric properties of the thin film transistor. Even if the field-effect mobility is high, when the threshold voltage value is high or the threshold voltage value is on the minus side, it is difficult to control the circuit. When the threshold voltage value is high and the absolute value of the threshold voltage is large in the thin film transistor, the thin film transistor at low driving voltage cannot perform switching function and may be a load. Further, in the case where the threshold voltage value is on the minus side, current tends to flow between the source electrode and the drain electrode even when the gate voltage is 0V; in other words, the thin film transistor tends to be normally on.

In the case of an n-channel thin film transistor, it is preferable that a channel be formed and drain current begins to flow after the positive voltage is applied as gate voltage. A transistor in which a channel is not formed unless the driving voltage is increased and a transistor in which a channel is formed and drain current flows even in the case of the negative voltage state are unsuitable for a thin film transistor used in a circuit.

Thus, it is preferable that a channel be formed with a positive threshold voltage of a gate voltage which is as close to 0V as possible in a thin film transistor using an oxide semiconductor film containing In, Ga, and Zn.

The threshold voltage value of the thin film transistor is considered to be greatly affected by an interface of the oxide semiconductor layer, that is, an interface between the oxide semiconductor layer and the gate insulating layer.

Thus, by formation of the interface in a clean condition, in addition to improving electric properties of the thin film transistor, the manufacturing process can be prevented from being complicated, so that a thin film transistor provided with improved mass productivity and high performance is achieved.

In particular, in the case where moisture from air is present at an interface between the oxide semiconductor layer and the gate insulating layer, problems such as degradation in electric properties of the thin film transistor, variation in threshold voltages, and the thin film transistor which tends to be normally on arise. By successive formation of the oxide semiconductor layer and the gate insulating layer, such hydrogen compounds can be prevented from existing at the interface.

Thus, the gate insulating layer 102 and the semiconductor film 111 are successively deposited under reduced pressure by a sputtering method without being exposed to air, whereby a thin film transistor having an excellent interface, reduced leakage current, and high current driving capability can be achieved.

Further, the gate insulating layer 102 and the semiconductor film 111 which is an oxide semiconductor film containing In, Ga, and Zn are preferably deposited in an oxygen atmosphere (or an atmosphere containing oxygen at greater than or equal to 90% and a rare gas such as argon at less than or equal to 10%).

By successive deposition with use of a sputtering method in such a manner, productivity is increased and reliability of an interface between thin films is stable. Furthermore, the gate insulating layer and the semiconductor layer are deposited in an oxygen atmosphere so that a large amount of oxygen is contained, so that it is possible to suppress the decrease in reliability due to deterioration and the thin film transistor to be normally on.

The gate insulating layer 102 can be formed by a CVD method, a sputtering method, or the like using a silicon oxide film, a silicon nitride film, a silicon oxynitride film, or a silicon nitride oxide film. In the thin film transistor 170*c* illustrated in FIGS. 2A and 2B, the gate insulating layer 102 has a layered structure.

The gate insulating layer 102 can be formed by stacking a silicon nitride film or a silicon nitride oxide film, and a silicon oxide film or a silicon oxynitride film in this order. Note that the gate insulating layer can be formed by stacking not two layers but three layers of a silicon nitride film or a silicon nitride oxide film, a silicon oxide film or a silicon oxynitride film, and a silicon nitride film or a silicon nitride oxide film in this order from the substrate side. Alternatively, the gate insulating layer 102 can be formed with a single layer of a silicon oxide film, a silicon nitride film, a silicon oxynitride film, or a silicon nitride oxide film.

As the gate insulating layer 102, a silicon nitride film may be formed over the gate electrode layer 101 by a plasma CVD method and a silicon oxide film may be formed by a sputtering method over the silicon nitride film. Alternatively, a silicon nitride film and a silicon oxide film may be sequentially stacked over the gate electrode layer 101 by a plasma CVD method, and a silicon oxide film may be further formed over the silicon oxide film by a sputtering method.

Here, a silicon oxynitride film means a film that contains more oxygen than nitrogen and contains oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, a silicon nitride oxide film means a film that contains more nitrogen than oxygen and contains oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

Alternatively, the gate insulating layer 102 may be formed using one kind of oxide, nitride, oxynitride, and nitride oxide of aluminum, yttrium, magnesium, or hafnium; or a compound including at least two or more kinds of the above.

A halogen element such as chlorine or fluorine may be contained in the gate insulating layer 102. The concentration of the halogen element in the gate insulating layer 102 may be from $1\times10^{15}$ atoms/cm$^3$ to $1\times10^{20}$ atoms/cm$^3$ inclusive at the concentration peak.

As the semiconductor film 111, an oxide semiconductor film containing In, Ga, and Zn is formed. The semiconductor film 111 is preferably formed to have a thickness in a thin region of from 2 nm to 200 nm inclusive (more preferably, from 20 nm to 150 nm inclusive) after etching. For example, as the semiconductor film 111, an oxide semiconductor film containing In, Ga, and Zn is formed to a thickness of 50 nm by a sputtering method. As specific example conditions, an oxide semiconductor target containing In, Ga, and Zn of 8 inches in diameter is used, a distance between a substrate and the target is set to 170 mm, and deposition is performed with direct-current (DC) power source of 0.5 kW at pressure of 0.4 Pa in an argon or oxygen atmosphere. Further, with use of a pulsed direct-current (DC) power source, dusts can be reduced and the thickness becomes uniform, which is preferable.

Figure 3B:
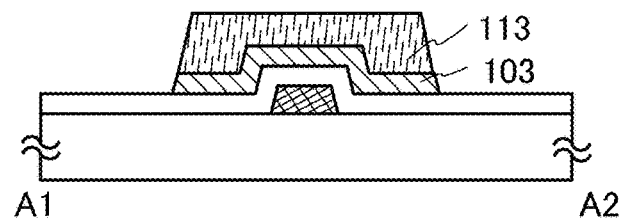

Next, with use of a mask 113, the semiconductor film 111 is processed by etching to form the semiconductor layer 103 (FIG. 3B). The semiconductor layer 103 can be formed by etching the semiconductor film 111 with use of the mask 113 which is formed by a photolithography technique or a droplet discharge method.

The semiconductor layer 103 is etched to have a tapered shape at an end portion, whereby disconnection of a wiring due to a step shape can be prevented.

Figure 3C:
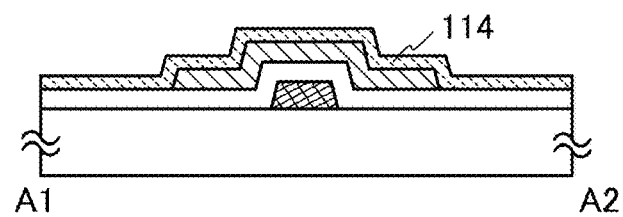
Figure 3D:
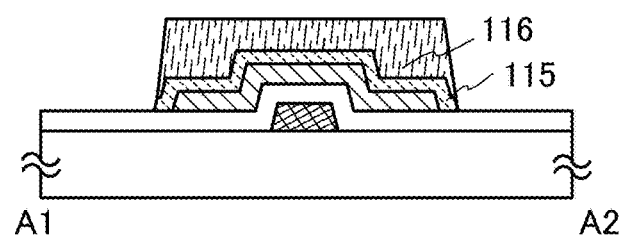

Next, an n-type metal oxide film 114 is formed over the gate insulating layer 102 and the semiconductor layer 103 (FIG. 3C). A mask 116 is formed over the n-type metal oxide film 114. The mask 116 is formed by a photolithography technique or an ink-jet method. With use of the mask 116, the n-type metal oxide film 114 is processed by etching to form an n-type metal oxide film 115 (FIG. 3D). The n-type metal oxide film 115 may have a thickness of from 2 nm to 100 nm inclusive (preferably, from 20 nm to 50 nm inclusive). It is preferable to form the n-type metal oxide film 114 in a rare gas (preferably, argon) atmosphere. In this embodiment, the metal oxide film 114 is formed using a titanium oxide film. In one example of a method for etching the metal oxide film 114, diluted hydrogen fluoride, hydrochloric acid, or sulfuric acid, or a solution in which ammonia water, a hydrogen peroxide solution, and pure water are mixed at a volume ratio of 1:1:5 can be used for an etchant.

As a formation method other than a sputtering method, of the semiconductor film 111, the n-type metal oxide film 115, or the like, vapor phase methods such as a pulsed laser deposition method (a PLD method) and an electron beam evaporation method can be used. Among vapor phase methods, a PLD method is suitable in terms of easy control of the composition of materials, and a sputtering method is suitable in terms of mass productivity as described above.

Figure 3E:
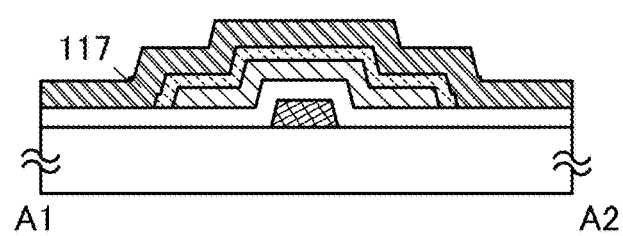

A conductive film 117 is formed over the n-type metal oxide film 115 (FIG. 3E).

The conductive film 117 is preferably formed using a single layer or stacked layer of aluminum, copper, or an aluminum alloy to which an element improving heat resistance or an element preventing a hillock such as silicon, titanium, neodymium, scandium, or molybdenum is added. Alternatively, the conductive film 117 may have a layered structure where a film on the side in contact with the n-type metal oxide film is formed of titanium, tantalum, molybdenum, tungsten, or nitride of any of these elements and an aluminum film or an aluminum alloy film is formed thereover. Further alternatively, the conductive film 117 may have a layered structure in which top and bottom surfaces of aluminum or an aluminum alloy are sandwiched between titanium, tantalum, molybdenum, tungsten, or nitride thereof. Here, a layered conductive film of a titanium film, an aluminum film, and a titanium film is used as the conductive film 117. Such stacked conductive films can be etched using a hydrogen peroxide solution or heated hydrochloric acid for an etchant.

A stacked layer of a titanium film, an aluminum film, and a titanium film has low resistance and a hillock is hardly generated in the aluminum film.

The conductive film 117 is formed by a sputtering method or a vacuum evaporation method. Alternatively, the conductive film 117 may be formed by discharging a conductive nanopaste of silver, gold, copper, or the like by a screen printing method, an ink-jet method, or the like and baking it.

Figure 3F:
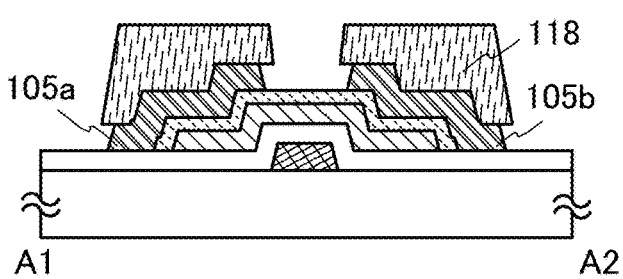
Figure 3G:
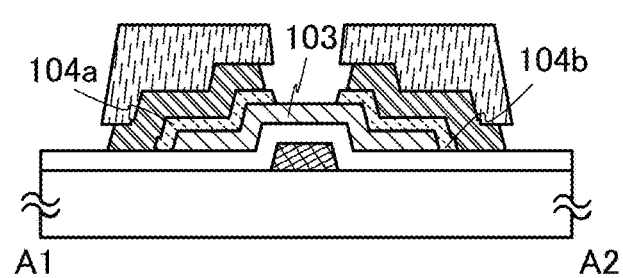

Next, a mask 118 is formed over the conductive film 117. The conductive film 117 is etched with use of the mask 118 to be separated, so that the source and drain electrode layers 105a and 105b are formed (FIG. 3F). As illustrated in FIG. 3F of this embodiment, the conductive film 117 is subjected to wet etching, whereby the conductive film 117 is isotropically etched. Thus, end portions of the source and drain electrode layers 105a and 105b are not aligned with end portions of the mask 118, and the end portions of the source and drain electrode layers 105a and 105b are positioned more inwardly than the end portions of the mask 118. Next, the n-type metal oxide film 115 is etched with use of the mask 118 to form the buffer layers 104a and 104b (FIG. 3G). Note that, depending on the etching condition, in the etching step of the n-type metal oxide film 115, the exposed region of the semiconductor layer 103 is partly etched. Accordingly, a channel region of the semiconductor layer 103 between the buffer layers 104a and 104b is a region with a small thickness although not illustrated. Note that in this embodiment, formation of the buffer layers 104a and 104b and formation of the source and drain electrode layers 105a and 105b are separated, so that the length of a region where the end portions of the buffer layer 104a and the source or drain electrode layer 105a do not overlap with each other and a region where the end portions of the buffer layer 104b and the source or drain electrode layer 105b do not overlap with each other can be easily controlled.

In addition, the semiconductor layer 103 may be subjected to plasma treatment. By plasma treatment, the semiconductor layer 103 damaged by etching can be recovered. It is preferable to perform plasma treatment in an $O_2$ or $N_2O$ atmosphere, preferably, an $N_2$, He, or Ar atmosphere containing oxygen. Alternatively, plasma treatment may be performed in an atmosphere where $Cl_2$ or $CF_4$ is added to the above atmosphere. Note that it is preferable that plasma treatment be performed with non-bias applied.

The end portions of the buffer layers 104a and 104b are not aligned with the end portions of the source and drain electrode layers 105a and 105b over the semiconductor layer 103, and the end portions of the buffer layers 104a and 104b are formed outside the end portions of the source and drain electrode layers 105a and 105b.

After that, the mask 118 is removed. Through the above steps, the thin film transistor 170a can be formed.

Next, the manufacturing steps of the thin film transistor 170b of FIGS. 1C and 1D are described with reference to FIGS. 4A to 4D.

Figure 4A:
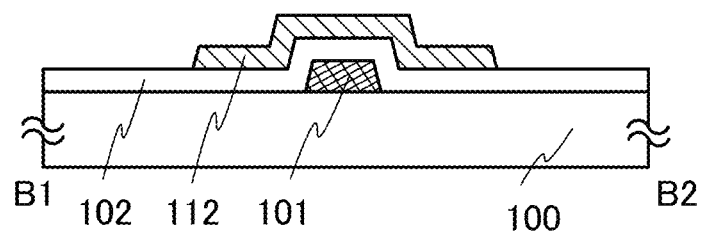
FIGS. 4A to 4D illustrate a method for manufacturing a semiconductor device according to an embodiment of the present invention.
Figure 4B:
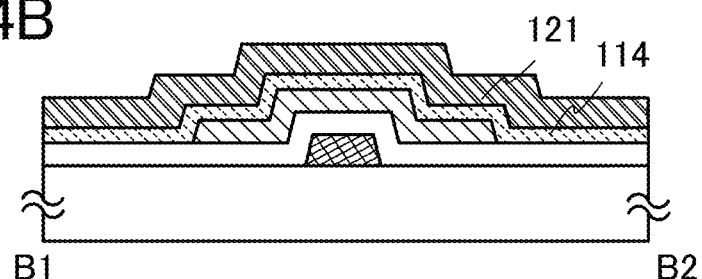

FIG. 4A illustrates a state in which the mask 113 is removed after the step of FIG. 3B. An n-type metal oxide film 114 and a conductive film 121 are sequentially stacked over the semiconductor layer 103 (FIG. 4B). In this case, the n-type metal oxide film 114 and the conductive film 121 can be deposited successively by a sputtering method without being exposed to air.

Figure 4C:
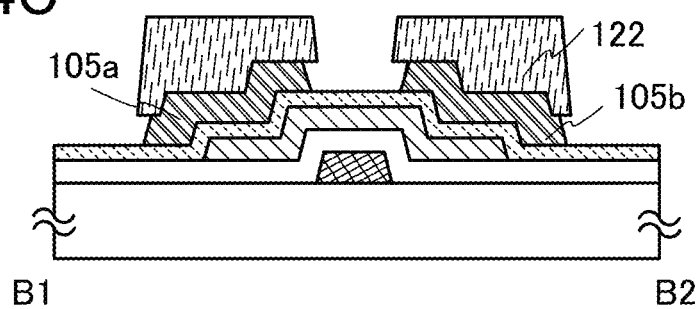

A mask 122 is formed over the n-type metal oxide film 114 and the conductive film 121, and with use of the mask 122, the conductive film 121 is processed by wet etching to form the source and drain electrode layers 105a and 105b (FIG. 4C).

Figure 4D:
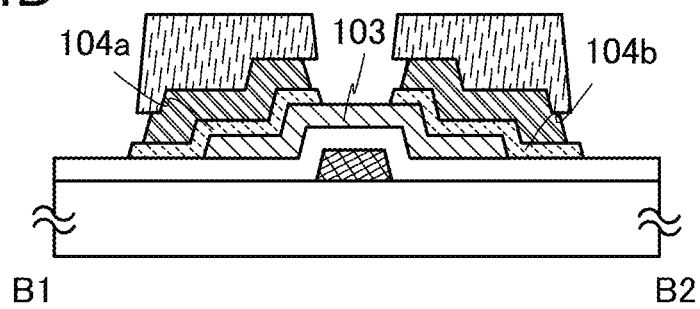

Next, the n-type metal oxide film 114 is processed by dry etching to form the buffer layers 104a and 104b (FIG. 4D). The same mask is used in the etching step for forming the buffer layers 104a and 104b and the etching step for forming the source and drain electrode layers 105a and 105b as illustrated in FIGS. 4C and 4D, whereby the number of masks can be reduced; therefore, simplification of a process and reduction in cost can be achieved.

An insulating film may be formed as a protective film over the thin film transistors 170a and 170b. The protective film can be formed in a manner similar to formation of the gate insulating layer. Note that the protective film is provided to prevent entry of a contaminant impurity such as an organic substance, a metal substance, or moisture contained in air and is preferably a dense film. For example, a stacked layer of a silicon oxide film and a silicon nitride film may be formed as the protective film over the thin film transistors 170a and 170b.

Further, it is preferable that heat treatment be performed on the semiconductor layer 103 after being formed. Heat treatment may be performed in any step after the film formation step, and it can be performed immediately after the semiconductor film 103 is formed, after the conductive film 117 is formed, after the protective film is formed, or the like. Further, such heat treatment may be performed to serve also as another heat treatment. The heating temperature may be from 300° C. to 400° C. inclusive, preferably, 350° C. In the case where the semiconductor layer 103 and the buffer layers 104a and 104b are successively deposited as illustrated in FIGS. 2A and 2B, heat treatment may be performed after the layers are stacked. Heat treatment may be performed plural times so that heat treatment of the semiconductor layer 103 and heat treatment of the buffer layers 104a and 104b are performed in different steps.

The end portions of the source and drain electrode layers 105a and 105b are not aligned with the end portions of the buffer layers 104a and 104b, whereby the distance between the end portions of the source and drain electrode layers 105a and 105b is long. Therefore, generation of a leakage current and short circuit between the source and drain electrode layers 105a and 105b can be prevented. Accordingly, a thin film transistor with high reliability and high withstand voltage can be manufactured.

Alternatively, like the thin film transistor 170c of FIGS. 2A and 2B, a structure in which the end portions of the buffer layers 104a and 104b and the end portions of the source and drain electrode layers 105a and 105b are aligned with each other may be formed. Etching for forming the source and drain electrode layers 105a and 105b and etching for forming the buffer layers 104a and 104b are dry etching, whereby a structure of the thin film transistor 170c of FIGS. 2A and 2B can be obtained. Alternatively, a structure of the thin film transistor 170c of FIGS. 2A and 2B can be formed by forming the buffer layers 104a and 104b by etching the n-type metal oxide film 114 with use of the source and drain electrode layers 105a and 105b as a mask.

In the case of a structure in which a gate electrode layer, a gate insulating layer, a semiconductor layer (an oxide semiconductor layer containing In, Ga, and Zn), and a source and drain electrode layers are stacked without providing a buffer layer (an n-type metal oxide layer), a distance between the gate electrode layer and the source or drain electrode layer is small, so that parasitic capacitance generated between the gate electrode layer and the source or drain electrode layer increases. Furthermore, the parasitic capacitance is significantly increased by a thin semiconductor layer. In this embodiment, the buffer layer having a high carrier concentration, which is an n-type metal oxide layer is provided, and the thin film transistor has a structure in which the gate electrode layer, the gate insulating layer, the semiconductor layer, the buffer layer, and the source and drain electrode layers are stacked. Therefore, parasitic capacitance can be suppressed even if the semiconductor layer has a small thickness.

According to this embodiment, a thin film transistor with small photoelectric current, small parasitic capacitance, and a high on-off ratio can be obtained, so that a thin film transistor having excellent dynamic characteristics can be manufactured. Therefore, a semiconductor device including a thin film transistor with favorable electric properties and high reliability can be provided.

Embodiment 2

In this embodiment, an example of a thin film transistor having a multi-gate structure according to an embodiment of the present invention will be described. Accordingly, except the gate electrode layer, the thin film transistor can be formed in a manner similar to Embodiment 1, and repetitive description of the same portions or portions having functions similar to those in Embodiment 1 and manufacturing steps thereof will be omitted.

In this embodiment, a thin film transistor included in a semiconductor device will be described with reference to FIGS. 5A and 5B, FIGS. 6A and 6B, and FIGS. 7A and 7B.

Figure 5A:
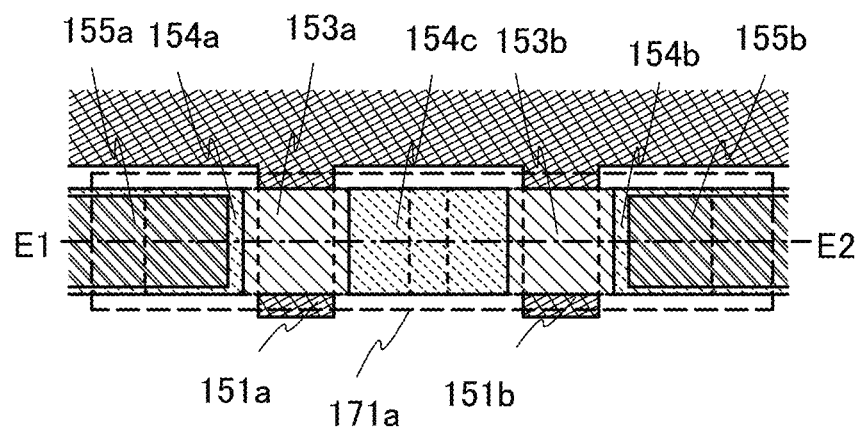
FIGS. 5A and 5B illustrate a semiconductor device according to an embodiment of the present invention.
Figure 5B:
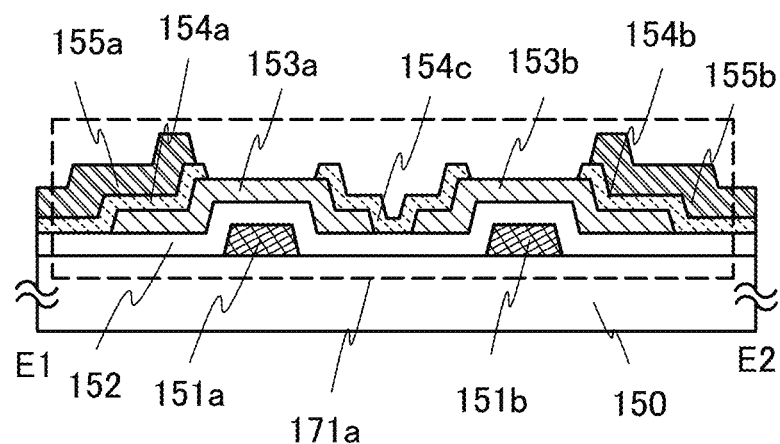

FIG. 5A is a plan view illustrating a thin film transistor 171a and FIG. 5B is a cross-sectional view of the thin film transistor 171a along line E1-E2 of FIG. 5A.

As illustrated in FIGS. 5A and 5B, over a substrate 150, the thin film transistor 171a having a multi-gate structure, which includes gate electrode layers 151a and 151b, semiconductor layers 153a and 153b, buffer layers 154a, 154b, and 154c, and a source and drain electrode layers 155a and 155b, is formed.

The semiconductor layers 153a and 153b are oxide semiconductor layers containing In, Ga, and Zn, and the buffer layers 154a, 154b, and 154c are n-type metal oxide layers. The buffer layers 154a, 154b, and 154c functioning as a source and drain regions ($n^+$ layers) have higher carrier concentration than the semiconductor layers 153a and 153b.

The semiconductor layers 153a and 153b are electrically connected to each other with the buffer layer 154c interposed therebetween. In addition, the semiconductor layer 153a is electrically connected to the source or drain electrode layer 155a with the buffer layer 154a interposed therebetween, and the semiconductor layer 153b is electrically connected to the source or drain electrode layer 155b with the buffer layer 154b interposed therebetween.

Figure 6A:
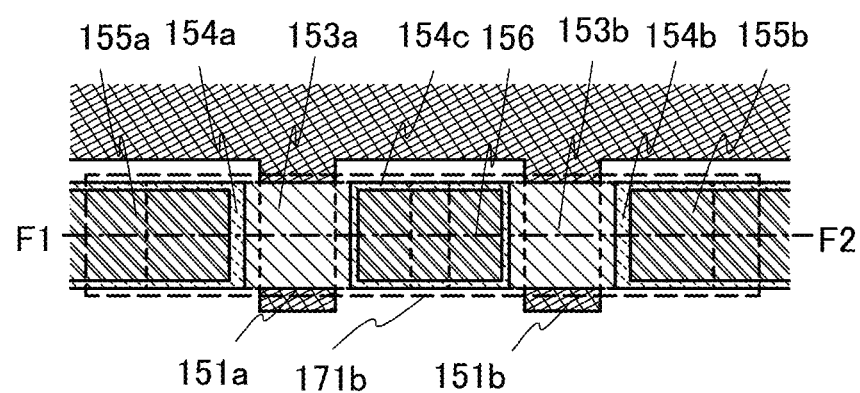
FIGS. 6A and 6B illustrate a semiconductor device according to an embodiment of the present invention.
Figure 6B:
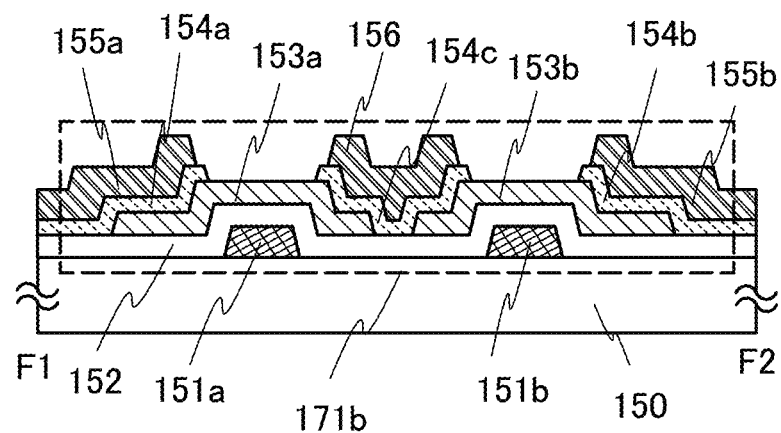

FIGS. 6A and 6B illustrate a thin film transistor 171b having another multi-gate structure. FIG. 6A is a plan view of the thin film transistor 171b and FIG. 6B is a cross-sectional view thereof along line F1-F2 of FIG. 6A. In the thin film transistor 171b of FIGS. 6A and 6B, a wiring layer 156 which is formed in the same step of formation of a source and drain electrode layers 155a and 155b is provided over a buffer layer 154c, and semiconductor layers 153a and 153b are electrically connected to each other with the buffer layer 154c and the wiring layer 156 interposed therebetween.

Figure 7A:
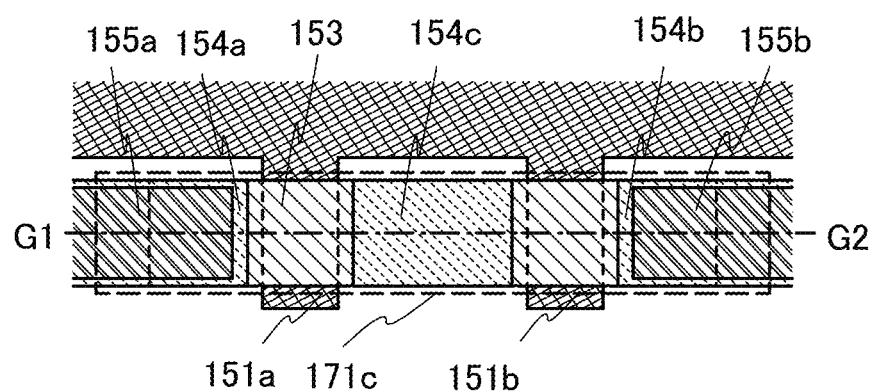
FIGS. 7A and 7B illustrate a semiconductor device according to an embodiment of the present invention.
Figure 7B:
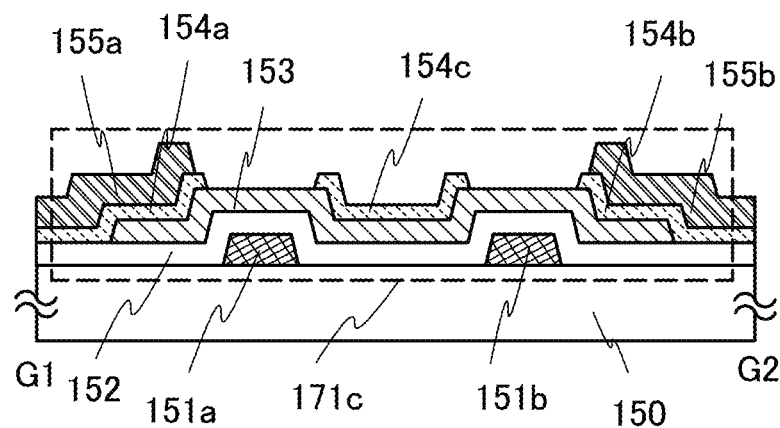

FIGS. 7A and 7B illustrate a thin film transistor 171c having another multi-gate structure. FIG. 7A is a plan view of the thin film transistor 171c and FIG. 7B is a cross-sectional view thereof along line G1-G2 of FIG. 7A. In the thin film transistor 171c of FIGS. 7A and 7B, the semiconductor layers 153a and 153b are formed as a continuous semiconductor layer 153. The semiconductor layer 153 is formed so as to straddle the gate electrode layers 151a and 151b, with the gate insulating layer 152 interposed therebetween.

As described above, in the thin film transistor having a multi-gate structure according to an embodiment of the present invention, the semiconductor layer formed over the gate electrode layers may be provided continuously, or a plurality of semiconductor layers which are electrically connected to each other with the buffer layer, the wiring layer, or the like interposed therebetween may be provided.

The thin film transistor having a multi-gate structure according to an embodiment of the present invention has small off current, and a semiconductor device including such a thin film transistor can have favorable electric properties and high reliability.

This embodiment describes, as a multi-gate structure, examples of a double gate structure in which two gate electrode layers are provided, but the present invention can also be applied to a triple gate structure or the like which has more gate electrode layers than the double gate structure.

Embodiment 3

In this embodiment, an example of a thin film transistor according to an embodiment of the present invention, in which a buffer layer has a layered structure, will be described. Therefore, except the buffer layer, the thin film transistor can be formed in a manner similar to Embodiment 1 or Embodiment 2, and repetitive description of the same portions or portions having functions similar to those in Embodiment 1 or Embodiment 2, and manufacturing steps thereof will be omitted.

In this embodiment, a thin film transistor 173 used in a semiconductor device is described with reference to FIG. 8.

Figure 8:
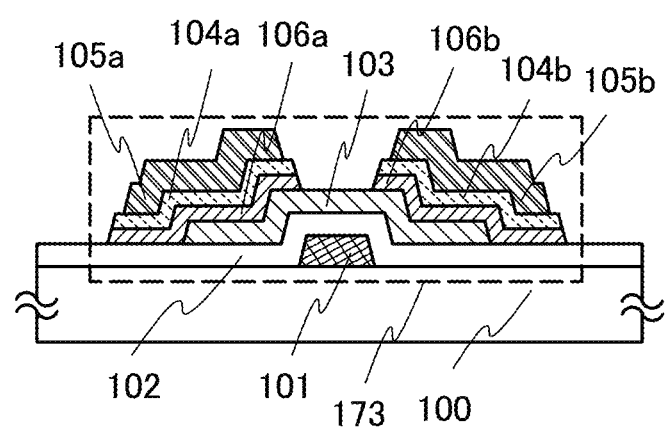
FIG. 8 illustrates a semiconductor device according to an embodiment of the present invention.

As illustrated in FIG. 8, over a substrate 100, the thin film transistor 173 including a gate electrode layer 101, a semiconductor layer 103, buffer layers 106a and 106b, buffer layers 104a and 104b, and a source and drain electrode layers 105a and 105b is provided.

In the thin film transistor 173 of this embodiment, the buffer layers 106a and 106b are provided as second buffer layers between the semiconductor layer 103 and the buffer layer 104a and between the semiconductor layer 103 and the buffer layer 104b, respectively.

The semiconductor layer 103 is an oxide semiconductor layer containing In, Ga, and Zn. The buffer layers 104a and 104b are metal oxide layers. The buffer layers 106a and 106b are mixed layers of an oxide semiconductor layer containing In, Ga, and Zn and a metal oxide layer. The buffer layers 106a and 106b can be formed by co-sputtering of a metal oxide target and an oxide semiconductor target containing In, Ga, and Zn. As the metal oxide layer, titanium oxide, molybdenum oxide, zinc oxide, indium oxide, tungsten oxide, magnesium oxide, calcium oxide, tin oxide, gallium oxide, or the like can be used. In particular, titanium oxide is preferable. In addition, the buffer layers 104a and 104b and the buffer layers 106a and 106b may contain an n-type impurity element or p-type impurity element. As the impurity element, for example, indium, gallium, zinc, magnesium, aluminum, titanium, iron, tin, calcium, scandium, yttrium, zirconium, hafnium, boron, thallium, germanium, lead, or the like can be used. By using different kinds of metals, the carrier concentration in the metal oxide can be increased.

The second buffer layers (the buffer layers 106a and 106b) provided between the semiconductor layer 103 and the buffer layers 104a and 104b have a carrier concentration which is higher than that of the semiconductor layer 103 but lower than that of the buffer layers 104a and 104b. The buffer layers 104a and 104b function as $n^+$ layers, and the second buffer layers (the buffer layers 106a and 106b) function as $n^-$ layers.

As described above, the buffer layers provided between the semiconductor layer and the source and drain electrode layers may have a layered structure, and the carrier concentration of the buffer layers is controlled to become higher from the semiconductor layer toward the source and drain electrode layers.

A thin film transistor including stacked buffer layers according to an embodiment of the present invention has small off current. A semiconductor device including such a thin film transistor can have favorable electric properties and high reliability. In addition, when the carrier density is increased from the semiconductor layer 103 toward the source or drain electrode layer, contact resistance between the semiconductor layer 103 and the source or drain electrode layer can be reduced. Further, by providing the second buffer layer, electric field concentrated at the bonding surface between the source or drain electrode layer and the semiconductor layer 103 can be relieved.

This embodiment can be combined with any of the other embodiments as appropriate.

Embodiment 4

In this embodiment, an example in which a shape of the thin film transistor and a manufacturing method of the thin film transistor are partly different from those of Embodiment 1 will be described. Except the shape, the thin film transistor can be formed in a manner similar to Embodiment 1; thus, repetitive description of the same portions or portions having functions similar to those in Embodiment 1 and manufacturing steps thereof will be omitted.

Figure 9A:
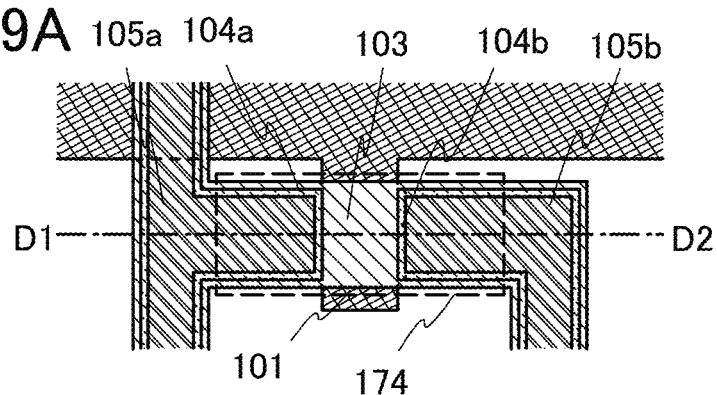
FIGS. 9A and 9B illustrate a semiconductor device according to an embodiment of the present invention.

In this embodiment, a thin film transistor 174 used in a display device and manufacturing steps thereof will be described with reference to FIGS. 9A and 9B and FIGS. 10A to 10D. FIG. 9A is a plan view of the thin film transistor 174, FIG. 9B is a cross-sectional view thereof along line D1-D2 of FIG. 9A, and FIGS. 10A to 10D are cross-sectional views illustrating manufacturing steps thereof along line D1-D2 of FIG. 9A.

Figure 9B:
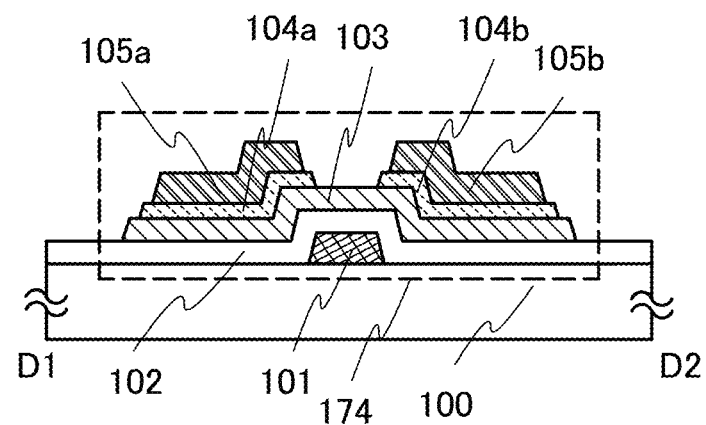

As illustrated in FIGS. 9A and 9B, over a substrate 100, the thin film transistor 174 including a gate electrode layer 101, a semiconductor layer 103, buffer layers 104a and 104b, and a source and drain electrode layers 105a and 105b is provided.

The semiconductor layer 103 is an oxide semiconductor layer containing In, Ga, and Zn, and the buffer layers 104a and 104b are n-type metal oxide layers. The buffer layers 104a and 104b function as source and drain regions ($n^+$ layers) and have higher carrier concentration than the semiconductor layer 103.

The semiconductor layer 103 is electrically connected to the source and drain electrode layers 105a and 105b with the buffer layers 104a and 104b interposed therebetween, respectively.

Figure 10A:
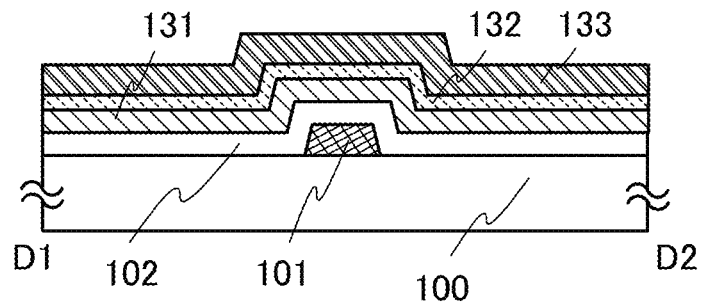
FIGS. 10A to 10D illustrate a method for manufacturing a semiconductor device according to an embodiment of the present invention.

Manufacturing steps of the thin film transistor 174 are described with reference to FIGS. 10A to 10D. The gate electrode layer 101 is formed over the substrate 100. Next, over the gate electrode layer 101, a gate insulating layer 102, a semiconductor film 131 which is an oxide semiconductor film containing In, Ga, and Zn, an n-type metal oxide film 132, and a conductive film 133 are formed in this order (FIG. 10A).

The gate insulating layer 102, the semiconductor film 131 which is an oxide semiconductor film containing In, Ga, and Zn, the n-type metal oxide film 132, and the conductive film 133 can be successively formed without being exposed to air. Successive formation of the films without exposure to air enables each interface between stacked layers to be formed without being contaminated with atmospheric components or impurity elements contained in air. Thus, variations in characteristics of the thin film transistor can be reduced.

In this embodiment, an example in which exposure using a high-tone mask is performed for forming a mask 135 is described. A resist is formed in order to form the mask 135. As the resist, a positive type resist or a negative type resist can be used. Here, a positive type resist is used.

Next, the resist is irradiated with light with use of a multi-tone mask as a photomask, so that the resist is exposed to light.

A multi-tone mask can achieve three levels of light exposure to obtain an exposed portion, a half-exposed portion, and an unexposed portion; one-time exposure and development process enables a resist mask with regions of plural thicknesses (typically, two kinds of thicknesses) to be formed. The use of a multi-tone mask allows the number of photomasks to be reduced.

As typical examples of the multi-tone mask, there are a gray-tone mask and a half-tone mask.

A gray-tone mask includes a light-transmitting substrate, and a light-blocking portion and a diffraction grating which are formed thereover. The light transmittance of the light-blocking portion is 0%. The diffraction grating has a light-transmitting portion in a slit form, a dot form, a mesh form, or the like with intervals less than or equal to the resolution limit of light used for the exposure; thus, the light transmittance can be controlled. The diffraction grating can have regularly-arranged slits, dots, or meshes, or irregularly-arranged slits, dots, or meshes.

As the light-transmitting substrate, a light-transmitting substrate such as a quartz substrate can be used. The light-blocking portion and the diffraction grating can be formed using a light-blocking material such as chromium or chromium oxide, which absorbs light.

When the gray-tone mask is irradiated with light for exposure, the light transmittance of the light-blocking portion is 0% and that of a region where neither the light-blocking portion nor the diffraction grating is provided is 100%. The light transmittance of the diffraction grating can be controlled in a range of 10% to 70%. The control of the light transmission in the diffraction grating can be performed by adjusting the interval of slits, dots, or meshes of the diffraction grating and the pitch thereof.

A half-tone mask includes a light-transmitting substrate, and a semi-light-transmitting portion and a light-blocking portion which are formed thereover. The semi-light-transmitting portion can be formed using MoSiN, MoSi, MoSiO, MoSiON, CrSi, or the like. The light-blocking portion can be formed of a light-blocking material such as chromium or chromium oxide, which absorbs light.

When the half-tone mask is irradiated with light for exposure, the light transmittance of the light-blocking portion is 0% and that of a region where neither the light-blocking portion nor the semi-light-transmitting portion is provided is 100%. Further, the light transmittance of the semi-light-transmitting portion can be controlled in a range of 10% to 70%. Control of the transmittance of light through the semi-light-transmitting portion is possible by control of a material of the semi-light-transmitting portion.

Figure 10B:
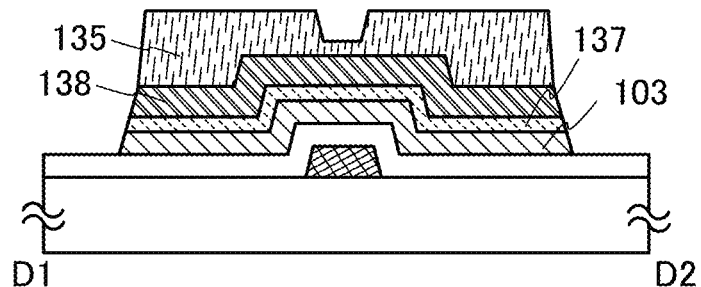

After the exposure to light using the multi-tone mask, development is performed, whereby the mask 135 including regions with different thicknesses can be formed as illustrated in FIG. 10B.

Next, the semiconductor film 131, the metal oxide film 132, and the conductive film 133 are etched with use of the mask 135 to be separated. As a result, a semiconductor film 103, an n-type metal oxide film 137, and a conductive film 138 can be formed (FIG. 10B).

Figure 10C:
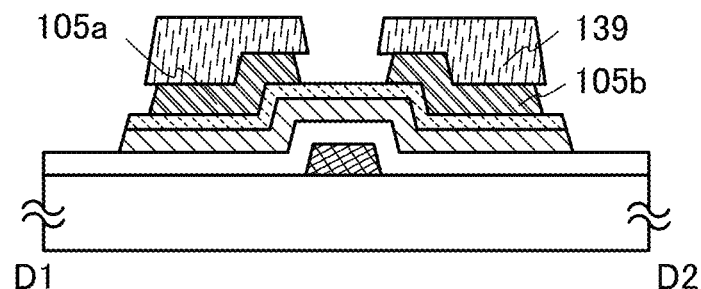

Next, ashing is performed on the resist mask 135. As a result, an area of the mask is decreased, and the thickness thereof is reduced. At the time of the ashing, the resist of the mask in a region with a small thickness (a region overlapping with part of the gate electrode layer 101) is removed, and a separated mask 139 can be formed (FIG. 10C).

Figure 10D:
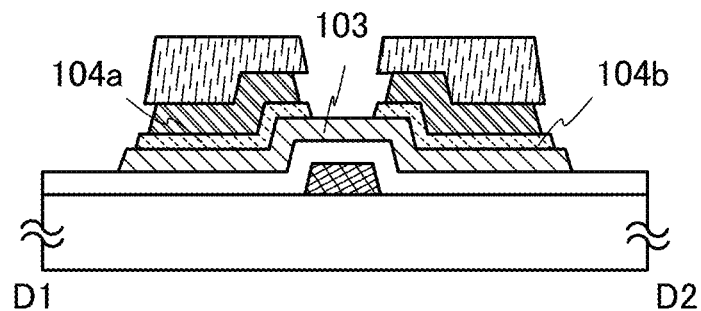

The conductive film 138 is etched with use of the mask 139 to form the source and drain electrode layers 105a and 105b. When the conductive film 138 is subjected to wet etching as described in this embodiment, the conductive film 138 is isotropically etched. Thus, end portions of the source and drain electrode layers 105a and 105b are not aligned with and positioned more inwardly than end portions of the mask 139. Accordingly, end portions of the n-type metal oxide film 137 and end portions of the semiconductor film 103 are positioned outside the end portions of the source and drain electrode layers 105a and 105b. Then, the n-type metal oxide film 137 is etched with use of the mask 139 to form the buffer layers 104a and 104b (FIG. 10D). Note that when etching selectivity of the metal oxide film 137 with respect to the semiconductor layer 103 is low, an exposed region of the semiconductor layer 103 is partly etched during etching of the metal oxide film 137 and thus the semiconductor layer 103 has a groove which is not illustrated.

Then, the mask 139 is removed.

Through the above steps, the thin film transistor 174 illustrated in FIGS. 9A and 9B can be manufactured.

The use of a resist mask including regions of plural thicknesses (typically, two kinds of thicknesses) formed with use of a multi-tone mask as in this embodiment enables the number of resist masks to be reduced; therefore, the process can be simplified and cost can be reduced.

This embodiment can be combined with any of the other embodiments as appropriate.

Embodiment 5

In this embodiment, a manufacturing example of an inverted staggered thin film transistor is described, in which at least a gate insulating film and an oxide semiconductor layer are deposited to be stacked successively without being exposed to air. In this embodiment, steps up to the successive deposition are described, and steps after the successive deposition may be carried out in accordance with any of Embodiments 1 to 4 to manufacture a thin film transistor.

In this specification, in successive deposition, a substrate to be processed is placed under an atmosphere which is controlled to be vacuum or an inert gas atmosphere (a nitrogen atmosphere or a rare gas atmosphere) at all times without being exposed to a contaminant atmosphere such as air, during a process from a first deposition step using a sputtering method to a second deposition step using a sputtering method. By the successive deposition, deposition can be performed while preventing moisture or the like from being attached again to the substrate to be processed which is cleaned.

Performing the process from the first deposition step to the second deposition step in the same chamber is within the scope of the successive deposition in this specification.

In addition, the following is also within the scope of the successive deposition in this specification: in the case of performing the process from the first deposition step to the second deposition using plural chambers, the substrate is transferred after the first deposition step to another chamber without being exposed to air and subjected to the second deposition.

Note that between the first deposition step and the second deposition step, a substrate transfer step, an alignment step, a slow-cooling step, a step of heating or cooling the substrate to a temperature which is necessary for the second deposition step, or the like may be provided. Such a process is also within the scope of the successive deposition in this specification.

A step in which liquid is used, such as a cleaning step, wet etching, or formation of a resist may be provided between the first deposition step and the second deposition step. This case is not within the scope of the successive deposition in this specification.

Figure 12:
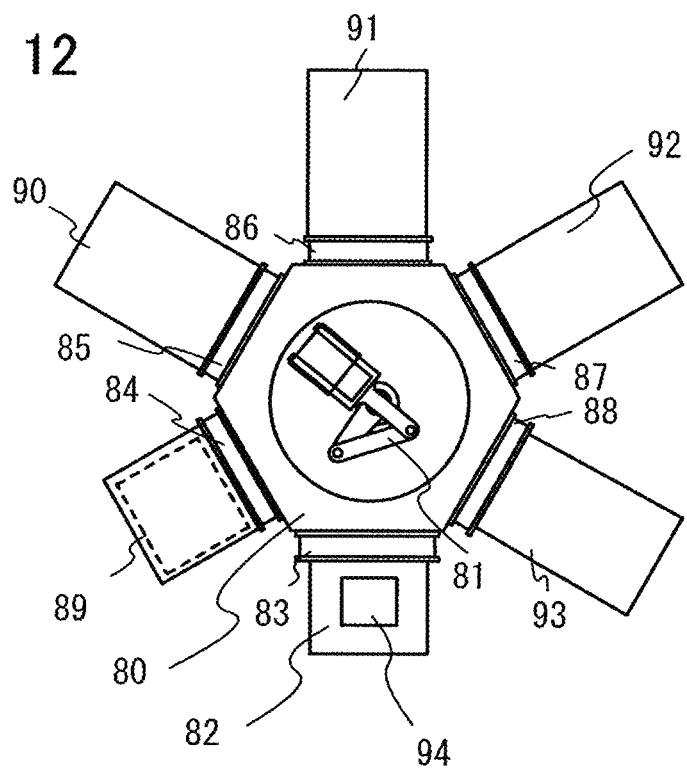
FIG. 12 is a top schematic view of a multi-chamber manufacturing apparatus according to an embodiment of the present invention.

When films are successively deposited without being exposed to air, a multi-chamber manufacturing apparatus as illustrated in FIG. 12 is preferably used.

At the center of the manufacturing apparatus, a transfer chamber 80 equipped with a transfer mechanism (typically, a transfer robot 81) for transferring a substrate is provided. A cassette chamber 82 in which a cassette case storing a plurality of substrates carried into and out of the transfer chamber 80 is set is connected to the transfer chamber 80.

In addition, a plurality of treatment chambers are connected to the transfer chamber 80 through gate valves 84 to 88. In this embodiment, an example in which five treatment chambers are connected to the transfer chamber 80 having a hexagonal top shape is illustrated. Note that, by changing the top shape of the transfer chamber, the number of treatment chambers which can be connected to the transfer chamber can be changed. For example, three treatment chambers can be connected to a transfer chamber having a tetragonal shape, or seven treatment chambers can be connected to a transfer chamber having an octagonal shape.

At least one treatment chamber among the five treatment chambers is a sputtering chamber in which sputtering is performed. The sputtering chamber is provided with, at least inside the chamber, a sputtering target, a mechanism for applying electric power, a gas introduction means for sputtering the target, a substrate holder for holding a substrate at a predetermined position, and the like. Further, the sputtering chamber is provided with a pressure control means with which the pressure in the chamber is controlled, so that the pressure is reduced in the sputtering chamber.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case of depositing an insulating film, and a DC sputtering method is mainly used in the case of depositing a metal film.

In addition, there is also a multi-source sputtering apparatus in which a plurality of targets of different materials can be set. With the multi-source sputtering apparatus, films of different materials can be deposited to be stacked in the same chamber, or a plurality of kinds of materials can be deposited by electric discharge at the same time in the same chamber.

In addition, there are a sputtering apparatus provided with a magnet system inside the chamber and used for a magnetron sputtering method, or a sputtering apparatus used for an ECR sputtering method in which plasma generated with the use of microwaves is used without using glow discharge.

In the sputtering chamber of this embodiment, any of various sputtering ways described above is used as appropriate.

In addition, as a deposition method, there are also a reactive sputtering method in which a target substance and a sputtering gas component are chemically reacted with each other during deposition to form a thin compound film thereof, and a bias sputtering method in which voltage is also applied to a substrate during deposition.

In addition, among the five treatment chambers, one of the other treatment chambers than the sputtering chamber is a heating chamber in which a substrate is preheated or the like before sputtering, a cooling chamber in which a substrate is cooled after sputtering, or a chamber in which plasma treatment is performed.

Next, an example of an operation of the manufacturing apparatus is described.

A substrate cassette storing a substrate 94 whose deposition target surface faces downward is set in the cassette chamber 82, and the cassette chamber 82 is placed in a reduced pressure state by a vacuum evacuation means provided in the cassette chamber 82. In each of the treatment chambers and the transfer chamber 80, the pressure is reduced in advance by a vacuum evacuation means provided in each chamber. Accordingly, during transferring the substrate between the treatment chambers, the substrate is not exposed to air and can be kept clean.

Note that at least a gate electrode is provided in advance for the substrate 94 which is placed so that its deposition target surface faces downward. For example, a base insulating film such as a silicon nitride film or a silicon nitride oxide film may be provided by a plasma CVD method between the substrate and the gate electrode. When a substrate formed of glass containing alkali metal is used as the substrate 94, the base insulating film has an effect of preventing mobile ions of sodium or the like from entering a semiconductor region from the substrate so that variation in electric properties of a TFT can be suppressed.

Here, a substrate over which a silicon nitride film covering the gate electrode is formed by a plasma CVD method to form a first layer of a gate insulating film is used. The silicon nitride film formed by a plasma CVD method is dense, so that generation of pin holes or the like can be suppressed by using this silicon nitride film as the first layer of the gate insulating film. Although this embodiment shows an example in which the gate insulating film has a stacked structure, the present invention is not limited thereto, and the gate insulating film may be a single layer or have a stacked structure including three or more layers.

Then, the gate valve 83 is opened and the substrate 94 which is the first substrate is picked up from the cassette by the transfer robot 81. After that, the gate valve 84 is opened, the substrate 94 is transferred to a first treatment chamber 89, and then, the gate valve 84 is closed. In the first treatment chamber 89, by heating the substrate 94 by a heater or a lamp, moisture or the like attached to the substrate 94 is removed. In particular, when the gate insulating film contains moisture, electric properties of a TFT could possibly be changed; therefore, heating before sputtering deposition is effective. In the case where moisture has been sufficiently removed at the time when the substrate is set in the cassette chamber 82, this heating treatment is not necessary.

In addition, plasma treatment may be performed on the surface of the first layer of the gate insulating film by providing a plasma treatment means in the first treatment chamber 89. Furthermore, heating for removing moisture may be performed in the cassette chamber 82 by providing a heating means in the cassette chamber 82.

Then, the gate valve 84 is opened and the substrate is transferred to the transfer chamber 80 by the transfer robot 81. After that, the gate valve 85 is opened and the substrate is transferred to a second treatment chamber 90, and the gate valve 85 is closed.

In this embodiment, the second treatment chamber 90 is a sputtering chamber in which sputtering is performed using an RF magnetron sputtering method. In the second treatment chamber 90, a silicon oxide (SiOx) film is deposited as a second layer of the gate insulating film. As the second layer of the gate insulating film, other than a silicon oxide film, an aluminum oxide ($Al_2O_3$) film, a magnesium oxide (MgOx) film, an aluminum nitride (AlNx) film, an yttrium oxide (YOx) film, or the like can be used.

A small amount of a halogen element such as fluorine or chlorine may be added to the second layer of the gate insulating film so that mobile ions of sodium or the like can be immobilized. As a method for adding a small amount of a halogen element, sputtering is performed by introducing a gas containing a halogen element into the chamber. In the case where a gas containing a halogen element is introduced, the evacuation means of the chamber is needed to be provided with an abatement system. The peak of the concentration of a halogen element to be contained in the gate insulating film is measured by secondary ion mass spectrometry (SIMS) and is preferably in the range of from $1 \times 10^{15}$ $cm^{-3}$ to $1 \times 10^{20}$ $cm^{-3}$ inclusive.

When the SiOx film is formed, a sputtering method in which artificial quartz is used as a target and a rare gas, typically, argon is used, or a reactive sputtering method in which single crystal silicon is used as a target and chemically reacted with an oxygen gas to obtain a SiOx film can be used. Here, artificial quartz is used as a target, and sputtering is performed under an atmosphere containing only oxygen or an atmosphere containing oxygen at greater than or equal to 90% and Ar at less than or equal to 10% so that as much oxygen as possible is contained in the SiOx film. Thus, a SiOx film containing excessive oxygen is formed.

After the SiOx film is deposited, the gate valve 85 is opened, and the substrate is transferred to the transfer chamber 80 by the transfer robot 81 without being exposed to air. Then, the gate valve 86 is opened, the substrate is transferred to a third treatment chamber 91, and the gate valve 86 is closed.

In this embodiment, the third treatment chamber 91 is a sputtering chamber in which sputtering is performed using a DC magnetron sputtering method. In the third treatment chamber 91, an oxide semiconductor film containing In, Ga, and Zn (IGZO film) is deposited as a semiconductor layer. The IGZO film can be deposited using an oxide semiconductor target containing In, Ga, and Zn, under a rare gas atmosphere or an oxygen atmosphere. Here, an oxide semiconductor containing In, Ga, and Zn is used as a target and sputtering is performed by a pulsed DC sputtering method under an atmosphere containing only oxygen or an atmosphere containing oxygen at greater than or equal to 90% and Ar at less than or equal to 10% so that as much oxygen as possible is contained in the IGZO film, whereby an IGZO film containing excessive oxygen is formed.

As described above, the SiOx film containing excessive oxygen and the IGZO film containing excessive oxygen are deposited successively without being exposed to air, whereby an interface state between the films containing excessive oxygen can be stabilized, and the reliability of a TFT can be improved. If the substrate is exposed to air before deposition of the IGZO film, moisture or the like is attached and the interface state is adversely affected, which may cause phenomena such as variation in threshold voltage, deterioration in electric properties, and a normally-on TFT. Moisture is a hydrogen compound. When the films are successively deposited without being exposed to air, the hydrogen compound can be prevented from existing at the interface. Therefore, by successive deposition, variation in threshold voltage can be reduced, deterioration in electric properties can be prevented, or shift of the TFT characteristics to the normally-on side can be reduced, desirably, the shift of the TFT characteristics can be prevented.

In addition, in the second treatment chamber 90 which is a sputtering chamber, both an artificial quartz target and an oxide semiconductor target containing In, Ga, and Zn are placed, and the films are successively deposited by using a shutter; therefore, the films can be stacked in the same chamber. A shutter is provided between the target and the substrate; a shutter is opened for a target which is deposited, and a target which is not deposited is shielded by a shutter. Advantages of a process in which the films are stacked in the same chamber are the following points: reduction of the number of chambers which are used, and prevention of particles or the like attached to the substrate during transfer of the substrate between different chambers.

Next, the gate valve 86 is opened and the substrate is transferred to the transfer chamber 80 by the transfer robot 81 without being exposed to air.

If a gray-tone mask is not used, the substrate is carried out of the manufacturing apparatus through the cassette chamber at this stage, and the IGZO film containing excessive oxygen is patterned through a photolithography technique. If a gray-tone mask is used, successive deposition described below is performed.

Then, the gate valve 87 is opened, and the substrate is transferred to a fourth treatment chamber 92 without being exposed to air. After that, the gate valve 87 is closed.

Here, the fourth treatment chamber 92 is a sputtering chamber in which sputtering is performed using a DC magnetron sputtering method. A buffer layer is deposited in the fourth treatment chamber 92. In this embodiment, an example is described in which a titanium oxide (TiOx) film is deposited as an n-type metal oxide film used as a buffer layer. An oxygen gas is introduced to the fourth treatment chamber 92 which is a sputtering chamber and reactive sputtering is performed using a titanium target, whereby a TiOx film is formed. A target obtained by adding In, Ga, or Zn to the titanium target may also be used. Alternatively, a target obtained by adding Mg or Al to the titanium target may be used. The TiOx film functions as source and drain regions.

Note that a second buffer layer ($n^-$ layer) may be formed between the oxide semiconductor film containing In, Ga, and Zn and the buffer layer by successive deposition. The carrier concentration of the second buffer layer is higher than that of the semiconductor layer and lower than that of the buffer layer. When a mixed layer of an oxide semiconductor layer containing In, Ga, and Zn and a buffer layer is used as the second buffer layer, both an oxide semiconductor target containing In, Ga, and Zn and a titanium target are placed in the same treatment chamber, and the films are successively deposited to be stacked by using a shutter. First, a shutter for the titanium target is closed, and an oxide semiconductor film containing In, Ga, and Zn is deposited. Next, the shutter for the titanium target is opened, and the oxide semiconductor film containing In, Ga, and Zn and TiOx are deposited at the same time. Then, a shutter for the oxide semiconductor target containing In, Ga, and Zn is closed, and TiOx is deposited. Accordingly, an n⁻ layer and an n⁺ layer can be formed successively over the semiconductor layer.

Next, the gate valve 87 is opened, and the substrate is transferred to the transfer chamber 80 by the transfer robot 81 without being exposed to air. Then, the gate valve 88 is opened, the substrate is transferred to a fifth treatment chamber 93, and the gate valve 88 is closed.

In this embodiment, the fifth treatment chamber 93 is a sputtering chamber in which sputtering is performed using a DC magnetron sputtering method. In the fifth treatment chamber 93, a metal multi-layer film which becomes source and drain electrodes is deposited. In the fifth treatment chamber 93 which is a sputtering chamber, both a titanium target and an aluminum target are placed. The films are deposited to be stacked in the same chamber by successive deposition using a shutter. Here, an aluminum film is stacked over a titanium film, and a titanium film is further stacked over the aluminum film.

As described above, when a gray-tone mask is used, the SiOx film containing excessive oxygen, the IGZO film containing excessive oxygen, the metal oxide film, and the metal multi-layer film can be deposited successively without being exposed to air, whereby an interface state of the IGZO film containing excessive oxygen is particularly stabilized, and the reliability of a TFT can be improved. If the substrate is exposed to air before or after deposition of the IGZO film, moisture or the like is attached and the interface state is adversely affected, which may cause phenomena such as variation in threshold voltage, deterioration in electric properties, and a normally-on TFT. Moisture is a hydrogen compound. When the films are successively deposited without being exposed to air, the hydrogen compound can be prevented from existing at the interface of the IGZO film. Therefore, by successive deposition of the four layers, variation in threshold voltage can be reduced, deterioration in electric properties can be prevented, or shift of the TFT characteristics to the normally-on side can be reduced, desirably, the shift of the TFT characteristics can be prevented.

In addition, when the metal oxide film and the metal multi-layer film are successively deposited without being exposed to air, a favorable interface state between the metal oxide film and the metal multi-layer film can be achieved and contact resistance can be reduced.

Alternatively, without using the fourth treatment chamber 92, the TiOx film and the metal multi-layer film can be deposited successively in the fifth treatment chamber 93. In this case, the films are deposited successively using a shutter, whereby the films are stacked in the same chamber. Here, an aluminum target is shielded by a shutter, and an oxygen gas is introduced and reactive sputtering is performed, whereby a titanium oxide film (TiOx film) is formed. Next, an oxygen gas is exhausted from the fifth treatment chamber 93, an argon gas is introduced, and sputtering is performed, so that a titanium film is deposited. Then, a titanium target is shielded by a shutter, and an aluminum film is stacked over the titanium film. After that, the aluminum target is shielded by the shutter, and a titanium film is stacked over the aluminum film. Advantages of a process in which the films are stacked in the same chamber are the following points: reduction of the number of chambers which are used, and prevention of particles or the like attached to the substrate during transfer of the substrate between different chambers.

After the above-described steps are repeated to perform a deposition process on a plurality of substrates in a cassette case, the vacuum cassette chamber is opened to air, and the substrate and the cassette are taken out.

Further, heat treatment, specifically, heat treatment at 300° C. to 400° C., preferably, heat treatment at greater than or equal to 350° C. can be performed in the first treatment chamber 89 after deposition of the IGZO film containing excessive oxygen. By such heat treatment, electric properties of an inverted staggered thin film transistor can be improved. Timing of the heat treatment is not limited to a particular timing as long as the heat treatment is performed after deposition of the IGZO film containing excessive oxygen and can be performed right after deposition of the IGZO film containing excessive oxygen or right after deposition of the metal multi-layer film, for example.

Then, each of the stacked films is patterned using a gray-tone mask. The film may be patterned using dry etching or wet etching, or etched by plural times of etching selectively.

Steps after the etching are carried out in accordance with Embodiment 4, whereby an inverted staggered thin film transistor can be manufactured.

In this embodiment, a multi-chamber manufacturing apparatus is shown as an example, but an in-line manufacturing apparatus in which sputtering chambers are connected in series may be used and successive deposition may be performed without being exposed to air.

The apparatus illustrated in FIG. 12 has a so-called face-down treatment chamber in which the deposition target surface of the substrate faces downward, but may also have a vertical placement treatment chamber in which a substrate is placed vertically. The vertical placement treatment chamber has an advantage that a footprint is smaller than that of a face-down treatment chamber and can be effectively used in the case where a large-area substrate which could be bent due to its weight is used.

Embodiment 6

In this embodiment, an example in which at least a part of a driver circuit and a thin film transistor to be disposed in a pixel portion are formed over one substrate will be described.

The thin film transistor to be disposed in the pixel portion is formed according to any of Embodiments 1 to 4. Further, the thin film transistor described in any of Embodiments 1 to 4 is an n-channel TFT. Thus, a part of a driver circuit that can be formed using n-channel TFTs among driver circuits is formed over the same substrate as that for the thin film transistor of the pixel portion.

Figure 13A:
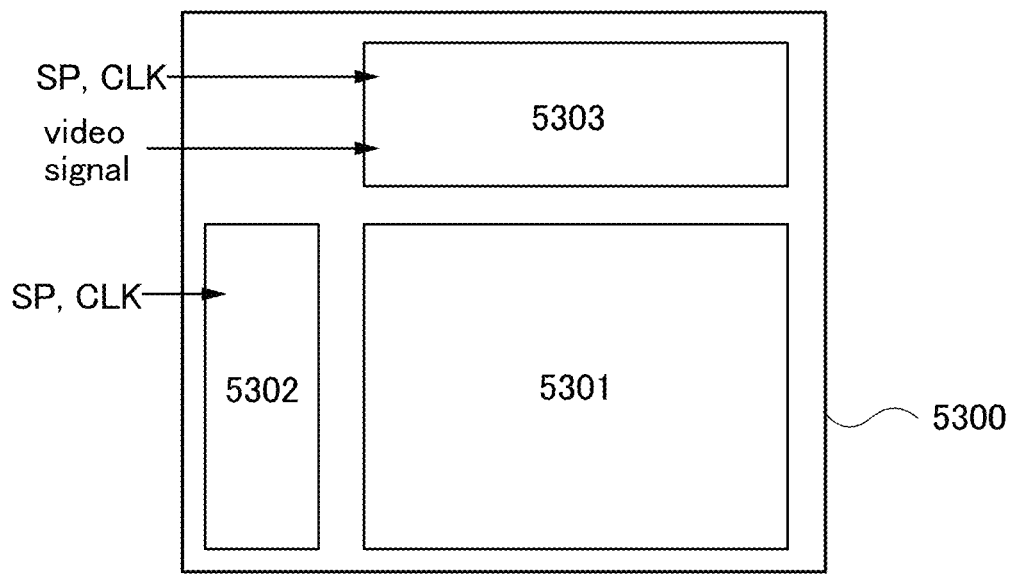
FIGS. 13A and 13B are block diagrams each showing a display device according to an embodiment of the present invention.

FIG. 13A illustrates an example of a block diagram of an active matrix liquid crystal display device. The display device illustrated in FIG. 13A includes, over a substrate 5300, a pixel portion 5301 including a plurality of pixels each provided with a display element; a scanning line driver circuit 5302 that selects a pixel; and a signal line driver circuit 5303 that controls a video signal input to the selected pixel. The pixel portion 5301 is connected to the signal line driver circuit 5303 by a plurality of signal lines S1 to Sm (not illustrated) that extend in a column direction from the signal line driver circuit 5303, and to the scanning line driver circuit 5302 by a plurality of scanning lines G1 to Gn (not illustrated) that extend in a row direction from the scanning line driver circuit 5302. The pixel portion 5301 includes a plurality of pixels (not illustrated) arranged in matrix so as to correspond to the signal lines S1 to Sm and the scanning lines G1 to Gn. Each pixel is connected to a signal line Sj (one of the signal lines S1 to Sm) and a scanning line Gj (one of the scanning lines G1 to Gn).

In addition, the thin film transistor described in any of Embodiments 1 to 4 is an n-channel TFT, and a signal line driver circuit including the n-channel TFT is described with reference to FIG. 14.

Figure 14:
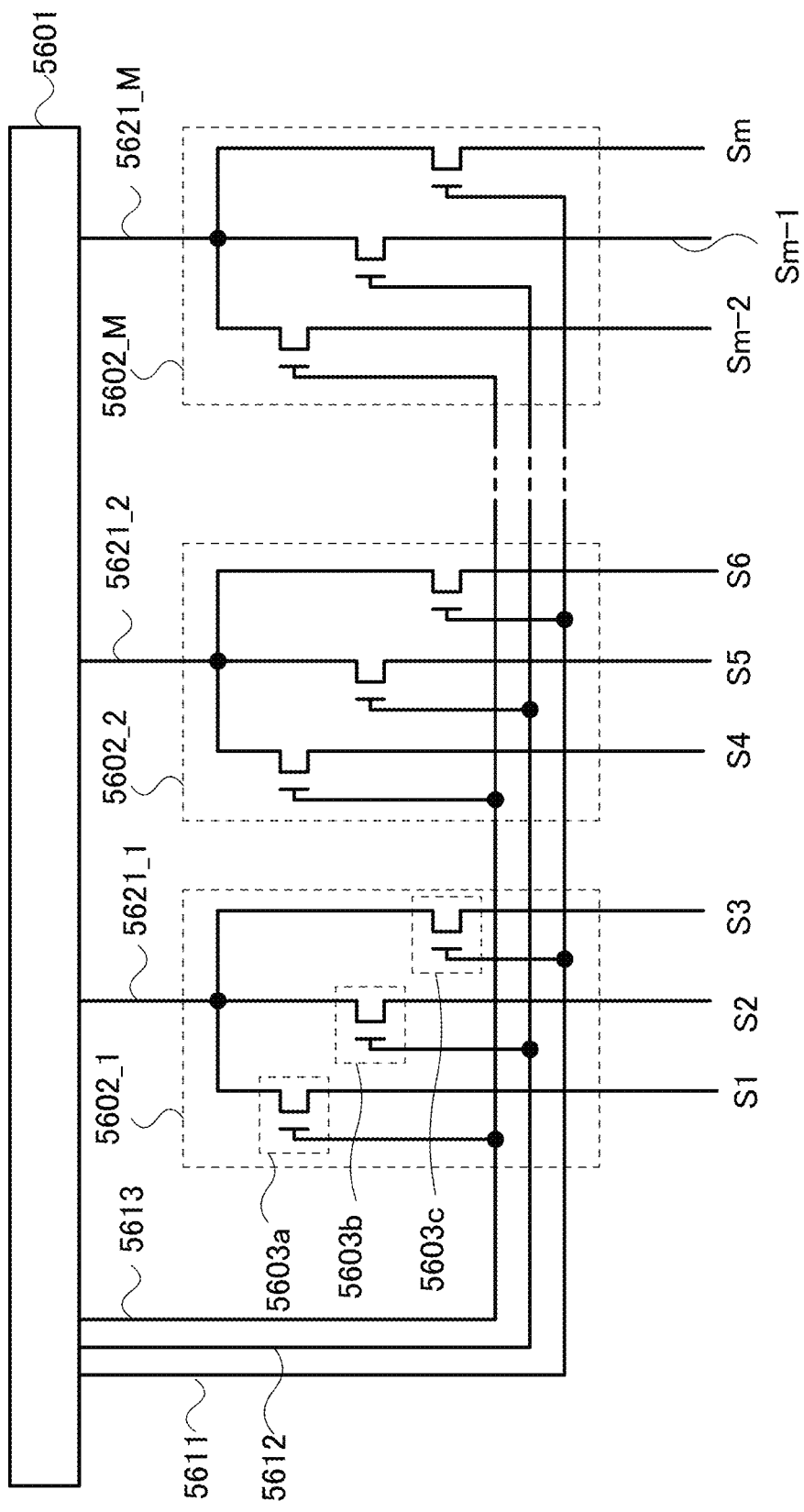
FIG. 14 shows a configuration of a signal line driver circuit according to an embodiment of the present invention.

The signal line driver circuit illustrated in FIG. 14 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the switch groups 5602_1 to 5602_M are connected to the wirings 5621_1 to 5621_M, respectively. Each of the wirings 5621_1 to 5621_M is connected to three signal lines via the first thin film transistor 5603a, the second thin film transistor 5603b, and the third thin film transistor 5603c. For example, a wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c, respectively, included in the switch group 5602_J.

A signal is input to each of the first wiring 5611, the second wiring 5612, and the third wiring 5613.

Note that the driver IC 5601 is preferably formed over a single crystal substrate. The switch groups 5602_1 to 5602_M are preferably formed over the same substrate as that for the pixel portion illustrated in any of Embodiments 1 to 4. Therefore, the driver IC 5601 and the switch groups 5602_1 to 5602_M are preferably connected through an FPC or the like.

Figure 15:
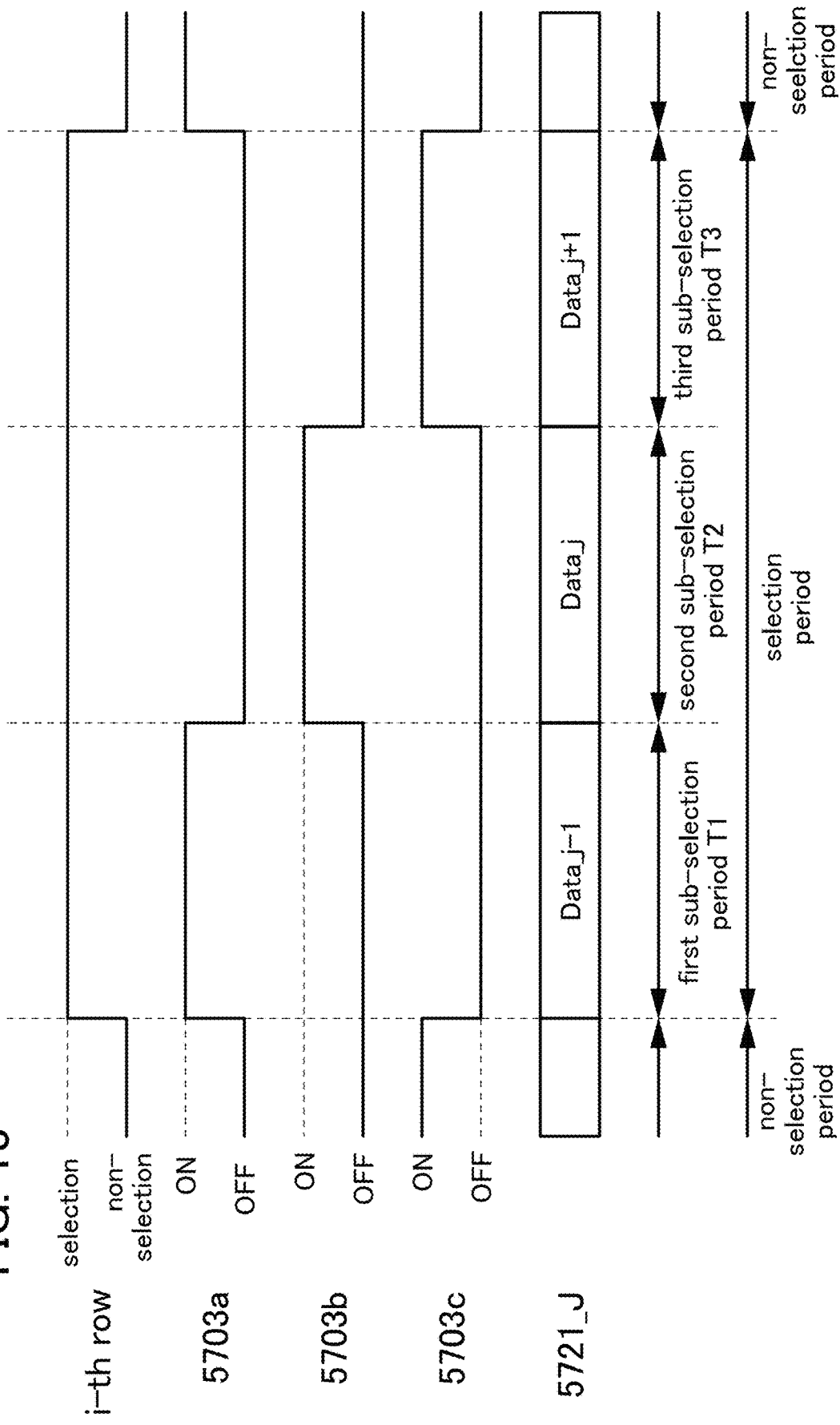
FIG. 15 is a timing chart of an operation of a signal line driver circuit according to an embodiment of the present invention.

Next, operation of the signal line driver circuit illustrated in FIG. 14 is described with reference to a timing chart in FIG. 15. The timing chart in FIG. 15 shows a case where a scanning line Gi of the i-th row is selected. A selection period of the scanning line Gi of the i-th row is divided into a first sub-selection period T1, a second sub-selection period T2, and a third sub-selection period T3. In addition, the signal line driver circuit in FIG. 14 operates as shown in FIG. 15 even when a scanning line of another row is selected.

Note that the timing chart in FIG. 15 shows a case where the wiring 5621_J in the J-th column is connected to the signal line Sj−1, the signal line Sj, and the signal line Sj+1 via the first thin film transistor 5603a, the second thin film transistor 5603b, and the third thin film transistor 5603c, respectively.

The timing chart in FIG. 15 shows timing at which the scanning line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, in the first sub-selection period T1, the second sub-selection period T2, and the third sub-selection period T3, the video signals input to the wiring 5621_J are denoted by Data_j−1, Data_j, and Data_j+1, respectively.

As shown in FIG. 15, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 14, by dividing one gate selection period into three, video signals can be input to three signal lines from one wiring 5621 in one gate selection period. Therefore, in the signal line driver circuit in FIG. 14, the number of connections of the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 14 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 14.

For example, when a video signal is input to each of three or more signal lines from one wiring in each of three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 16:
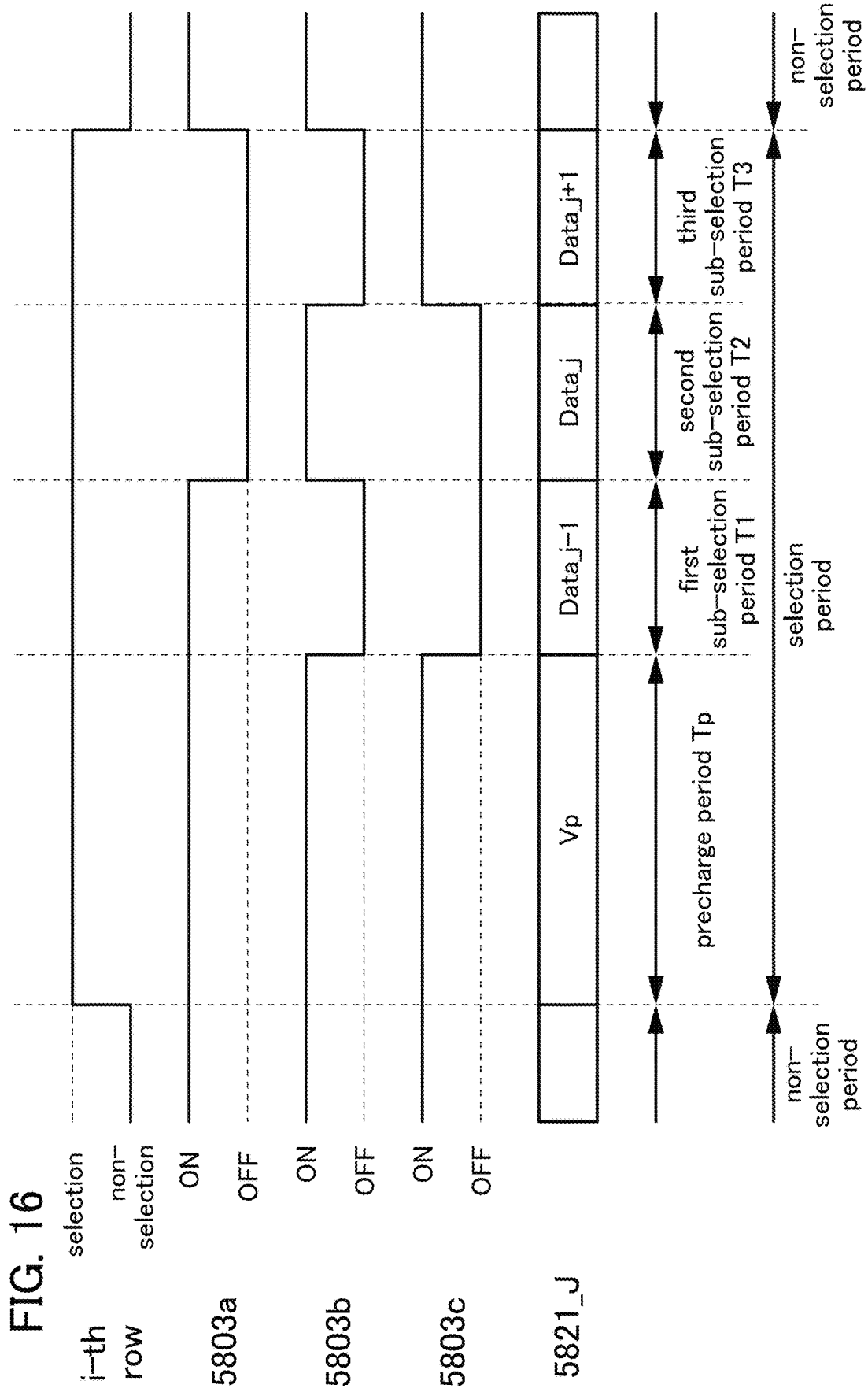
FIG. 16 is a timing chart of an operation of a signal line driver circuit according to an embodiment of the present invention.

As another example, one selection period may be divided into a precharge period Tp, the first sub-selection period T1, the second sub-selection period T2, and the third sub-selection period T3 as illustrated in a timing chart in FIG. 16. The timing chart in FIG. 16 illustrates timing at which the scanning line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 16, the first thin film transistor 5603a, the second thin film transistor 5603b, and the third thin film transistor 5603c are tuned on in the precharge period Tp. At this time, precharge voltage Vp input to the wiring 5621_J is input to the signal line Sj−1, the signal line Sj, and the signal line Sj+1 via the first thin film transistor 5603*a*, the second thin film transistor 5603*b*, and the third thin film transistor 5603*c*, respectively. In the first sub-selection period T1, the first thin film transistor 5603*a* is turned on, and the second thin film transistor 5603*b* and the third thin film transistor 5603*c* are turned off. At this time, Data_j−1 input to the wiring 5621_J is input to the signal line Sj−1 via the first thin film transistor 5603*a*. In the second sub-selection period T2, the second thin film transistor 5603*b* is turned on, and the first thin film transistor 5603*a* and the third thin film transistor 5603*c* are turned off. At this time, Data_j input to the wiring 5621_J is input to the signal line Sj via the second thin film transistor 5603*b*. In the third sub-selection period T3, the third thin film transistor 5603*c* is turned on, and the first thin film transistor 5603*a* and the second thin film transistor 5603*b* are turned off. At this time, Data_j+1 input to the wiring 5621_J is input to the signal line Sj+1 via the third thin film transistor 5603*c*.

As described above, in the signal line driver circuit in FIG. 14 to which the timing chart in FIG. 16 is applied, the video signal can be written to the pixel at high speed because the signal line can be precharged by providing a precharge selection period before a sub-selection period. Note that portions in FIG. 16 which are similar to those of FIG. 15 are denoted by common reference numerals and detailed description of the portions which are the same and portions which have similar functions is omitted.

Further, a structure of a scanning line driver circuit is described. The scanning line driver circuit includes a shift register and a buffer. In addition, the scanning line driver circuit may include a level shifter in some cases. In the scanning line driver circuit, when a clock signal (CLK) and a start pulse signal (SP) are input to the shift register, a selection signal is produced. The generated selection signal is buffered and amplified by the buffer, and the resulting signal is supplied to a corresponding scanning line. Gate electrodes of transistors in pixels of one line are connected to the scanning line. Further, since the transistors in the pixels of one line have to be turned on at the same time, a buffer which can feed a large current is used.

One mode of a shift register which is used for a part of a scanning line driver circuit is described with reference to FIG. 17 and FIG. 18.

Figure 17:
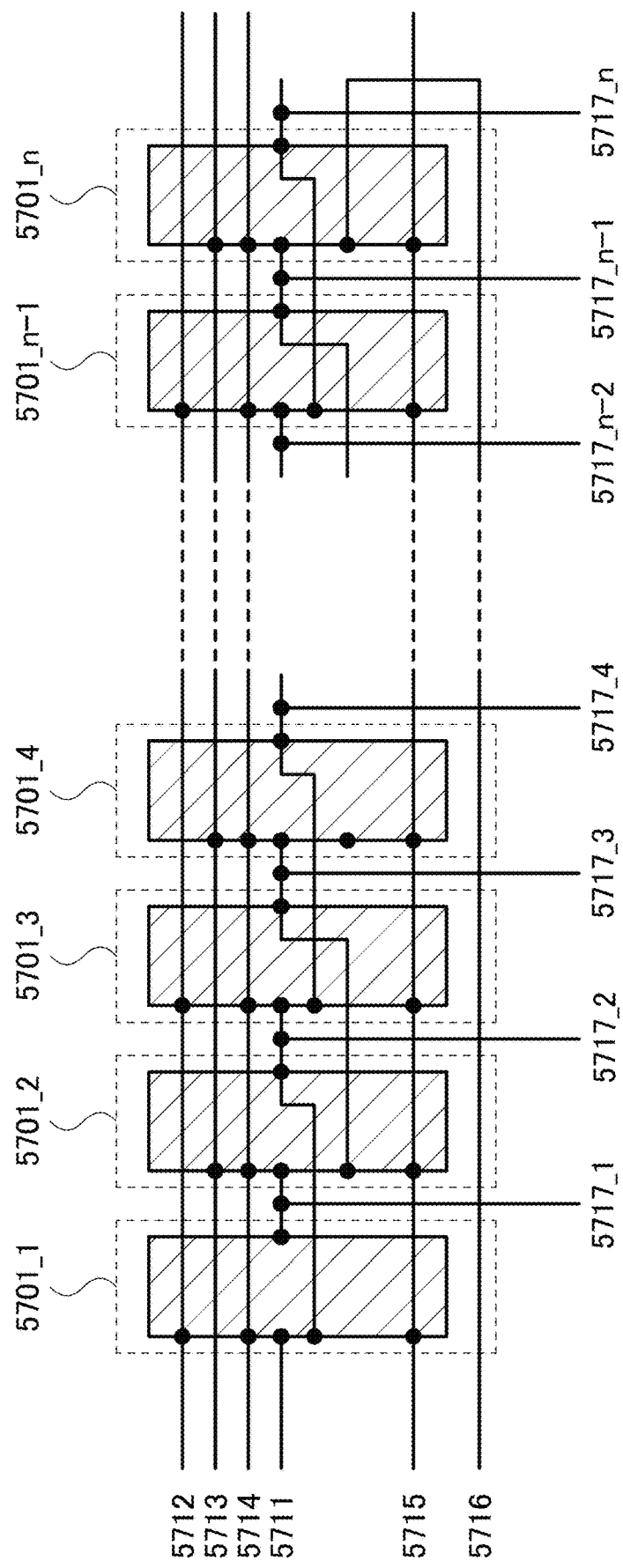
FIG. 17 shows a configuration of a shift register according to an embodiment of the present invention.

FIG. 17 illustrates a circuit configuration of the shift register. The shift register illustrated in FIG. 17 includes a plurality of flip-flops (flip-flops 5701_1 to 5701_*n*). The shift register is operated with input of a first clock signal, a second clock signal, a start pulse signal, and a reset signal.

Connection relations of the shift register in FIG. 17 are described. In the i-th stage flip-flop 5701_*i* (one of the flip-flops 5701_1 to 5701_*n*) in the shift register of FIG. 17, a first wiring 5501 illustrated in FIG. 18 is connected to a seventh wiring 5717_*i*−1; a second wiring 5502 illustrated in FIG. 18 is connected to a seventh wiring 5717_*i*+1; a third wiring 5503 illustrated in FIG. 18 is connected to a seventh wiring 5717_*i*; and a sixth wiring 5506 illustrated in FIG. 18 is connected to a fifth wiring 5715.

Figure 18:
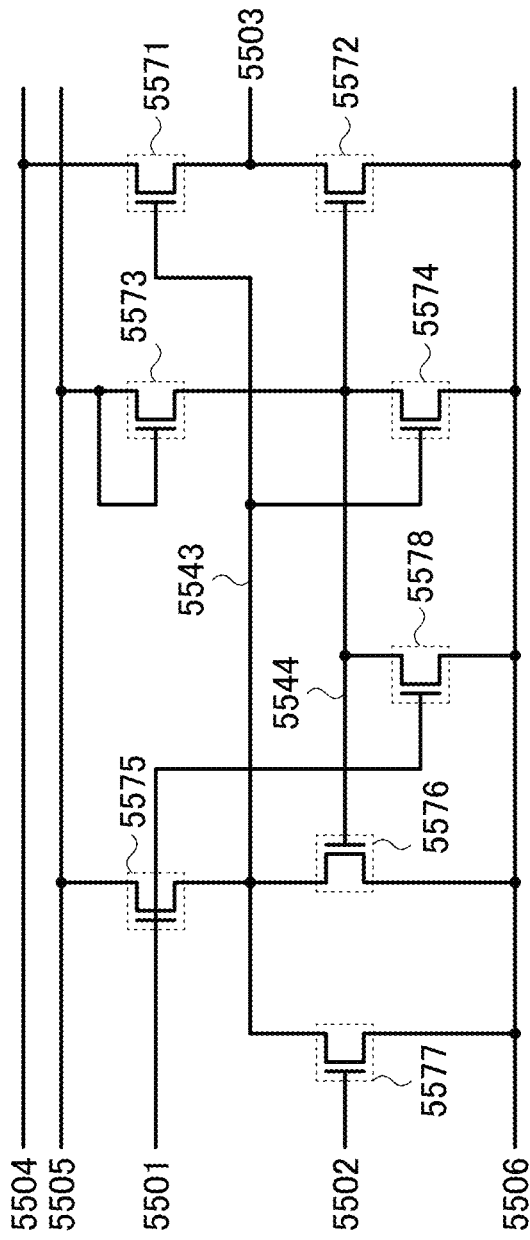
FIG. 18 shows a connection structure of a flip-flop in FIG. 17.

Further, a fourth wiring 5504 illustrated in FIG. 18 is connected to a second wiring 5712 in flip-flops of odd-numbered stages, and is connected to a third wiring 5713 in flip-flops of even-numbered stages. A fifth wiring 5505 illustrated in FIG. 18 is connected to a fourth wiring 5714.

Note that the first wiring 5501 of the first stage flip-flop 5701_1 illustrated in FIG. 18 is connected to a first wiring 5711. Moreover, the second wiring 5502 illustrated in FIG. 18 of the n-th stage flip-flop 5701_*n* is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power source line and a second power source line, respectively.

Next, FIG. 18 illustrates details of the flip-flop illustrated in FIG. 17. A flip-flop illustrated in FIG. 18 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage (Vgs) exceeds the threshold voltage (Vth).

Next, a connection structure of the flip-flop illustrated in FIG. 17 is described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that a point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is referred to as a node 5543. A point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power source line and a second power source line, respectively.

In addition, the signal line driver circuit and the scanning line driver circuit can be formed using only the n-channel TFTs described in any of Embodiments 1 to 4. The n-channel TFT described in any of Embodiments 1 to 4 has high mobility in the transistor characteristics, and thus a driving frequency of a driver circuit can be increased. In addition, in the n-channel TFT illustrated in any of Embodiments 1 to 4, since parasitic capacitance is reduced by the buffer layer formed using the metal oxide layer, the frequency characteristics (f characteristics) are high. For example, a scanning line driver circuit using the n-channel TFT described in any of Embodiments 1 to 4 can operate at high speed, and thus a frame frequency can be increased and insertion of black images and the like can be realized.

In addition, when the channel width of the transistor in the scanning line driver circuit is increased or a plurality of scanning line driver circuits are provided, for example, a higher frame frequency can be realized. When a plurality of scanning line driver circuits are provided, a scanning line driver circuit for driving even-numbered scanning lines is provided on one side and a scanning line driver circuit for driving odd-numbered scanning lines is provided on the opposite side; thus, increase in frame frequency can be realized.

Figure 13B:
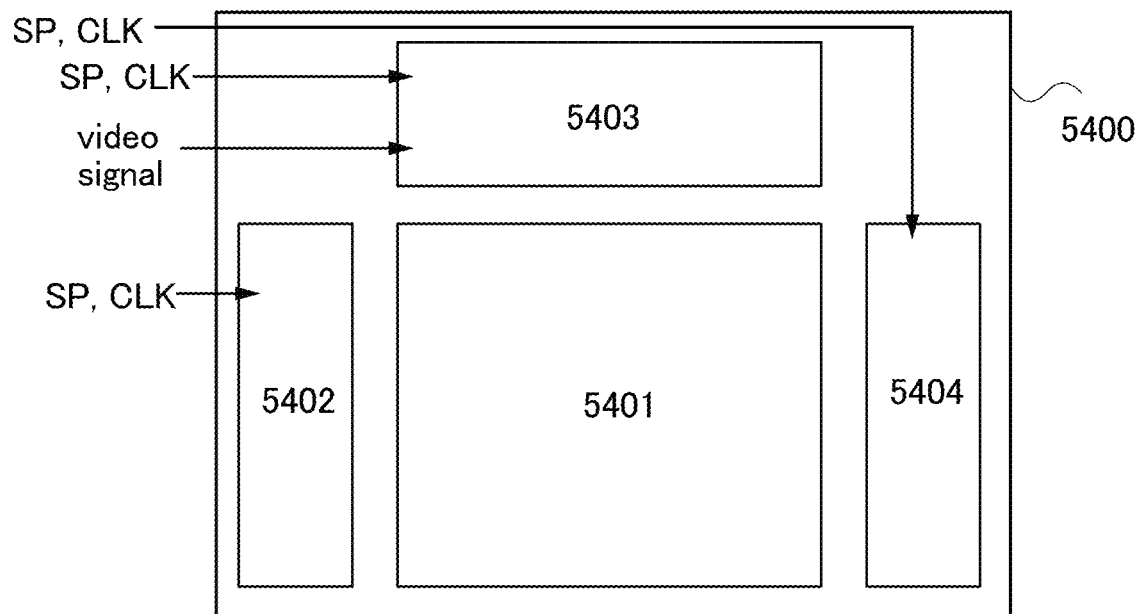

Further, when an active matrix light-emitting display device is manufactured, a plurality of transistors are arranged in at least one pixel, and thus a plurality of scanning line driver circuits are preferably arranged. FIG. 13B is a block diagram illustrating an example of an active matrix light-emitting display device.

The display device illustrated in FIG. 13B includes, over a substrate 5400, a pixel portion 5401 having a plurality of pixels each provided with a display element, a first scanning line driver circuit 5402 and a second scanning line driver circuit 5404 that select a pixel, and a signal line driver circuit 5403 that controls input of a video signal to the selected pixel.

When the video signal input to a pixel of the display device illustrated in FIG. 13B is a digital signal, a pixel is in a light-emitting state or a non-light-emitting state by switching of on/off of a transistor. Thus, gray scale can be displayed using an area ratio grayscale method or a time ratio grayscale method. An area ratio grayscale method refers to a driving method by which one pixel is divided into a plurality of sub-pixels and each sub-pixel is driven independently based on a video signal so that grayscale is displayed. Further, a time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than liquid-crystal elements. Specifically, in the case of displaying with a time gray scale method, one frame period is divided into a plurality of sub-frame periods. Then, in accordance with video signals, the light-emitting element in the pixel is set in a light-emitting state or a non-light-emitting state in each sub-frame period. By dividing one frame into a plurality of sub-frames, the total length of time, in which pixels actually emit light in one frame period, can be controlled with video signals so that gray scales are displayed.

In the light-emitting device illustrated in FIG. 13B, in the case where two TFTs, a switching TFT and a current control TFT, are arranged in one pixel, the first scanning line driver circuit 5402 generates a signal which is input to a first scanning line functioning as a gate wiring of the switching TFT, and the second scanning line driver circuit 5404 generates a signal which is input to a second scanning line functioning as a gate wiring of the current control TFT; however, one scanning line driver circuit may generate both the signal which is input to the first scanning line and the signal which is input to the second scanning line. In addition, for example, there is a possibility that a plurality of the first scanning lines used for controlling the operation of the switching element are provided in each pixel, depending on the number of transistors included in the switching element. In that case, one scanning line driver circuit may generate all signals that are input to the plurality of first scanning lines, or a plurality of scanning line driver circuits may generate signals that are input to the plurality of first scanning lines.

In addition, also in the light-emitting device, a part of a driver circuit that can include n-channel TFTs among driver circuits can be formed over the same substrate as that for the thin film transistors of the pixel portion. Alternatively, the signal line driver circuit and the scanning line driver circuit can be formed using only the n-channel TFTs described in any of Embodiment 1 to 4.

Moreover, the above-described driver circuit can be used for electronic paper that drives electronic ink using an element electrically connected to a switching element, without being limited to applications to a liquid crystal display device or a light-emitting device. The electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing a first particle which is positively charged and a second particle which is negatively charged. By applying an electric field to the microcapsules, the particles in the microcapsules are moved in opposite directions to each other and only the color of the particles concentrated on one side is exhibited. Note that the first particle and the second particle each contain pigment and do not move without an electric field. Moreover, the colors of the first particle and the second particle are different from each other (including colorless or achroma).

In this way, an electrophoretic display is a display that utilizes a so-called dielectrophoretic effect by which a substance that has a high dielectric constant moves to a high-electric field region. An electrophoretic display does not need a polarizer and a counter substrate, which are required in a liquid crystal display device, and both the thickness and weight of the electrophoretic display device can be a half of those of a liquid crystal display device.

A solution obtained by dispersing the aforementioned microcapsules throughout a solvent is referred to as electronic ink. This electronic ink can be printed on a surface of glass, plastic, cloth, paper, or the like. Furthermore, by use of a color filter or particles that have a pigment, color display is possible, as well.

In addition, if a plurality of the aforementioned microcapsules are arranged as appropriate over an active matrix substrate so as to be interposed between two electrodes, an active matrix display device can be completed, and display can be performed by application of an electric field to the microcapsules.

Note that the first particle and the second particle in the microcapsule may each be formed of a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Embodiment 7

A thin film transistor according to an embodiment of the present invention is manufactured, and a semiconductor device having a display function (also referred to as a display device) can be manufactured using the thin film transistor for a pixel portion and further for a driver circuit. Further, a part or whole of a driver circuit can be formed over the same substrate as that for a pixel portion, using the thin film transistor according to an embodiment of the present invention, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Further, a display medium whose contrast is changed by an electric effect, such as electronic ink, can be used.

In addition, the display device includes a panel in which the display element is sealed, and a module in which an IC including a controller or the like is mounted on the panel. An embodiment of the present invention relates to one mode of an element substrate before the display element is completed in a manufacturing process of the display device, and the element substrate is provided with a means for supplying current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

In this embodiment, a liquid crystal display device will be described as an example of a semiconductor device according to an embodiment of the present invention.

Figure 19A:
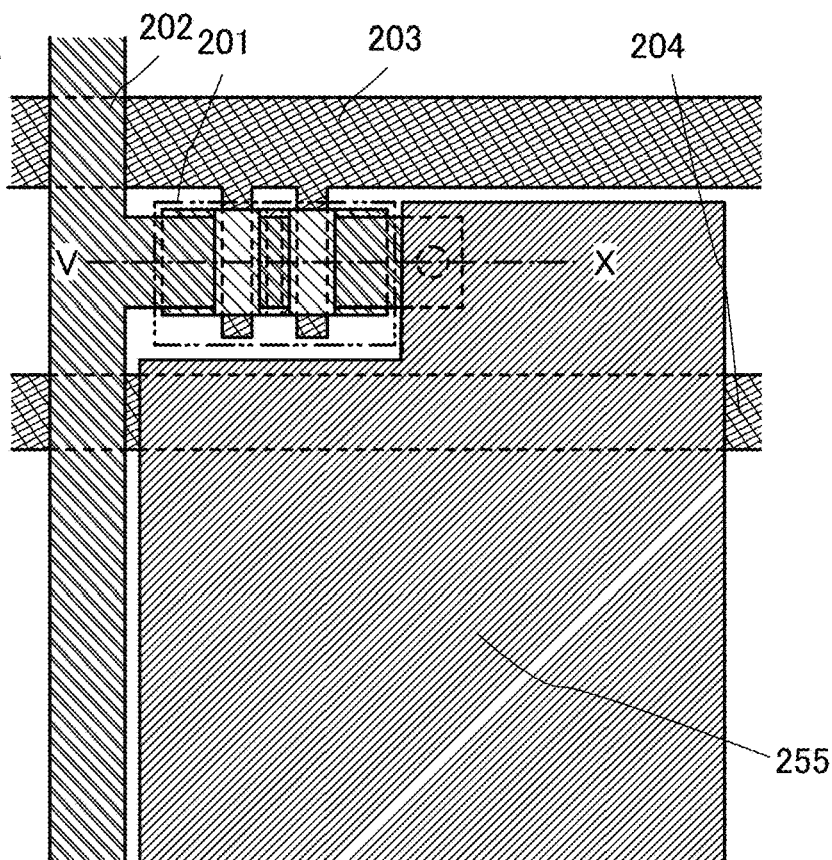
FIGS. 19A and 19B illustrate an active matrix liquid crystal display device according to an embodiment of the present invention.
Figure 19B:
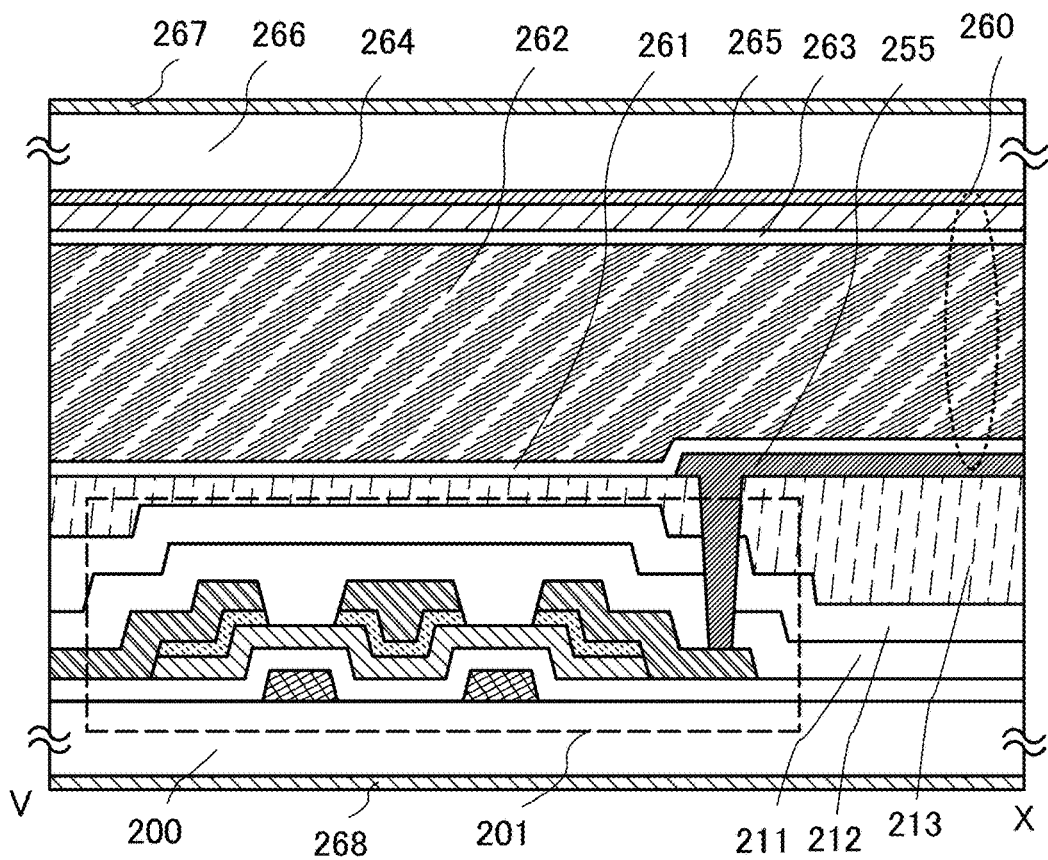

FIGS. 19A and 19B illustrate an active matrix liquid crystal display device to which an embodiment of the present invention is applied. FIG. 19A is a plan view of the liquid crystal display device. FIG. 19B is a cross-sectional view along line V-X of FIG. 19A. A thin film transistor 201 used in the semiconductor device can be manufactured in a manner similar to that of the thin film transistor described in Embodiment 2 and is a highly reliable thin film transistor including an IGZO semiconductor layer and an n-type metal oxide layer. In addition, any of the thin film transistors described in Embodiments 1, 3, and 4 can also be used as the thin film transistor 201 of this embodiment.

The liquid crystal display device of this embodiment illustrated in FIG. 19A includes a source wiring layer 202, the inverted staggered thin film transistor 201 with a multi-gate structure, a gate wiring layer 203, and a capacitor wiring layer 204.

Further, in FIG. 19B, in the liquid crystal display device of this embodiment, a substrate 200 which is provided with the thin film transistor 201 with a multi-gate structure, an insulating layer 211 functioning as a protective film, an insulating layer 212 functioning as a protective film, an insulating layer 213 functioning as a planarization film, an electrode layer 255 used for a display element, an insulating layer 261 functioning as an alignment film, and a polarizing plate 268; and a substrate 266 which is provided with an insulating layer 263 functioning as an alignment film, an electrode layer 265 used for a display element, a coloring layer 264 functioning as a color filter, and a polarizing plate 267 face to each other with a liquid crystal layer 262 interposed therebetween. Thus, a liquid crystal display element 260 is formed.

Here, the insulating layers 211 and 212 functioning as protective films or the insulating layer 213 functioning as a planarization film covers the thin film transistor obtained in Embodiment 2 so that unevenness of the surface of the thin film transistor 201 is reduced and reliability of the thin film transistor 201 is improved. Note that the protective film is provided to prevent entry of a contaminant impurity such as an organic substance, a metal substance, or moisture contained in air and is preferably a dense film. The protective film can be formed using a single layer or stacked layers of any of a silicon oxide film, a silicon nitride film, a silicon oxynitride film, and a silicon nitride oxide film by a CVD method or the like. Alternatively, as the protective film, a silicon oxide film can be formed by a plasma CVD method with the use of an organosilane gas and oxygen as a process gas.

Examples of organosilane include tetraethoxysilane (TEOS: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), and the like.

The insulating layer 211 is formed as a first layer of the protective film. The insulating layer 211 has an effect to prevent a hillock of an aluminum film. Here, as the insulating layer 211, a silicon oxide film is formed by a plasma CVD method. For a process gas for forming the silicon oxide film, TEOS and $O_2$ are used. The flow rates of TEOS and $O_2$ are 15 (sccm) and 750 (sccm), respectively. The substrate temperature at the deposition step is 300° C.

In addition, the insulating layer 212 is formed as a second layer of the protective film. Here, as the insulating layer 212, a silicon nitride film is formed by a plasma CVD method. For a process gas for forming the silicon nitride film, $SiH_4$, $N_2$, $NH_3$, and $H_2$ are used. When the silicon nitride film is used as one layer in the protective film, mobile ions of sodium or the like can be prevented from entering the semiconductor region so that variation in electric properties of a TFT can be suppressed.

In addition, after forming the protective film, the IGZO semiconductor layer may be annealed (at 300° C. to 400° C.).

In addition, the insulating layer 213 is formed as an insulating film functioning as a planarization film. An organic material having heat resistance, such as polyimide, acrylic, benzocyclobutene, polyamide, or epoxy can be used for the insulating layer 213. In addition to such organic materials, it is also possible to use a low-dielectric constant material (a low-k material), a siloxane-based resin, PSG (phosphosilicate glass), BPSG (borophosphosilicate glass), or the like. A siloxane-based resin may include, as a substituent, at least one of fluorine, an alkyl group, and an aryl group, as well as hydrogen. Note that the insulating layer 213 may be formed by stacking a plurality of insulating films formed of these materials.

Note that a siloxane-based resin is a resin formed from a siloxane-based material as a starting material and having the bond of Si—O—Si. The siloxane-based resin may include, as a substituent, at least one of fluorine, an alkyl group, and aromatic hydrocarbon, as well as hydrogen.

For the formation of the insulating layer 213, any of the following can be employed depending on the material of the insulating layer 213: a CVD method, a sputtering method, an SOG method, spin coating, dipping, spray coating, a droplet discharge method (e.g., an ink-jet method, screen printing, offset printing, or the like), a doctor knife, a roll coater, a curtain coater, a knife coater, and the like. When the insulating layer 213 is formed using a material solution, the IGZO semiconductor layer may be annealed (at 300° C. to 400° C.) at the same time as a baking step of the insulating layer 213. The baking step of the insulating layer 213 serves also as the annealing step of the IGZO semiconductor layer, and thereby a display device can be manufactured efficiently.

Although FIGS. 19A and 19B illustrate an example of a transmissive liquid crystal display device, an embodiment of the present invention can also be applied to a reflective liquid crystal display device and a semi-transmissive liquid crystal display device.

While FIGS. 19A and 19B illustrate an example of the liquid crystal display device in which the polarizing plate 267 is provided in a position outer than the substrate 266 (on the viewer side) and the coloring layer 264 and the electrode layer 265 used for a display element are provided in a position inner than the substrate 266, the polarizing plate 267 may also be provided in an inner position than the substrate 266. The stacked structure of the polarizing plate and the coloring layer is not limited to that illustrated in FIG. 19B and may be set as appropriate depending on materials of the polarizing plate and the coloring layer or conditions of manufacturing steps. Further, a light-blocking film functioning as a black matrix may be provided.

The electrode layers 255 and 265 each functioning as a pixel electrode layer can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

In addition, a conductive composition containing a conductive high molecule (also referred to as a conductive polymer) can be used for forming the electrode layers 255 and 265. The pixel electrode formed of the conductive composition has preferably a sheet resistance of less than or equal to 10000 Ω/square and a transmittance of greater than or equal to 70% at a wavelength of 550 nm. Further, the resistivity of the conductive high molecule contained in the conductive composition is preferably less than or equal to 0.1 Ω·cm.

As the conductive high molecule, a so-called it-electron conjugated conductive high molecule can be used. As examples thereof, polyaniline or a derivative thereof, polypyrrole or a derivative thereof, polythiophene or a derivative thereof, a copolymer of two or more kinds of them, and the like can be given.

As a liquid crystal material of the liquid crystal layer 262, a lyotropic liquid crystal, a thermotropic liquid crystal, a low molecular liquid crystal, a high molecular liquid crystal, a discotic liquid crystal, a ferroelectric liquid crystal, an anti-ferroelectric liquid crystal, or the like is used. The above liquid crystal materials exhibit a nematic phase, a cholesteric phase, a cholesteric blue phase, a smectic phase, a smectic blue phase, a cubic phase, a smectic D phase, a chiral nematic phase, an isotropic phase, or the like depending on conditions. A cholesteric blue phase and a smectic blue phase are seen in a liquid crystal material having a cholesteric phase or a smectic phase with a relatively short helical pitch of less than or equal to 500 nm. The alignment of the liquid crystal material has a double twist structure. Having the order of less than or equal to an optical wavelength, the liquid crystal material is transparent, and optical modulation action is generated through a change in alignment order by voltage application. A blue phase is optically isotropic and thus has no viewing angle dependence. Thus, an alignment film is not necessarily formed; therefore, display image quality can be improved and cost can be reduced.

Through this process, a highly reliable liquid crystal display device can be manufactured as a semiconductor device.

This embodiment can be combined with the structure described in other embodiments, as appropriate.

Embodiment 8

In this embodiment, an example of electronic paper will be described as a semiconductor device according to an embodiment of the present invention.

Figure 26:
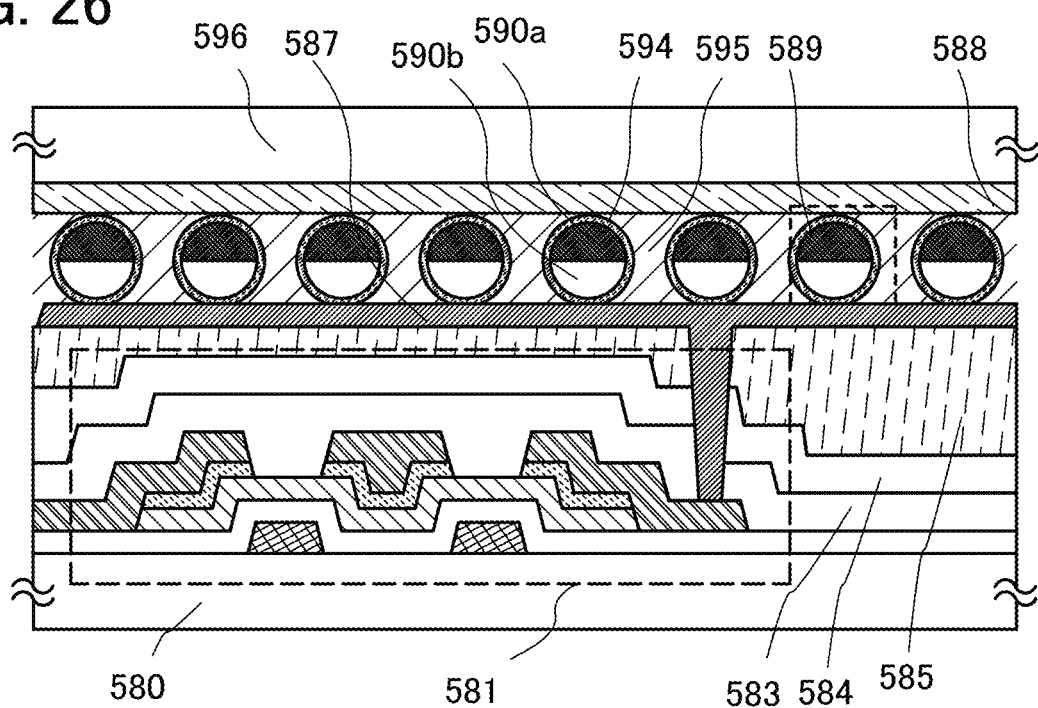
FIG. 26 illustrates active matrix electronic paper according to an embodiment of the present invention.
Figure 27:
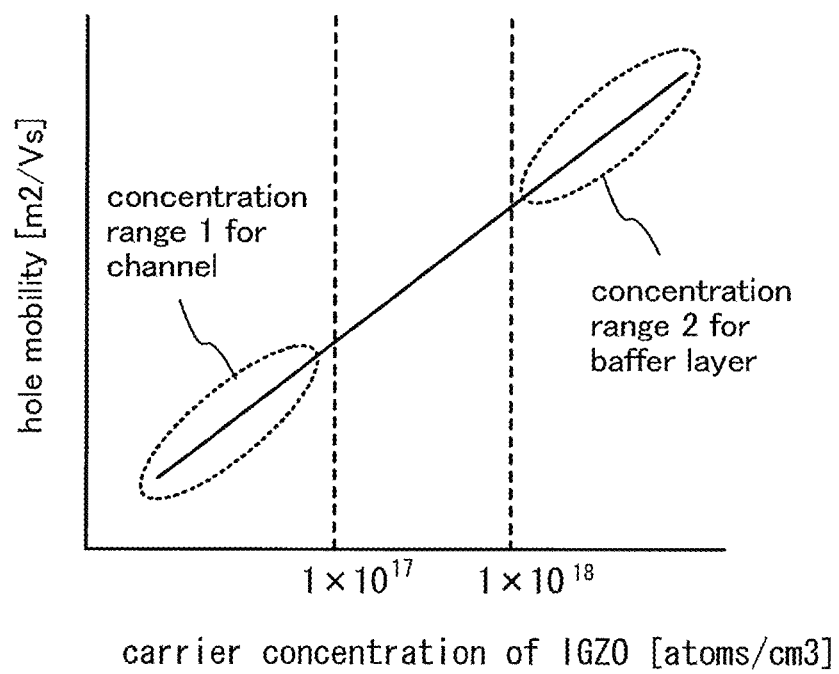
FIG. 27 is a graph showing a relation between carrier concentration and hole mobility of an oxide semiconductor film containing In, Ga, and Zn.

FIG. 26 illustrates active matrix electronic paper as an example of a semiconductor device to which an embodiment of the present invention is applied. A thin film transistor 581 used for the semiconductor device can be manufactured in a manner similar to that of the thin film transistor described in Embodiment 2 and is a highly reliable thin film transistor including an IGZO semiconductor layer and an n-type metal oxide layer. Any of the thin film transistors described in Embodiments 1, 3, and 4 can also be used as the thin film transistor 581 of this embodiment.

The electronic paper in FIG. 26 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 over a substrate 580 is an inverted staggered thin film transistor with a multi-gate structure, and a source electrode layer or a drain electrode layer thereof is in contact with a first electrode layer 587 at an opening formed in an insulating layer 585, a layer 583, and a layer 584, whereby the thin film transistor 581 is electrically connected to the first electrode layer 587. Between the first electrode layer 587 and a second electrode layer 588 provided for a substrate 596, spherical particles 589 each having a black region 590*a*, a white region 590*b*, and a cavity 594 around the regions which is filled with liquid are provided. A space around the spherical particles 589 is filled with a filler 595 such as a resin (FIG. 26).

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides, so that white or black can be displayed. A display element using this principle is an electrophoretic display element and is called electronic paper in general. The electrophoretic display element has higher reflectivity than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper can be manufactured as a semiconductor device.

This embodiment can be combined with the structure described in other embodiments, as appropriate.

Embodiment 9

In this embodiment, an example of a light-emitting display device will be described as a semiconductor device according an embodiment of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 22A:
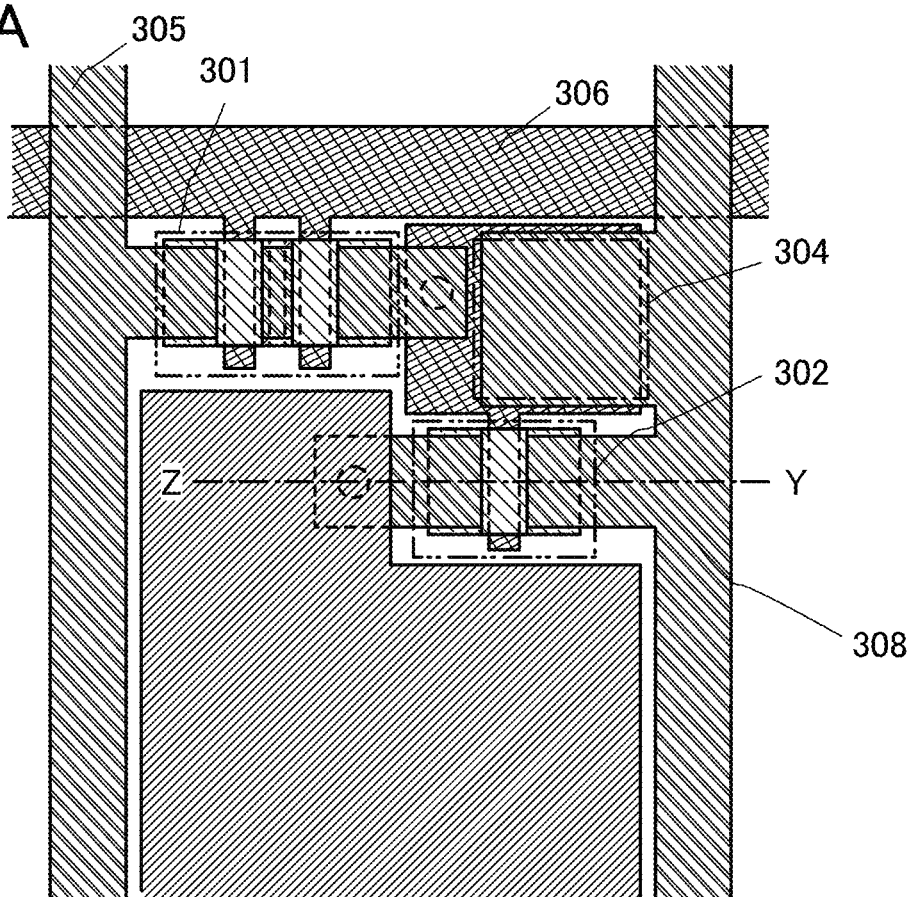
FIGS. 22A and 22B illustrate an active matrix light-emitting display device according to an embodiment of the present invention.
Figure 22B:
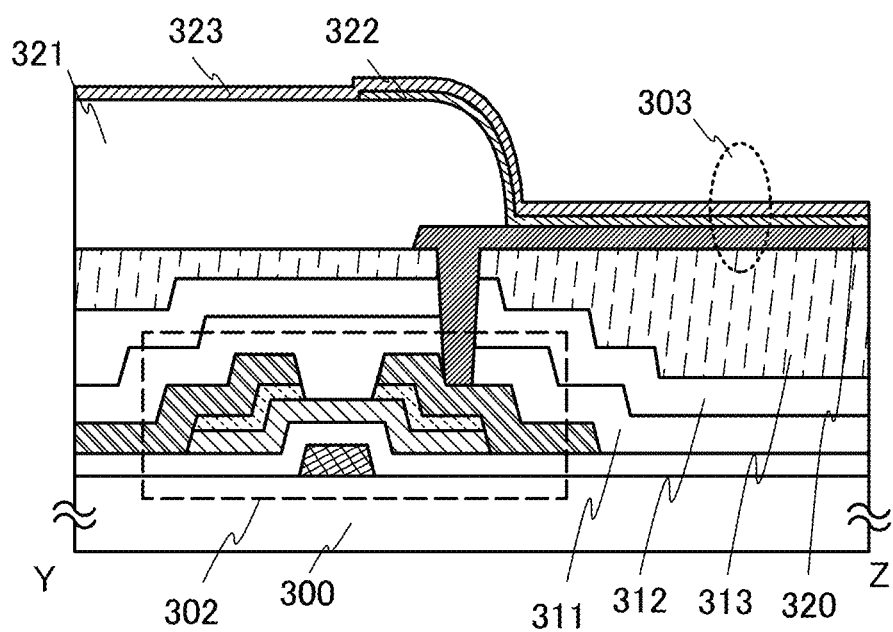
Figure 23:
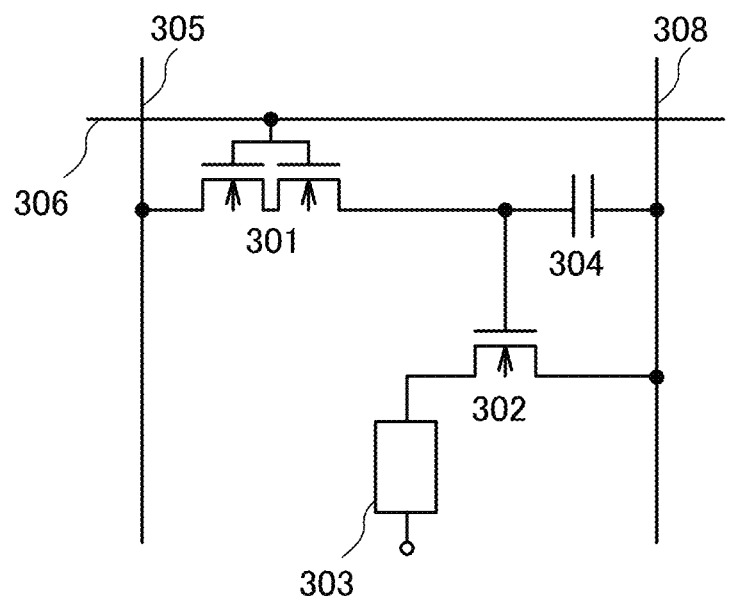
FIG. 23 shows an equivalent circuit of a light-emitting display device illustrated in FIGS. 22A and 22B.

FIGS. 22A and 22B illustrate an active matrix light-emitting display device as an example of a semiconductor device to which an embodiment of the present invention is applied. FIG. 22A is a plan view of the light-emitting display device, and FIG. 22B is a cross-sectional view along line Y-Z of FIG. 22A. FIG. 23 shows an equivalent circuit of the light-emitting display device illustrated in FIGS. 22A and 22B.

Thin film transistors 301 and 302 used for a semiconductor device can be manufactured in a manner similar to that of any of the thin film transistors described in Embodiments 1 and 2 and are highly reliable thin film transistors each including an IGZO semiconductor layer and a buffer layer formed using an n-type metal oxide layer. The thin film transistor described in Embodiments 3 or 4 can also be used as the thin film transistors 301 and 302 of this embodiment.

The light-emitting display device of this embodiment illustrated in FIG. 22A and FIG. 23 includes the thin film transistors 301 with a multi-gate structure, the thin film transistor 302, a light-emitting element 303, a capacitor element 304, a source wiring layer 305, a gate wiring layer 306, and a power source line 308. The thin film transistors 301 and 302 are n-channel thin film transistors.

In FIG. 22B, the light-emitting display device of this embodiment includes a substrate 300, the thin film transistor 302; an insulating layer 311; an insulating layer 312, an insulating layer 313; a partition wall 321; and a first electrode layer 320, an electroluminescent layer 322, and a second electrode layer 323 which are used for the light-emitting element 303.

The insulating layer 313 is preferably formed using an organic resin such as acrylic, polyimide, or polyamide or using siloxane.

Since the thin film transistor 302 in the pixel is n-type in this embodiment, the first electrode layer 320 which is a pixel electrode layer is desirably used as a cathode. Specifically, for the cathode, a material with a low work function such as Ca, Al, CaF, MgAg, or AlLi can be used.

The partition wall 321 is formed using an organic resin film, an inorganic insulating film, or organic polysiloxane. It is particularly preferable that the partition wall 321 be formed using a photosensitive material and an opening be formed over the first electrode layer 320 so that a sidewall of the opening is formed as an inclined surface with continuous curvature.

The electroluminescent layer 322 may be formed using a single layer or a plurality of layers stacked.

The second electrode layer 323 used as an anode is formed to cover the electroluminescent layer 322. The second electrode layer 323 can be formed using a light-transmitting conductive film using any of the light-transmitting conductive materials listed in Embodiment 7 for the pixel electrode layer. The second electrode layer 323 may also be formed using a titanium nitride film or a titanium film instead of the above-described light-transmitting conductive film. The light-emitting element 303 is formed by overlapping of the first electrode layer 320, the electroluminescent layer 322, and the second electrode layer 323. After that, a protective film may be formed over the second electrode layer 323 and the partition wall 321 in order to prevent entry of oxygen, hydrogen, moisture, carbon dioxide, or the like into the light-emitting element 303. As the protective film, a silicon nitride film, a silicon nitride oxide film, a DLC film, or the like can be formed.

Further, in a practical case, it is preferable that a display device completed to the state illustrated in FIG. 22B be packaged (sealed) with a protective film (such as a laminate film or an ultraviolet curable resin film) or a cover material with high air-tightness and little degasification so that the display device is not exposed to the outside air.

Next, structures of the light-emitting element will be described with reference to FIGS. 24A to 24C. A cross-sectional structure of a pixel will be described by taking an n-channel driving TFT as an example. Driving TFTs 7001, 7011, and 7021 used for semiconductor devices illustrated in FIGS. 24A to 24C can be manufactured in a manner similar to that of the thin film transistor described in Embodiment 1 and are highly reliable thin film transistors each including an IGZO semiconductor layer and an n-type metal oxide layer. Alternatively, any of the thin film transistors described in Embodiments 2 to 4 can be employed as the driving TFTs 7001, 7011, and 7021.

In order to extract light emitted from the light-emitting element, at least one of the anode and the cathode is required to be transparent. A thin film transistor and a light-emitting element are formed over a substrate. A light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side. The pixel structure according to an embodiment of the present invention can be applied to a light-emitting element having any of these emission structures.

A light-emitting element having a top emission structure will be described with reference to FIG. 24A.

Figure 24A:
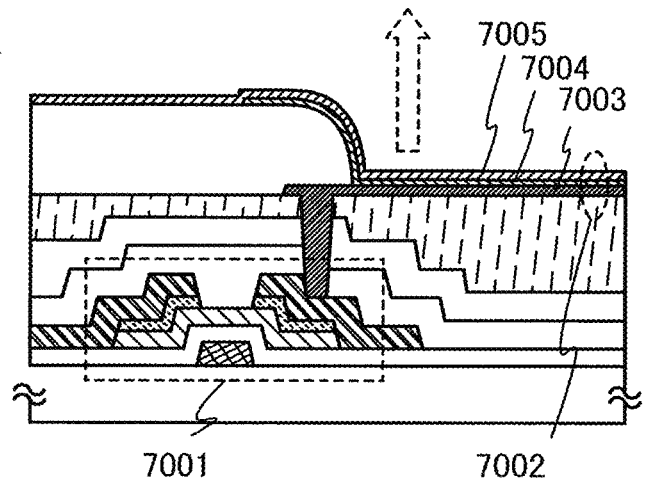
FIGS. 24A to 24C each illustrate a structure of a light-emitting element according to an embodiment of the present invention.

FIG. 24A is a cross-sectional view of a pixel in the case where the driving TFT 7001 is of an n-type and light is emitted from a light-emitting element 7002 to an anode 7005 side. In FIG. 24A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, CaF, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 24A, light is emitted from the light-emitting element 7002 to the anode 7005 side as indicated by an arrow.

Next, a light-emitting element having a bottom emission structure will be described with reference to FIG. 24B. FIG. 24B is a cross-sectional view of a pixel in the case where the driving TFT 7011 is of an n-type and light is emitted from a light-emitting element 7012 to a cathode 7013 side. In FIG. 24B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, various materials can be used as in the case of FIG. 24A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. In a manner similar to the case of FIG. 24A, the light-emitting layer 7014 may be formed using either a single layer or a plurality of layers stacked. The anode 7015 is not required to transmit light, but can be formed using a light-transmitting conductive material as in the case of FIG. 24A. As the light-blocking film 7016, a metal or the like that reflects light can be used for example; however, it is not limited to a metal film. For example, a resin or the like to which black pigments are added can also be used.

The light-emitting element 7012 corresponds to a region where the cathode 7013 and the anode 7015 sandwich the light-emitting layer 7014. In the case of the pixel illustrated in FIG. 24B, light is emitted from the light-emitting element 7012 to the cathode 7013 side as indicated by an arrow.

Next, a light-emitting element having a dual emission structure will be described with reference to FIG. 24C. In FIG. 24C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 24A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 24A, the light-emitting layer 7024 may be formed using either a single layer or a plurality of layers stacked. The anode 7025 can be formed using a light-transmitting conductive material as in the case of FIG. 24A.

The light-emitting element 7022 corresponds to a region where the cathode 7023, the light-emitting layer 7024, and the anode 7025 overlap with one another. In the case of the pixel illustrated in FIG. 24C, light is emitted from the light-emitting element 7022 to both the anode 7025 side and the cathode 7023 side as indicated by arrows.

Note that, although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a current control TFT is connected between the driving TFT and the light-emitting element.

Figure 24B:
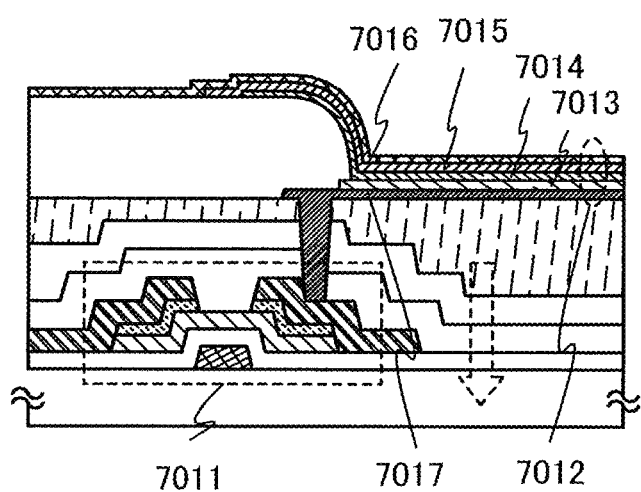
Figure 24C:
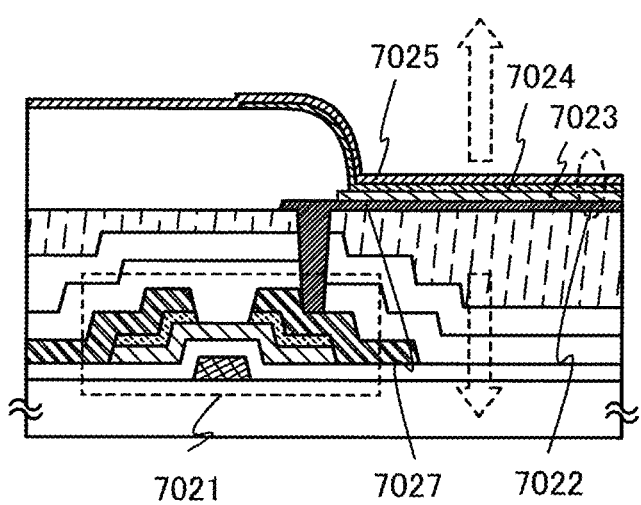

A semiconductor device described in this embodiment is not limited to the structures illustrated in FIGS. 24A to 24C and can be modified in various ways based on the spirit of techniques according to the present invention.

Through this process, a highly reliable light-emitting display device can be manufactured as a semiconductor device.

This embodiment can be combined with the structure described in other embodiments, as appropriate.

Embodiment 10

Next, a structure of a display panel, which is an embodiment of the semiconductor device of the present invention, will be described below. In this embodiment, a liquid crystal display panel (also referred to as a liquid crystal panel), which is one embodiment of a liquid crystal display device having a liquid crystal element as a display element, and a light-emitting display panel (also referred to as a light-emitting panel), which is one embodiment of a semiconductor device having a light-emitting element as a display element, will be described.

Figure 25A:
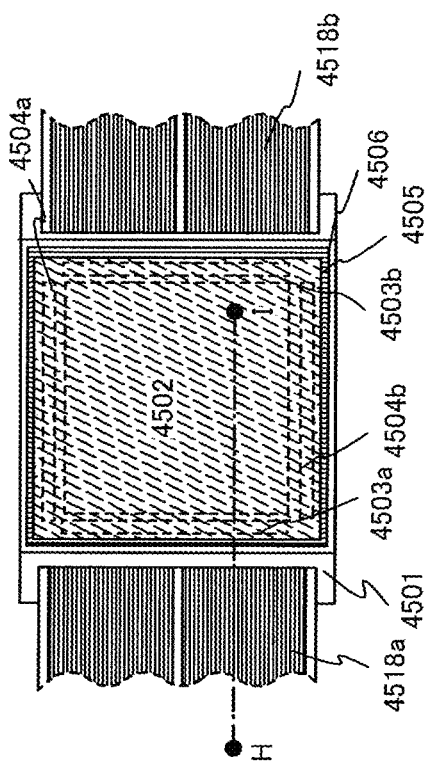
FIGS. 25A and 25B illustrate a light-emitting display panel according to an embodiment of the present invention.
Figure 25B:
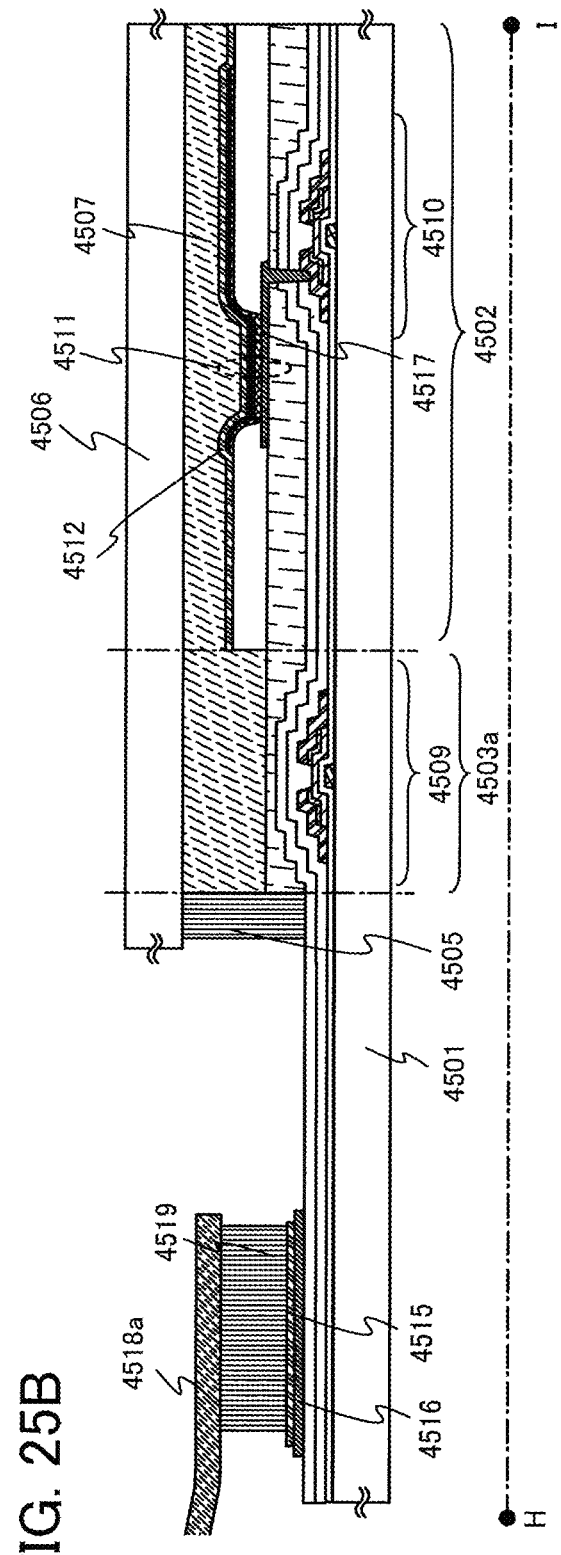

The appearance and a cross section of a light-emitting display panel, which is one embodiment of the semiconductor device of the present invention, will be described with reference to FIGS. 25A and 25B. FIG. 25A is a top view of a panel in which a highly reliable thin film transistor including an IGZO semiconductor layer and an n-type metal oxide layer and a light-emitting element are sealed between a first substrate and a second substrate with a sealant. FIG. 25B is a cross-sectional view along line H-I of FIG. 25A.

A sealant 4505 is provided so as to surround a pixel portion 4502, signal line driver circuits 4503a and 4503b, and scanning line driver circuits 4504a and 4504b which are provided over a first substrate 4501. In addition, a second substrate 4506 is provided over the pixel portion 4502, the signal line driver circuits 4503a and 4503b, and the scanning line driver circuits 4504a and 4504b. Accordingly, the pixel portion 4502, the signal line driver circuits 4503a and 4503b, and the scanning line driver circuits 4504a and 4504b are sealed together with a filler 4507, by the first substrate 4501, the sealant 4505, and the second substrate 4506.

The pixel portion 4502, the signal line driver circuits 4503a and 4503b, and the scanning line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as examples in FIG. 25B.

Each of the thin film transistors 4509 and 4510 corresponds to a thin film transistor including an IGZO semiconductor layer and an n-type metal oxide layer, and any of the thin film transistors described in Embodiments 1 to 4 can be applied thereto. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is not limited to that described in this embodiment. The structure of the light-emitting element 4511 can be changed as appropriate depending on the direction in which light is extracted from the light-emitting element 4511, or the like.

In addition, a variety of signals and a potential are supplied to the signal line driver circuits 4503a and 4503b, the scanning line driver circuits 4504a and 4504b, or the pixel portion 4502 from FPCs 4518a and 4518b.

In this embodiment, a connection terminal 4515 is formed with the same conductive film as that for forming a second electrode layer 4512, and a wiring 4516 is formed with the same conductive film as that for forming the first electrode layer 4517 included in the light-emitting element 4511.

The connection terminal 4515 is electrically connected to a terminal included in the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or polycrystalline semiconductor film over a substrate separately prepared. In addition, only the signal line driver circuits or part thereof, or the scanning line driver circuits or part thereof may be separately formed and mounted. This embodiment is not limited to the structure illustrated in FIGS. 25A and 25B.

Next, the appearance and a cross section of a liquid crystal display panel, which is one embodiment of the semiconductor device of the present invention, will be described with reference to FIGS. 20A to 20C. FIGS. 20A and 20B are top views of a panel in which highly reliable thin film transistors 4010 and 4011 each including an IGZO semiconductor layer and an n-type metal oxide layer, and a liquid crystal element 4013 are sealed between a first substrate 4001 and a second substrate 4006 with a sealant 4005. FIG. 20C is a cross-sectional view along line M-N of FIGS. 20A and 20B.

The sealant 4005 is provided so as to surround a pixel portion 4002 and a scanning line driver circuit 4004 which are provided over the first substrate 4001. The second substrate 4006 is provided over the pixel portion 4002 and the scanning line driver circuit 4004. Therefore, the pixel portion 4002 and the scanning line driver circuit 4004 are sealed together with liquid crystal 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 20A illustrates an example of mounting the signal line driver circuit 4003 by a COG method, and FIG. 20B illustrates an example of mounting the signal line driver circuit 4003 by a TAB method.

The pixel portion 4002 and the scanning line driver circuit 4004 provided over the first substrate 4001 each include a plurality of thin film transistors. FIG. 20C illustrates the thin film transistor 4010 included in the pixel portion 4002 and the thin film transistor 4011 included in the scanning line driver circuit 4004.

Each of the thin film transistors 4010 and 4011 corresponds to a thin film transistor including an IGZO semiconductor layer and an n-type metal oxide layer, and any of the thin film transistors described in Embodiments 1 to 4 can be employed as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and sandwich the liquid crystal 4008 with the insulating layers 4032 and 4033 interposed therebetween.

Note that the first substrate 4001 and the second substrate 4006 can be formed by using glass, metal (typically, stainless steel), ceramic, or plastic. As an example of plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Further, a spherical spacer may also be used.

Further, a variety of signals and a potential are supplied to the signal line driver circuit 4003 which is formed separately, the scanning line driver circuit 4004, or the pixel portion 4002 from an FPC 4018.

In this embodiment, a connection terminal 4015 is formed with the same conductive film as that for the pixel electrode layer 4030 included in the liquid crystal element 4013, and a wiring 4016 is formed with the same conductive film as that for gate electrode layers of the thin film transistors 4010 and 4011.

The connection terminal 4015 is electrically connected to a terminal included in the FPC 4018 through an anisotropic conductive film 4019.

Note that FIGS. 20A to 20C illustrate an example in which the signal line driver circuit 4003 is formed separately and mounted on the first substrate 4001; however, this embodiment is not limited to this structure. The scanning line driver circuit may be separately formed and then mounted, or only part of the signal line driver circuit or part of the scanning line driver circuit may be separately formed and then mounted.

Figure 21:
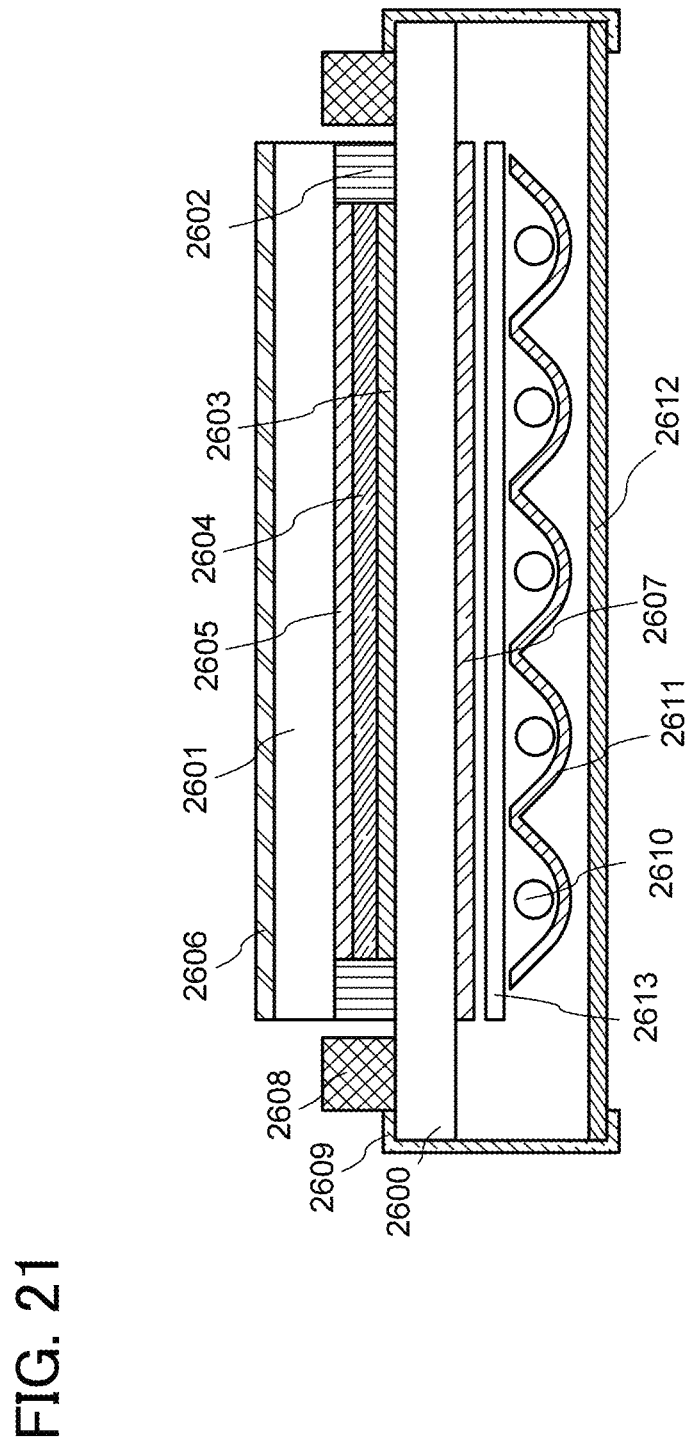
FIG. 21 illustrates a liquid crystal display module according to an embodiment of the present invention.

FIG. 21 illustrates an example in which a liquid crystal display module is formed as a semiconductor device by using a TFT substrate 2600 manufactured according to an embodiment of the present invention.

FIG. 21 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti-ferroelectric liquid crystal) mode, or the like can be used.

Through this process, a highly reliable display panel can be manufactured as a semiconductor device.

This embodiment can be combined with the structure described in other embodiments, as appropriate.

Embodiment 11

A semiconductor device according to an embodiment of the present invention can be applied to electronic paper. Electronic paper can be used for electronic appliances of a variety of fields as long as they can display data. For example, electronic paper can be applied to an electronic book device (e-book reader), a poster, an advertisement in a vehicle such as a train, displays of various cards such as a credit card, and the like. Examples of the electronic appliances are illustrated in FIGS. 28A and 28B and FIG. 29.

Figure 28A:
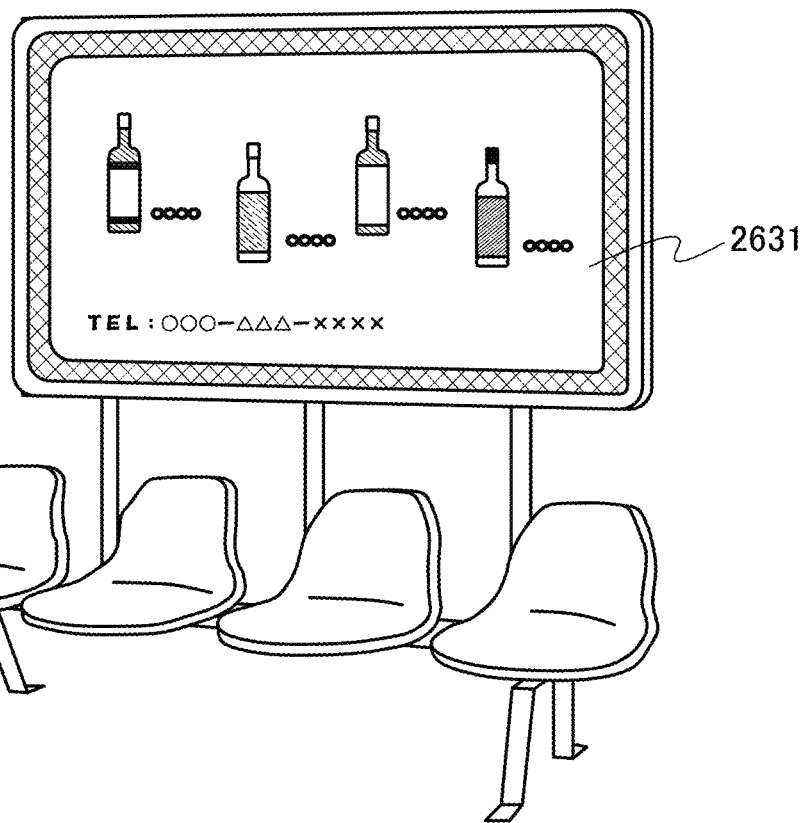
FIGS. 28A and 28B each illustrate an example of a use mode of electronic paper.

FIG. 28A illustrates a poster 2631 formed using electronic paper. In the case where an advertising medium is printed paper, the advertisement is replaced by manpower; however, by using electronic paper to which a semiconductor device according to an embodiment of the present invention is applied, the advertising display can be changed in a short time. Further, an image can be stably displayed without being distorted. Note that the poster may transmit and receive data wirelessly.

Figure 28B:
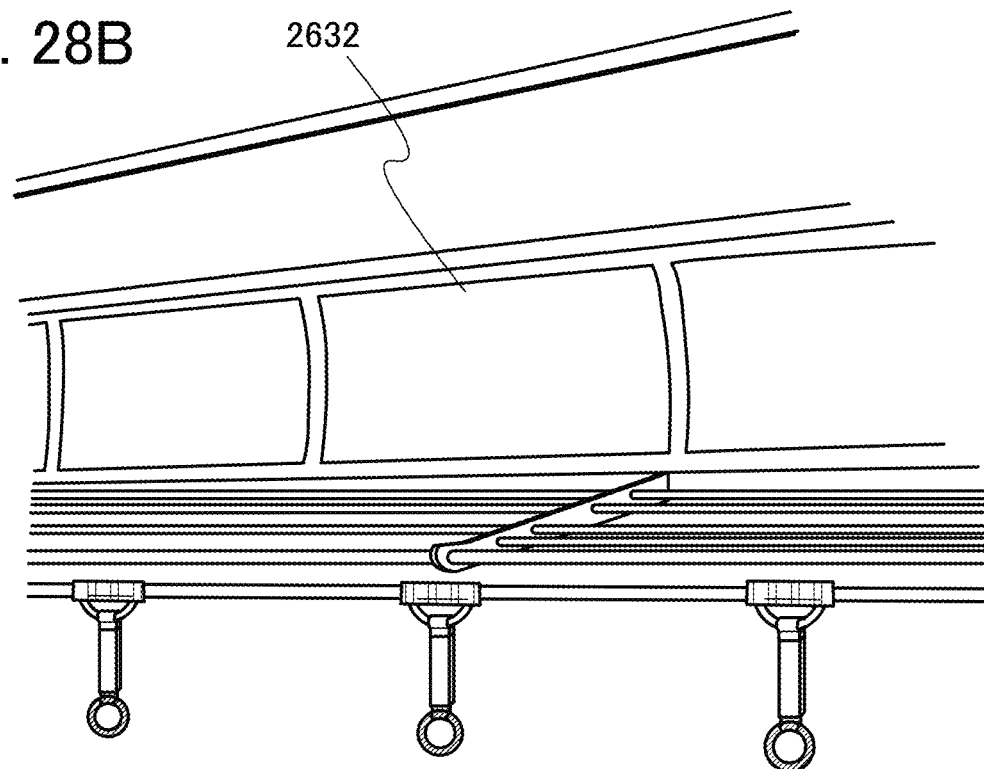

FIG. 28B illustrates an advertisement 2632 in a vehicle such as a train. In the case where an advertising medium is printed paper, the advertisement is replaced by manpower; however, by using electronic paper to which a semiconductor device according to an embodiment of the present invention is applied, the advertising display can be changed in a short time without a lot of manpower. Further, an image can be stably displayed without being distorted. Note that the advertisement in a vehicle may transmit and receive data wirelessly.

Figure 29:
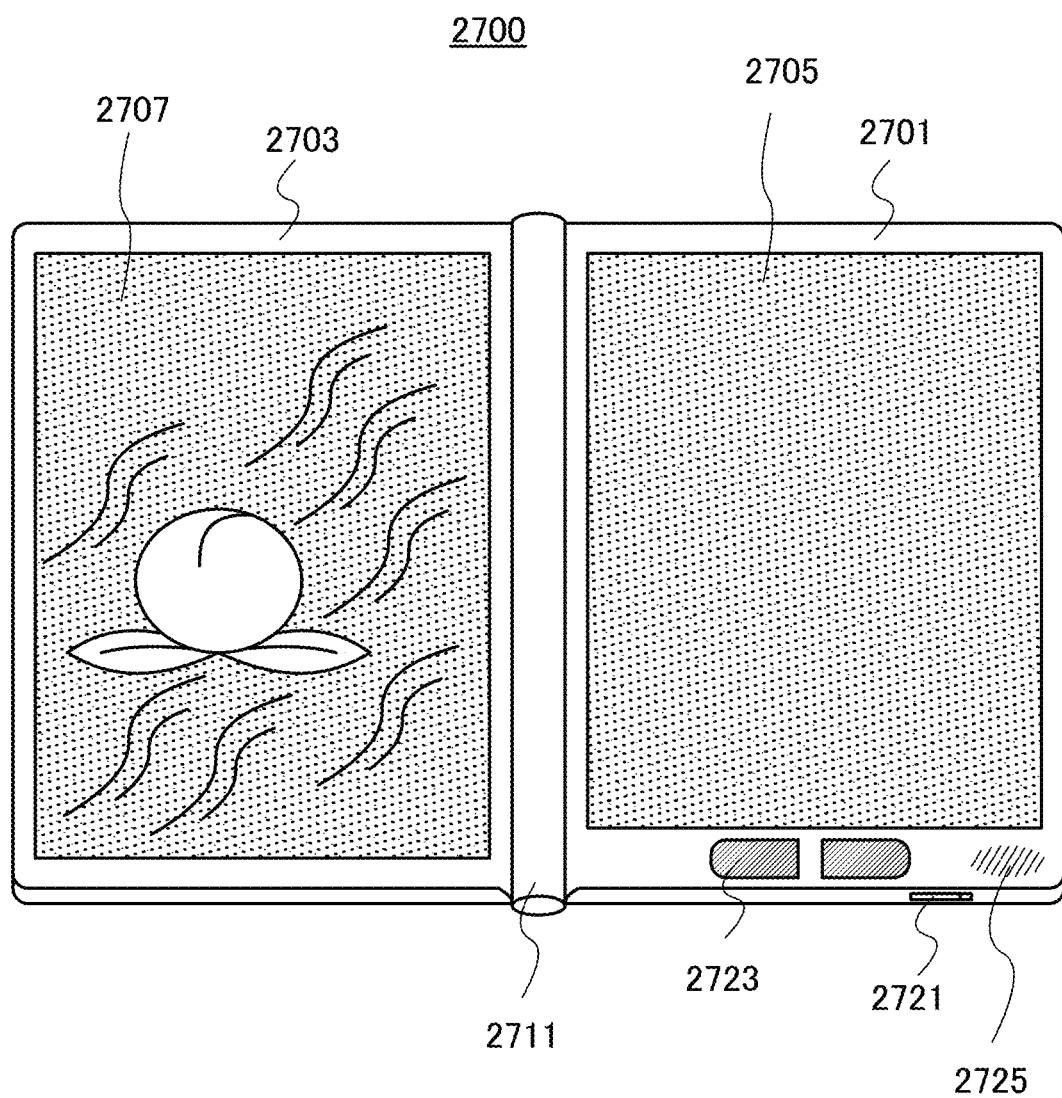
FIG. 29 is an external view of an example of an electronic book device.

FIG. 29 illustrates an example of an electronic book device 2700. For example, the electronic book device 2700 includes two housings, a housing 2701 and a housing 2703. The housing 2701 and the housing 2703 are combined with a hinge 2711 so that the electronic book device 2700 can be opened and closed with the hinge 2711 as an axis. With such a structure, the electronic book device 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 29) can display text and a display portion on the left side (the display portion 2707 in FIG. 29) can display graphics.

FIG. 29 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the surface of the housing, on which the display portion is provided. Further, an external connection terminal (an earphone terminal, a USB terminal, a terminal that can be connected to an AC adapter and various cables such as a USB cable, or the like), a recording medium insert portion, and the like may be provided on the back surface or the side surface of the housing. Further, the electronic book device 2700 may have a function of an electronic dictionary.

The electronic book device 2700 may transmit and receive data wirelessly. A structure can be employed in which desired book data or the like is purchased and downloaded from an electronic book server wirelessly.

Embodiment 12

A semiconductor device according to an embodiment of the present invention can be applied to a variety of electronic appliances (including an amusement machine). Examples of the electronic appliances are a television set (also referred to as a television or a television receiver), a monitor of a computer or the like, a camera such as a digital camera or a digital video camera, a digital photo frame, a mobile phone set (also referred to as a mobile phone or a mobile phone device), a portable game machine, a portable information terminal, an audio reproducing device, a large-sized game machine such as a pachinko machine, and the like.

Figure 30A:
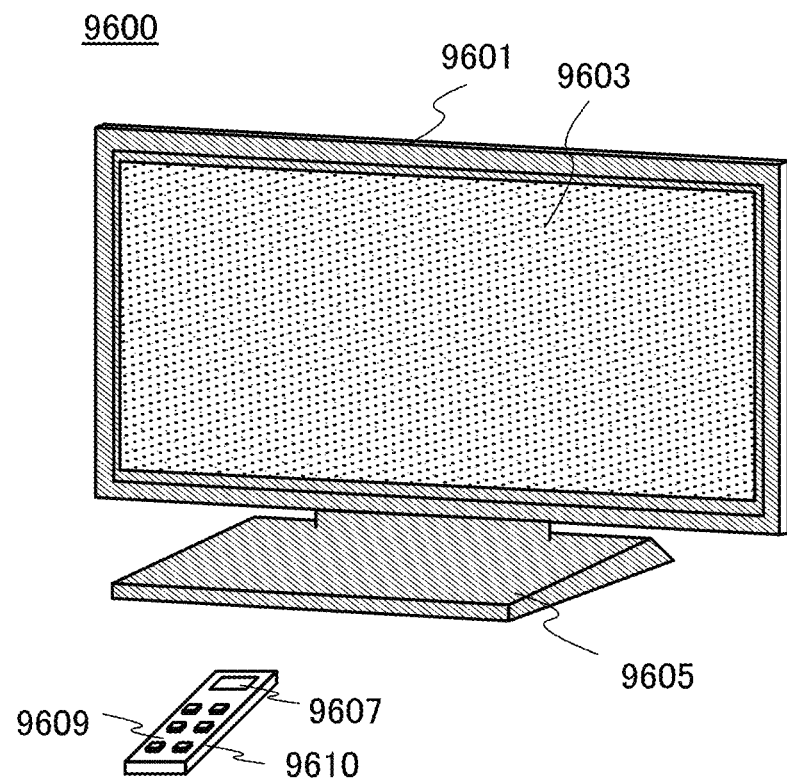
FIGS. 30A and 30B are external views of an example of a television device and an example of a digital photo frame, respectively.

FIG. 30A illustrates an example of a television set 9600. In the television set 9600, a display portion 9603 is incorporated in a housing 9601. The display portion 9603 can display an image. Further, the housing 9601 is supported by a stand 9605 here.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 30B:
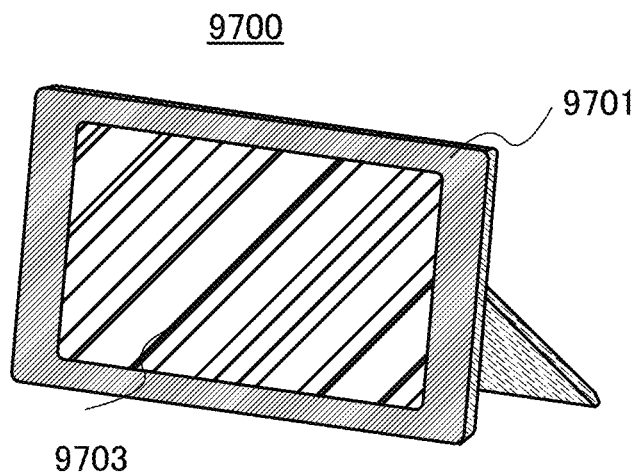

FIG. 30B illustrates an example of a digital photo frame 9700. For example, in the digital photo frame 9700, a display portion 9703 is incorporated in a housing 9701. The display portion 9703 can display various images. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insert portion, and the like. Although they may be provided on the surface on which the display portion is provided, it is preferable to provide them on the side surface or the back surface for the design of the digital photo frame 9700. For example, a memory storing data of an image shot by a digital camera is inserted in the recording medium insert portion of the digital photo frame, whereby the image data can be transferred and displayed on the display portion 9703.

The digital photo frame 9700 may transmit and receive data wirelessly. A structure may be employed in which desired image data is transferred wirelessly to be displayed.

Figure 31A:
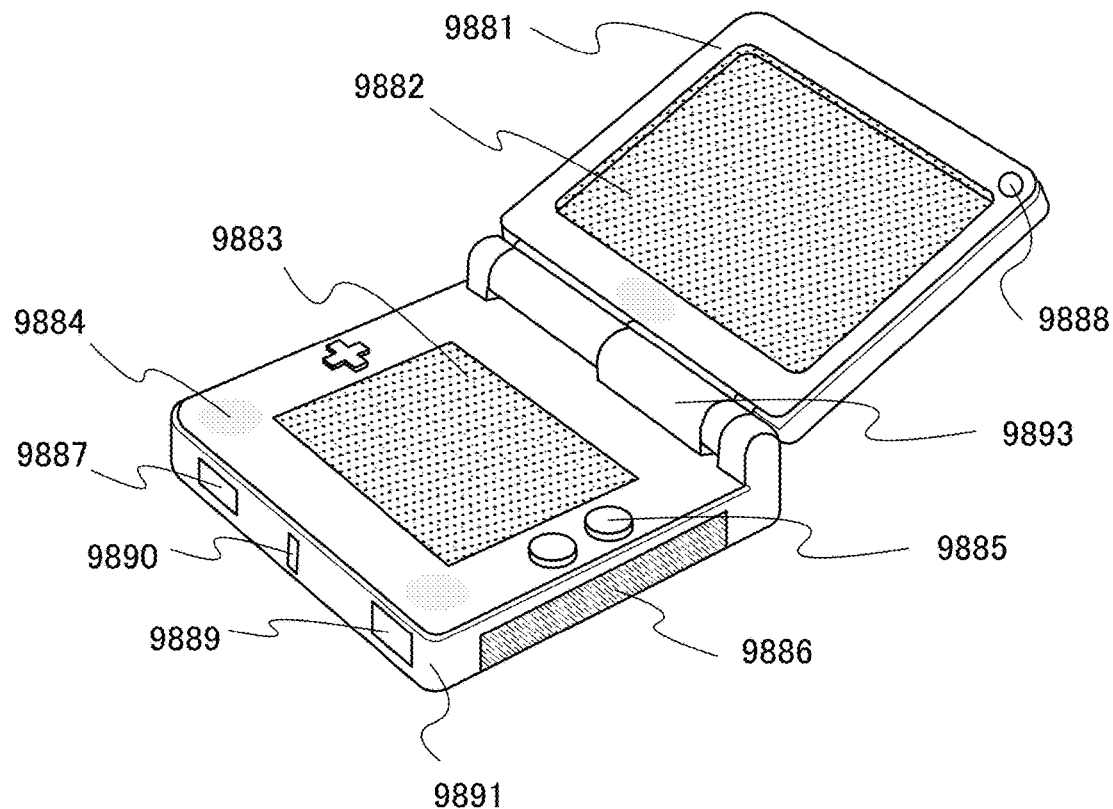
FIGS. 31A and 31B are external views of examples of an amusement machine.

FIG. 31A is a portable amusement machine including two housings, a housing 9881 and a housing 9891. The housings 9881 and 9891 are connected with a connection portion 9893 so as to be opened and closed. A display portion 9882 is incorporated in the housing 9881, and a display portion 9883 is incorporated in the housing 9891. In addition, the portable amusement machine illustrated in FIG. 31A includes a speaker portion 9884, a recording medium insert portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. Of course, the structure of the portable amusement machine is not limited to the above and a structure provided with at least a thin film transistor including an oxide semiconductor layer containing In, Ga, and Zn and an n-type metal oxide layer according to an embodiment of the present invention may be employed. The structure can include other accessory equipment as appropriate. The portable amusement machine illustrated in FIG.

31A has a function of reading a program or data stored in a recording medium to display it on the display portion, and a function of sharing information with another portable amusement machine by wireless communication. The portable amusement machine illustrated in FIG. 31A can have various functions without limitation to the above.

Figure 31B:
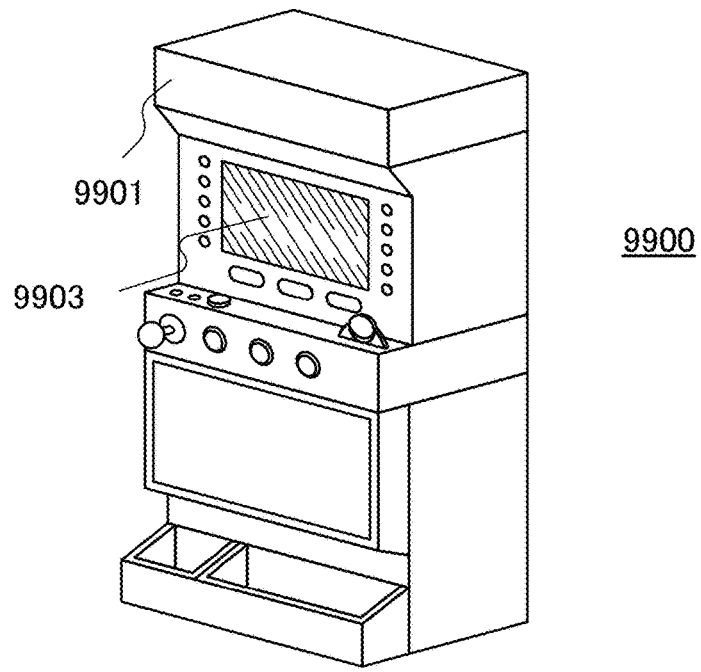

FIG. 31B illustrates an example of a slot machine 9900 which is an amusement machine with a big size. The slot machine 9900 includes a display portion 9903 incorporated in a housing 9901. In addition, the slot machine 9900 includes an operation means such as a start lever or a stop switch, a coin slot, a speaker, and the like. Of course, the structure of the slot machine 9900 is not limited to the above and a structure provided with at least a thin film transistor including an oxide semiconductor layer containing In, Ga, and Zn and an n-type metal oxide layer according to an embodiment of the present invention may be employed. The structure can include other accessory equipment as appropriate.

Figure 32:
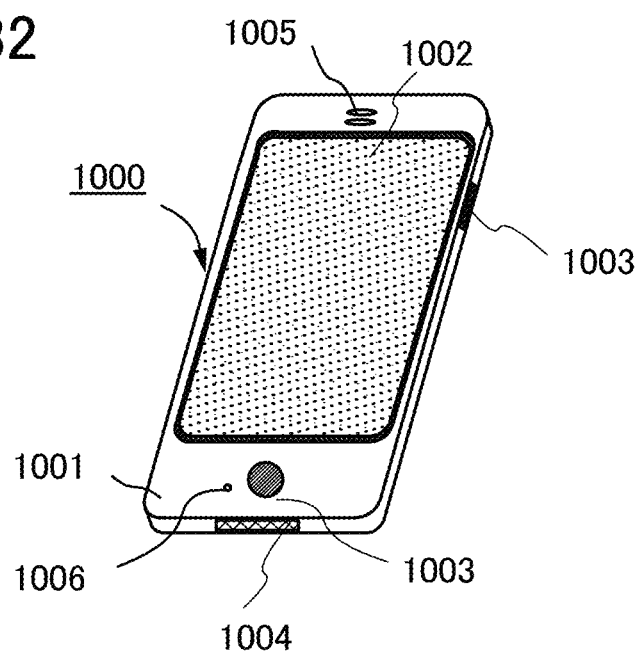
FIG. 32 is an external view of an example of a mobile phone set.

FIG. 32 illustrates an example of a mobile phone set 1000. The mobile phone set 1000 is provided with a display portion 1002 incorporated in a housing 1001, operation buttons 1003, an external connection port 1004, a speaker 1005, a microphone 1006, and the like.

When the display portion 1002 of the mobile phone set 1000 illustrated in FIG. 32 is touched with a finger or the like, data can be input into the mobile phone set 1000. Further, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone set 1000, display in the screen of the display portion 1002 can be automatically switched by determining the direction of the mobile phone set 1000 (whether the mobile phone 1000 is placed horizontally or vertically for a landscape mode or a portrait mode).

The screen modes are switched by touching the display portion 1002 or operating the operation buttons 1003 of the housing 1001. Alternatively, the screen modes may be switched depending on the kind of the image displayed on the display portion 1002. For example, when a signal of an image displayed on the display portion is the one of moving image data, the screen mode is switched to the display mode. When the signal is the one of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of the palm print, the fingerprint, or the like is taken by touching the display portion 1002 with the palm or the finger, whereby personal authentication can be performed. Further, by providing a backlight or sensing light source emitting a near-infrared light for the display portion, an image of a finger vein, a palm vein, or the like can be taken.

This application is based on Japanese Patent Application serial no. 2008-197145 filed with Japan Patent Office on Jul. 31, 2008, the entire contents of which are hereby incorporated by reference.

What is claimed is:

1. A semiconductor device comprising:
a thin film transistor comprising:
a metal gate electrode over a glass substrate;
a gate insulating layer over the metal gate electrode;
an oxide semiconductor layer over the gate insulating layer;
a first metal layer over the oxide semiconductor layer;
a second metal layer over and in contact with the first metal layer;
a third metal layer over the oxide semiconductor layer; and
a fourth metal layer over and in contact with the third metal layer;
an insulating layer over the oxide semiconductor layer, the second metal layer, and the fourth metal layer, the insulating layer being in contact with a top surface of the oxide semiconductor layer; and
a pixel electrode over the insulating layer,
wherein a first gap between the first metal layer and the third metal layer is smaller than a second gap between the second metal layer and the fourth metal layer,
wherein the first gap is a distance between an upper end portion of the first metal layer and an upper end portion of the third metal layer, and the second gap is a distance between a lower end portion of the second metal layer and a lower end portion of the fourth metal layer,
wherein each of the first metal layer, the second metal layer, the third metal layer and the fourth metal layer overlaps with the oxide semiconductor layer,
wherein each of the first metal layer and the second metal layer extends beyond an edge of the oxide semiconductor layer, and
wherein the oxide semiconductor layer comprises indium, gallium, and zinc.

2. The semiconductor device according to claim 1, wherein the first metal layer is in contact with a top surface of the gate insulating layer.

3. A semiconductor device comprising:
a thin film transistor comprising:
a metal gate electrode over a glass substrate;
a gate insulating layer over the metal gate electrode;
an oxide semiconductor layer over the gate insulating layer;
a first metal layer over the oxide semiconductor layer;
a second metal layer over and in contact with the first metal layer;
a third metal layer over the oxide semiconductor layer; and
a fourth metal layer over and in contact with the third metal layer;
an insulating layer over the oxide semiconductor layer, the second metal layer, and the fourth metal layer, the insulating layer being in contact with a top surface of the oxide semiconductor layer; and
a pixel electrode over the insulating layer, wherein a first gap between the first metal layer and the third metal layer is smaller than a second gap between the second metal layer and the fourth metal layer, wherein the first gap is a distance between an upper end portion of the first metal layer and an upper end portion of the third metal layer, and the second gap is a distance between a lower end portion of the second metal layer and a lower end portion of the fourth metal layer, wherein each of the first metal layer, the second metal layer, the third metal layer and the fourth metal layer overlaps with the oxide semiconductor layer, wherein each of the first metal layer and the second metal layer extends beyond an edge of the oxide semiconductor layer, wherein the pixel electrode is electrically connected to the second metal layer through an opening of the insulating layer, wherein the opening of the insulating layer comprises a region not overlapping with the oxide semiconductor layer, and wherein the second metal layer comprises copper.

4. The semiconductor device according to claim 3, wherein the first metal layer is in contact with a top surface of the gate insulating layer.

5. The semiconductor device according to claim 3, wherein the oxide semiconductor layer comprises indium, gallium, and zinc.

6. The semiconductor device according to claim 5, wherein the first metal layer is in contact with a top surface of the gate insulating layer.

* * * * *